(12) United States Patent
Zhang et al.

(10) Patent No.: US 9,805,805 B1
(45) Date of Patent: Oct. 31, 2017

(54) THREE-DIMENSIONAL MEMORY DEVICE WITH CHARGE CARRIER INJECTION WELLS FOR VERTICAL CHANNELS AND METHOD OF MAKING AND USING THEREOF

(71) Applicant: SANDISK TECHNOLOGIES LLC, Plano, TX (US)

(72) Inventors: Yanli Zhang, San Jose, CA (US); Johann Alsmeier, San Jose, CA (US); James Kai, Santa Clara, CA (US)

(73) Assignee: SANDISK TECHNOLOGIES LLC, Plano, TX (US)

( * ) Notice: Subject to any disclaimer, the term of this patent is extended or adjusted under 35 U.S.C. 154(b) by 0 days.

(21) Appl. No.: 15/244,428

(22) Filed: Aug. 23, 2016

(51) Int. Cl.
   *H01L 29/778* (2006.01)
   *H01L 27/115* (2017.01)
   (Continued)

(52) U.S. Cl.
   CPC .......... *G11C 16/14* (2013.01); *G11C 16/0466* (2013.01); *G11C 16/0483* (2013.01);
   (Continued)

(58) Field of Classification Search
   CPC .......... H01L 27/11582; H01L 27/1157; H01L 27/11556; H01L 29/7926; H01L 27/11575;
   (Continued)

(56) References Cited

U.S. PATENT DOCUMENTS

| 5,172,338 | A | 12/1992 | Mehrotra et al. |
| 5,915,167 | A | 6/1999 | Leedy |

(Continued)

FOREIGN PATENT DOCUMENTS

| JP | 2008182227 A | 8/2008 |
| JP | 2015149413 A | 8/2015 |

(Continued)

OTHER PUBLICATIONS

Jang et al., "Vertical Cell Array Using TCAT (Terabit Cell Array Transistor) Technology for Ultra High Density NAND Flash Memory," 2009 Symposium on VLSI Technology Digest of Technical Papers, pp. 192-193.

(Continued)

*Primary Examiner* — Bradley K Smith
*Assistant Examiner* — David Goodwin
(74) *Attorney, Agent, or Firm* — The Marbury Law Group PLLC

(57) ABSTRACT

A buried source semiconductor layer and p-doped semiconductor material portions are formed over a first portion of a substrate. The buried source semiconductor layer is an n-doped semiconductor material, and the p-doped semiconductor material portions are embedded within the buried source semiconductor layer. An alternating stack of insulating layers and spacer material layers is formed over the substrate. Memory stack structures are formed through the alternating stack. The spacer material layers are formed as, or are replaced with, electrically conductive layers. The buried source semiconductor layer may be formed prior to, or after, formation of the alternating stack. The buried source semiconductor layer underlies the alternating stack and overlies the first portion of the substrate, and contacts at least one surface of the vertical semiconductor channels. The p-doped semiconductor material portions contact at least one surface of a respective subset of the vertical semiconductor channels.

19 Claims, 32 Drawing Sheets

(51) Int. Cl.
| | |
|---|---|
| *H01L 29/51* | (2006.01) |
| *G11C 16/14* | (2006.01) |
| *H01L 27/1157* | (2017.01) |
| *H01L 27/11582* | (2017.01) |
| *H01L 23/522* | (2006.01) |
| *H01L 23/528* | (2006.01) |
| *H01L 27/11573* | (2017.01) |
| *H01L 21/768* | (2006.01) |
| *H01L 21/265* | (2006.01) |
| *G11C 16/04* | (2006.01) |
| *G11C 16/10* | (2006.01) |

(52) U.S. Cl.
CPC ........ *G11C 16/10* (2013.01); *H01L 21/26513* (2013.01); *H01L 21/76816* (2013.01); *H01L 21/76877* (2013.01); *H01L 23/528* (2013.01); *H01L 23/5226* (2013.01); *H01L 27/1157* (2013.01); *H01L 27/11573* (2013.01); *H01L 27/11582* (2013.01)

(58) Field of Classification Search
CPC ......... H01L 27/11578; H01L 27/11524; H01L 21/28282; H01L 29/66833; H01L 29/7889; H01L 27/11551
See application file for complete search history.

(56) References Cited

U.S. PATENT DOCUMENTS

| | | | |
|---|---|---|---|
| 7,005,350 B2 | 2/2006 | Walker et al. | |
| 7,023,739 B2 | 4/2006 | Chen et al. | |
| 7,177,191 B2 | 2/2007 | Fasoli et al. | |
| 7,221,588 B2 | 5/2007 | Fasoli et al. | |
| 7,233,522 B2 | 6/2007 | Chen et al. | |
| 7,514,321 B2 | 4/2009 | Mokhlesi et al. | |
| 7,575,973 B2 | 8/2009 | Mokhlesi et al. | |
| 7,696,559 B2 | 4/2010 | Arai et al. | |
| 7,745,265 B2 | 6/2010 | Mokhlesi et al. | |
| 7,808,038 B2 | 10/2010 | Mokhlesi et al. | |
| 7,848,145 B2 | 12/2010 | Mokhlesi et al. | |
| 7,851,851 B2 | 12/2010 | Mokhlesi et al. | |
| 8,008,710 B2 | 8/2011 | Fukuzumi | |
| 8,053,829 B2 | 11/2011 | Kang et al. | |
| 8,187,936 B2 | 5/2012 | Alsmeier et al. | |
| 8,283,228 B2 | 10/2012 | Alsmeier | |
| 8,394,716 B2* | 3/2013 | Hwang | H01L 27/11551 257/315 |
| 8,445,318 B2 | 5/2013 | Shin | |
| 8,614,126 B1* | 12/2013 | Lee | H01L 21/764 257/E29.309 |
| 8,724,369 B2 | 5/2014 | Zhang et al. | |
| 9,356,043 B1 | 5/2016 | Sakakibara et al. | |
| 9,397,046 B1* | 7/2016 | Sharangpani | H01L 27/1157 |
| 9,401,309 B2* | 7/2016 | Izumi | H01L 21/76816 |
| 9,419,058 B1 | 8/2016 | Takaki et al. | |
| 9,425,299 B1* | 8/2016 | Rabkin | H01L 29/7783 |
| 9,627,399 B2* | 4/2017 | Kanakamedala | H01L 27/11578 |
| 2007/0210338 A1 | 9/2007 | Orlowski | |
| 2007/0252201 A1 | 11/2007 | Kito et al. | |
| 2008/0210924 A1 | 9/2008 | Shin | |
| 2009/0001344 A1 | 1/2009 | Schricker et al. | |
| 2009/0230449 A1 | 9/2009 | Sakaguchi et al. | |
| 2009/0242967 A1 | 10/2009 | Katsumata et al. | |
| 2010/0019310 A1* | 1/2010 | Sakamoto | H01L 27/11578 257/324 |
| 2010/0044778 A1 | 2/2010 | Seol | |
| 2010/0112769 A1 | 5/2010 | Son et al. | |
| 2010/0120214 A1 | 5/2010 | Park et al. | |
| 2010/0155810 A1 | 6/2010 | Kim et al. | |
| 2010/0155818 A1 | 6/2010 | Cho | |
| 2010/0181610 A1 | 7/2010 | Kim et al. | |
| 2010/0207195 A1 | 8/2010 | Fukuzumi et al. | |
| 2010/0314678 A1* | 12/2010 | Lim | H01L 27/11578 257/324 |
| 2010/0320528 A1 | 12/2010 | Jeong et al. | |
| 2011/0076819 A1 | 3/2011 | Kim et al. | |
| 2011/0090737 A1 | 4/2011 | Yoo et al. | |
| 2011/0133606 A1 | 6/2011 | Yoshida et al. | |
| 2011/0212568 A1 | 9/2011 | Shin | |
| 2011/0266606 A1 | 11/2011 | Park et al. | |
| 2012/0001247 A1 | 1/2012 | Alsmeier | |
| 2012/0001249 A1 | 1/2012 | Alsmeier | |
| 2012/0001250 A1 | 1/2012 | Alsmeier | |
| 2012/0012920 A1 | 1/2012 | Shin et al. | |
| 2012/0104484 A1* | 5/2012 | Lee | H01L 27/11582 257/324 |
| 2012/0119287 A1 | 5/2012 | Park et al. | |
| 2012/0146127 A1* | 6/2012 | Lee | H01L 21/28282 257/324 |
| 2012/0147648 A1 | 6/2012 | Scheuerlein | |
| 2013/0043455 A1 | 2/2013 | Bateman | |
| 2013/0248974 A1 | 9/2013 | Alsmeier et al. | |
| 2013/0264631 A1 | 10/2013 | Alsmeier | |
| 2015/0149413 A1 | 5/2015 | Lee et al. | |
| 2015/0179659 A1 | 6/2015 | Takaki | |
| 2015/0179660 A1 | 6/2015 | Yada et al. | |
| 2015/0194380 A1 | 7/2015 | Takaki et al. | |
| 2015/0194435 A1* | 7/2015 | Lee | H01L 27/11575 257/329 |
| 2015/0221667 A1 | 8/2015 | Fukuzumi et al. | |
| 2015/0263074 A1 | 9/2015 | Takaki | |
| 2015/0279850 A1 | 10/2015 | Takaki | |
| 2015/0348984 A1 | 12/2015 | Yada et al. | |
| 2015/0380418 A1 | 12/2015 | Zhang et al. | |
| 2016/0043143 A1 | 2/2016 | Sakotsubo et al. | |
| 2016/0056210 A1 | 2/2016 | Takaki et al. | |
| 2016/0093637 A1* | 3/2016 | Lee | H01L 27/11582 438/269 |
| 2016/0126292 A1 | 5/2016 | Yanagida et al. | |
| 2016/0163729 A1 | 6/2016 | Zhang et al. | |
| 2016/0240665 A1 | 8/2016 | Chen et al. | |
| 2017/0025421 A1* | 1/2017 | Sakakibara | H01L 21/28273 |

FOREIGN PATENT DOCUMENTS

| | | |
|---|---|---|
| WO | WO0215277 A2 | 2/2002 |
| WO | WO2007004843 A1 | 1/2007 |

OTHER PUBLICATIONS

Katsumata et al., "Pipe-Shaped BiCS Flash Memory with 16 Stacked Layers and Multi-Level-Cell Operation for Ultra High Density Storage Devices," 2009 Symposium on VLSI Technology Digest of Technical Papers, pp. 136-137.

Maeda et al., "Multi-Stacked 1G Cell/Layer Pipe-Shaped BiCS Flash Memory," 2009 Symposium on VLSI Technology Digest of Technical Papers, pp. 22-23.

Endoh et al., "Novel Ultra High Density Memory with a Stacked-Surrounding Gate Transistor (S-SGT) Structured Cell," IEDM Proc. (2001) 33-36.

Tanaka et al., "Bit-Cost Scalable Technology for Low-Cost and Ultrahigh-Density Flash Memory," Toshiba Review, vol. 63, No. 2, 2008, pp. 28-31.

Kimura, M. "3D Cells Make Terabit NAND Flash Possible," Nikkei Electronics Asia, Sep. 17, 2009, 6pgs.

Kozicki, et al., "Multi-bit Memory Using Programmable Metallization Cell Technology," Proceedings of the International Conference on Electronic Devices and Memory, Grenoble, France, Jun. 12-17, 2005, pp. 48-53.

Schrogmeier, et al., "Time Discrete Voltage Sensing and Iterative Programming Control for a 4F2 Multilevel CBRAM," 2007 Symposium of VLSI Circuits Digest of Technical Papers, 2007, pp. 186-187.

Woo et al., "Bidirectional Selection Device Characteristics of Ultra-Thin (<3nm) TiO2 Layer for 3D Vertically Stackable ReRAM Application," Silicon Nanoelectronics Workshop IEEE, Jun. 2012, pp. 1-2.

U.S. Appl. No. 14/635,419, filed Mar. 2, 2015, SanDisk 3D LLC.
U.S. Appl. No. 14/851,296, filed Sep. 11, 2015, SanDisk 3D LLC.

(56) References Cited

OTHER PUBLICATIONS

U.S. Appl. No. 14/867,351, filed Sep. 28, 2015, SanDisk Technologies Inc.
U.S. Appl. No. 14/924,144, filed Oct. 27, 2015, SanDisk Technologies Inc.
U.S. Appl. No. 15/017,961, filed Feb. 8, 2016, SanDisk Technologies Inc.
U.S. Appl. No. 15/225,492, filed Aug. 1, 2016, SanDisk Technologies Inc.
International Search Report and Written Opinion of the International Searching Authority for International Patent Application No. PCT/US2017/035024, dated Aug. 14, 2017, 14 pages.

* cited by examiner

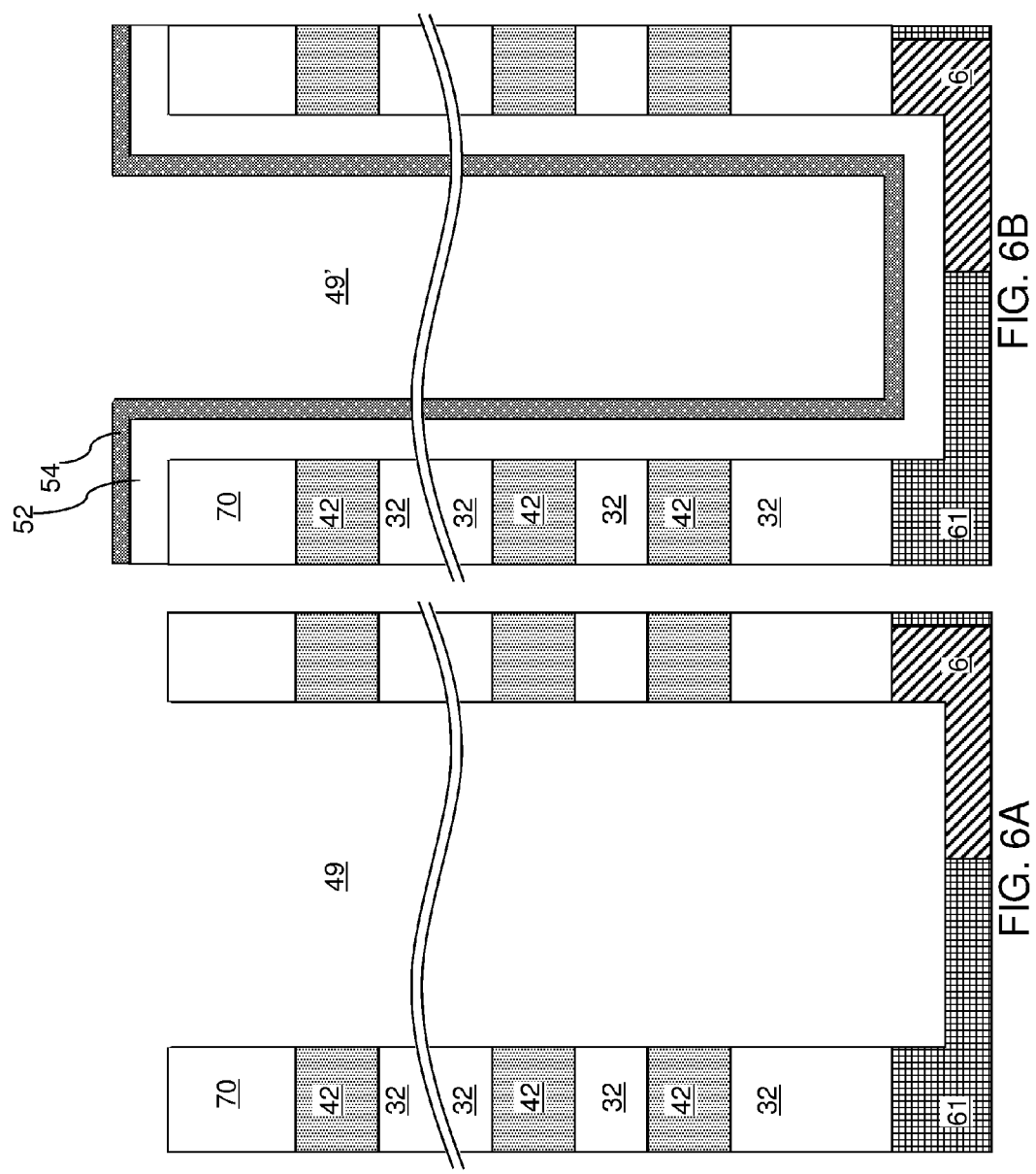

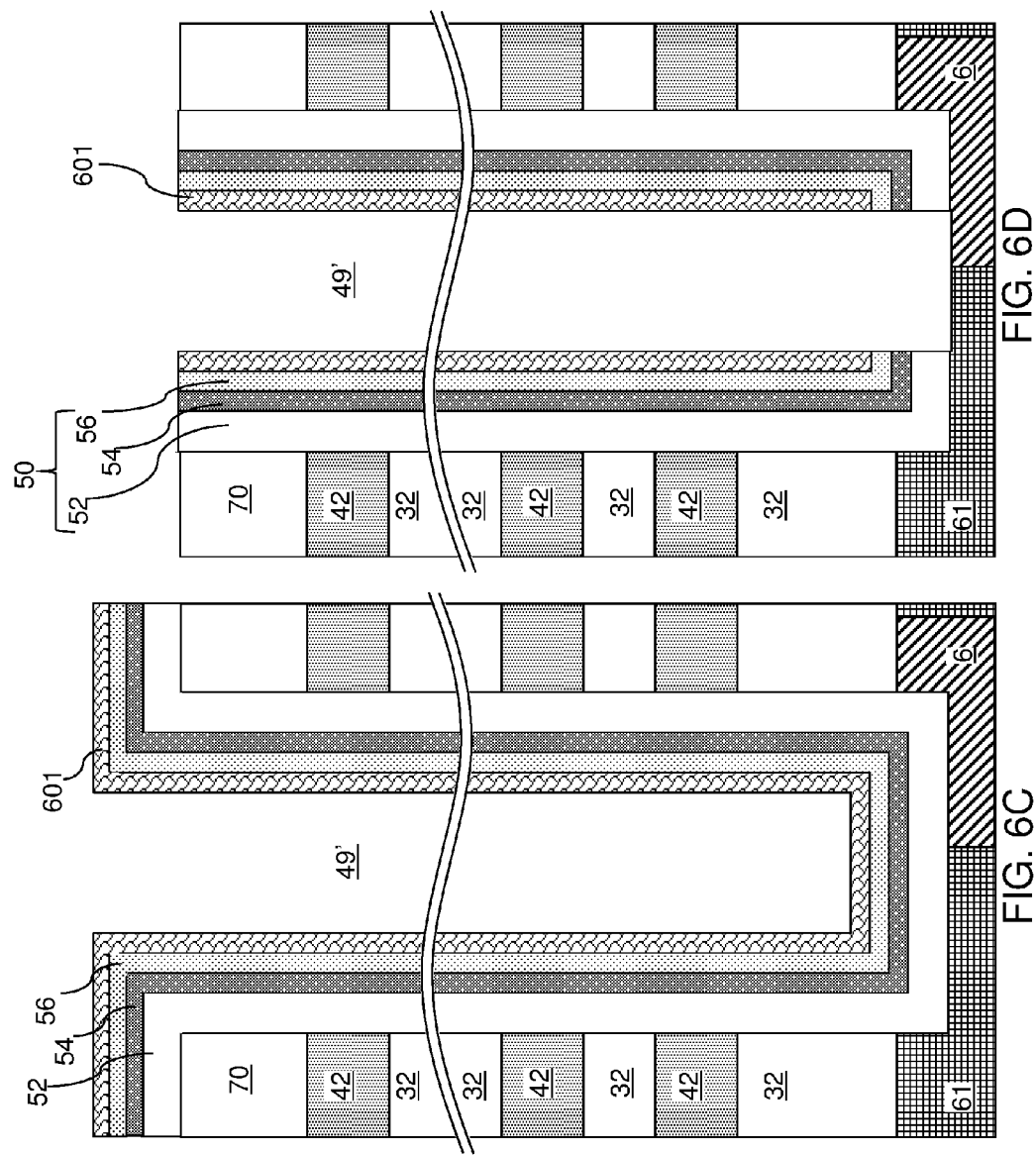

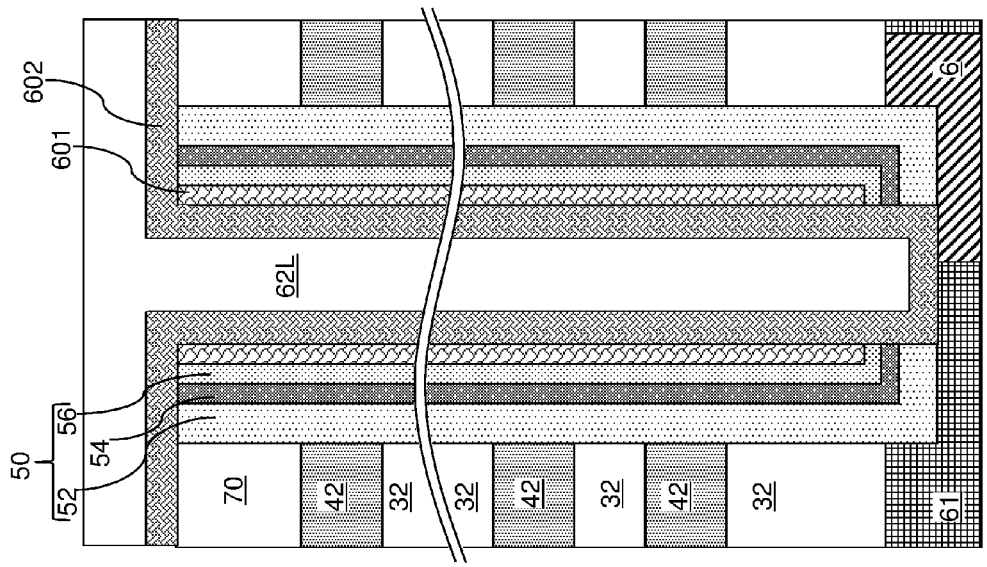
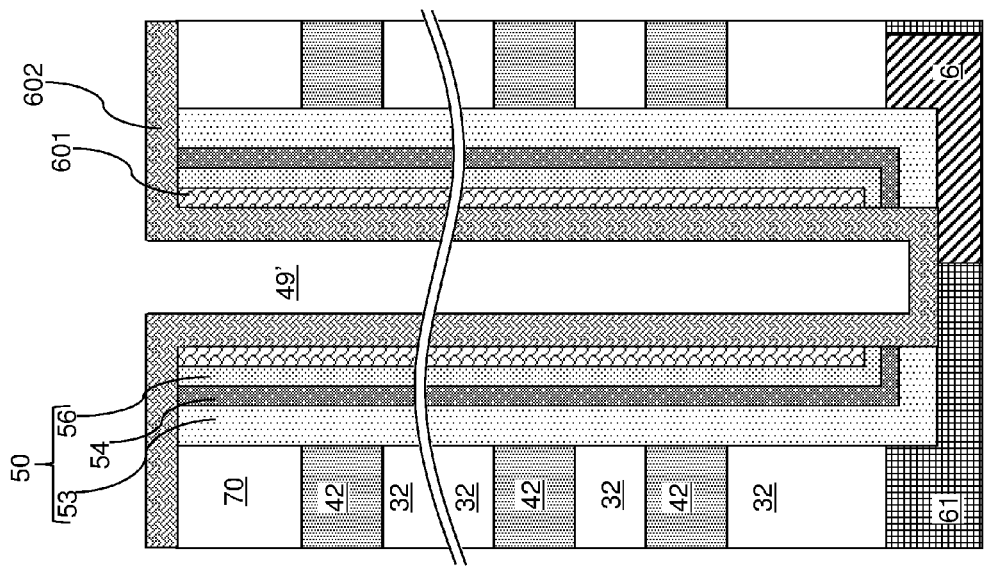

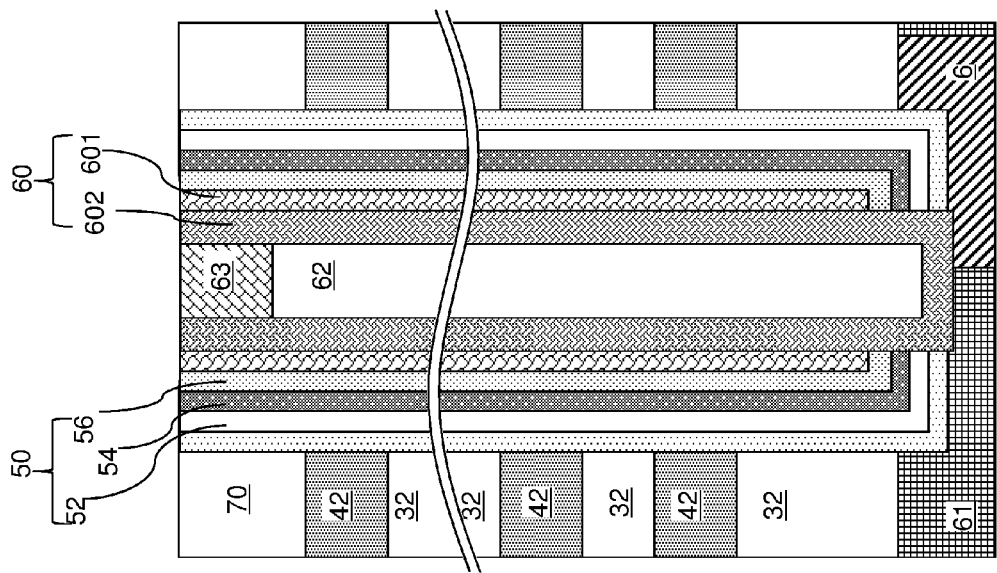
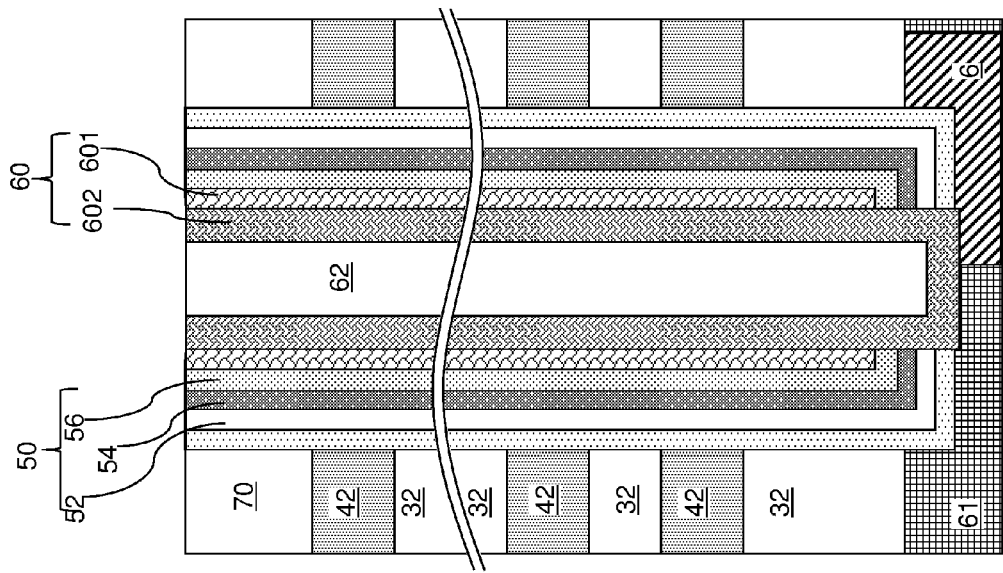

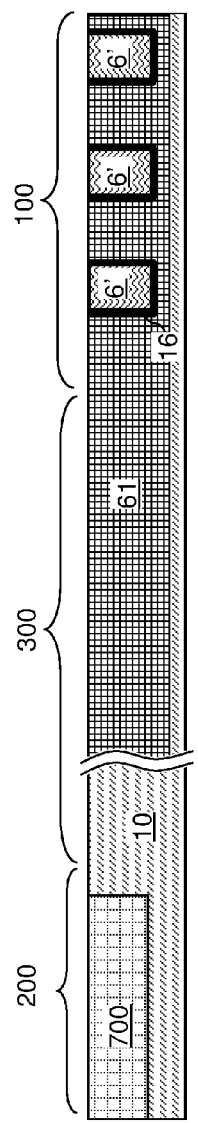
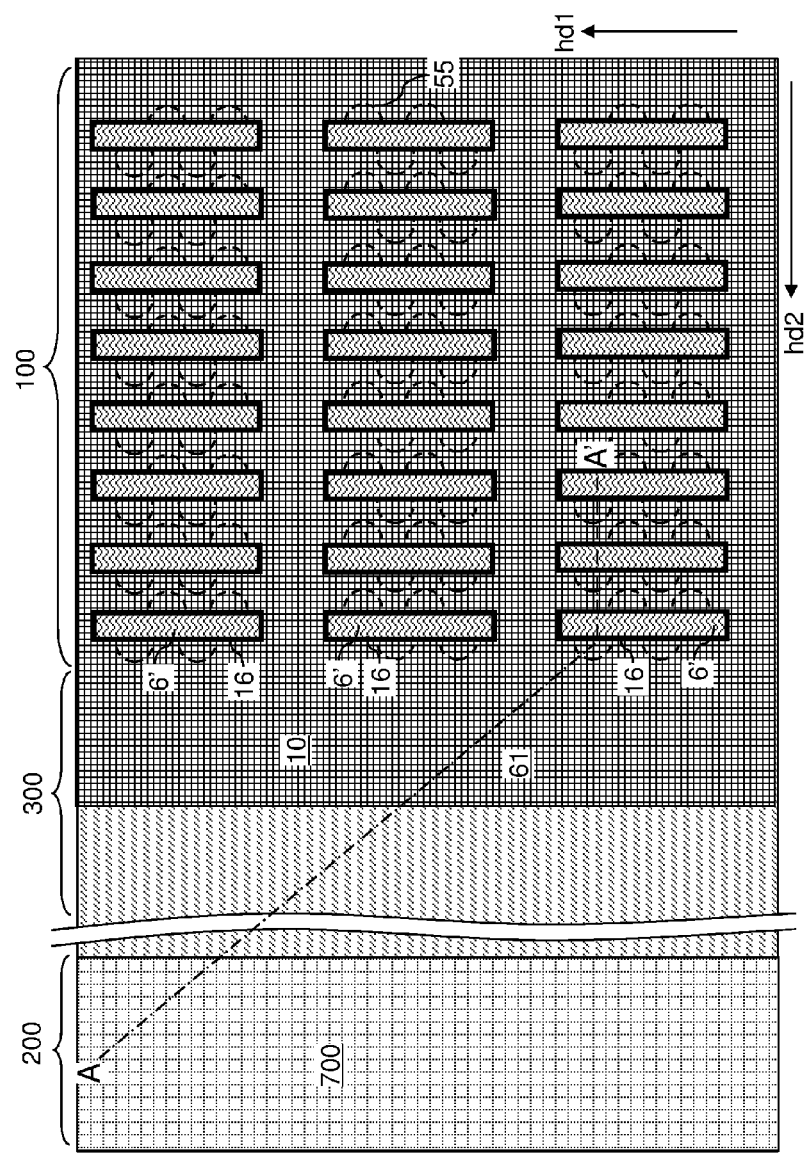

THREE-DIMENSIONAL MEMORY DEVICE WITH CHARGE CARRIER INJECTION WELLS FOR VERTICAL CHANNELS AND METHOD OF MAKING AND USING THEREOF

FIELD

The present disclosure relates generally to the field of semiconductor devices and specifically to three-dimensional memory structures, such as vertical NAND strings and other three-dimensional devices, and methods of making thereof.

BACKGROUND

Three-dimensional vertical NAND strings having one bit per cell are disclosed in an article by T. Endoh et al., titled "Novel Ultra High Density Memory With A Stacked-Surrounding Gate Transistor (S-SGT) Structured Cell", IEDM Proc. (2001) 33-36.

SUMMARY

According to an aspect of the present disclosure, a three-dimensional memory device is provided, which comprises: an alternating stack of insulating layers and electrically conductive layers and located over a substrate; memory stack structures extending through the alternating stack, each of the memory stack structures comprising a memory film and a vertical semiconductor channel; a buried source semiconductor layer comprising an n-doped semiconductor material, located between the alternating stack and a first portion of the substrate, and contacting at least one surface of the vertical semiconductor channels; and p-doped semiconductor material portions embedded within the buried source semiconductor layer and contacting at least one surface of a respective subset of the vertical semiconductor channels, wherein the p-doped semiconductor material portions are laterally spaced from one another by the buried source semiconductor layer.

According to another aspect of the present disclosure, a method of forming a three-dimensional memory device is provided. A combination of a buried source semiconductor layer and p-doped semiconductor material portions is formed over a first portion of a substrate. The buried source semiconductor layer comprises an n-doped semiconductor material, and the p-doped semiconductor material portions are embedded within the buried source semiconductor layer, and wherein the p-doped semiconductor material portions are laterally spaced from one another by the buried source semiconductor layer. An alternating stack of insulating layers and spacer material layers is formed over the substrate. Memory stack structures are formed through the alternating stack, each of the memory stack structures comprising a memory film and a vertical semiconductor channel. The spacer material layers are formed as, or are replaced with, electrically conductive layers. The buried source semiconductor layer underlies the alternating stack and overlies the first portion of the substrate, and contacts at least one surface of the vertical semiconductor channels. The p-doped semiconductor material portions contact at least one surface of a respective subset of the vertical semiconductor channels.

BRIEF DESCRIPTION OF THE DRAWINGS

FIGS. 6A-6H are sequential vertical cross-sectional views of a memory opening within the first exemplary structure during various processing steps employed to form a memory stack structure according to the first embodiment of the present disclosure.

FIG. 16A is a vertical cross-sectional view of the second exemplary structure after formation of dielectric liners and p-doped semiconductor material portions according to the second embodiment of the present disclosure.

FIG. 16B is a top-down view of the second exemplary structure of FIG. 16A. The plane A-A' is the plane of the cross-sectional view of FIG. 16A.

DETAILED DESCRIPTION

Figure 1:
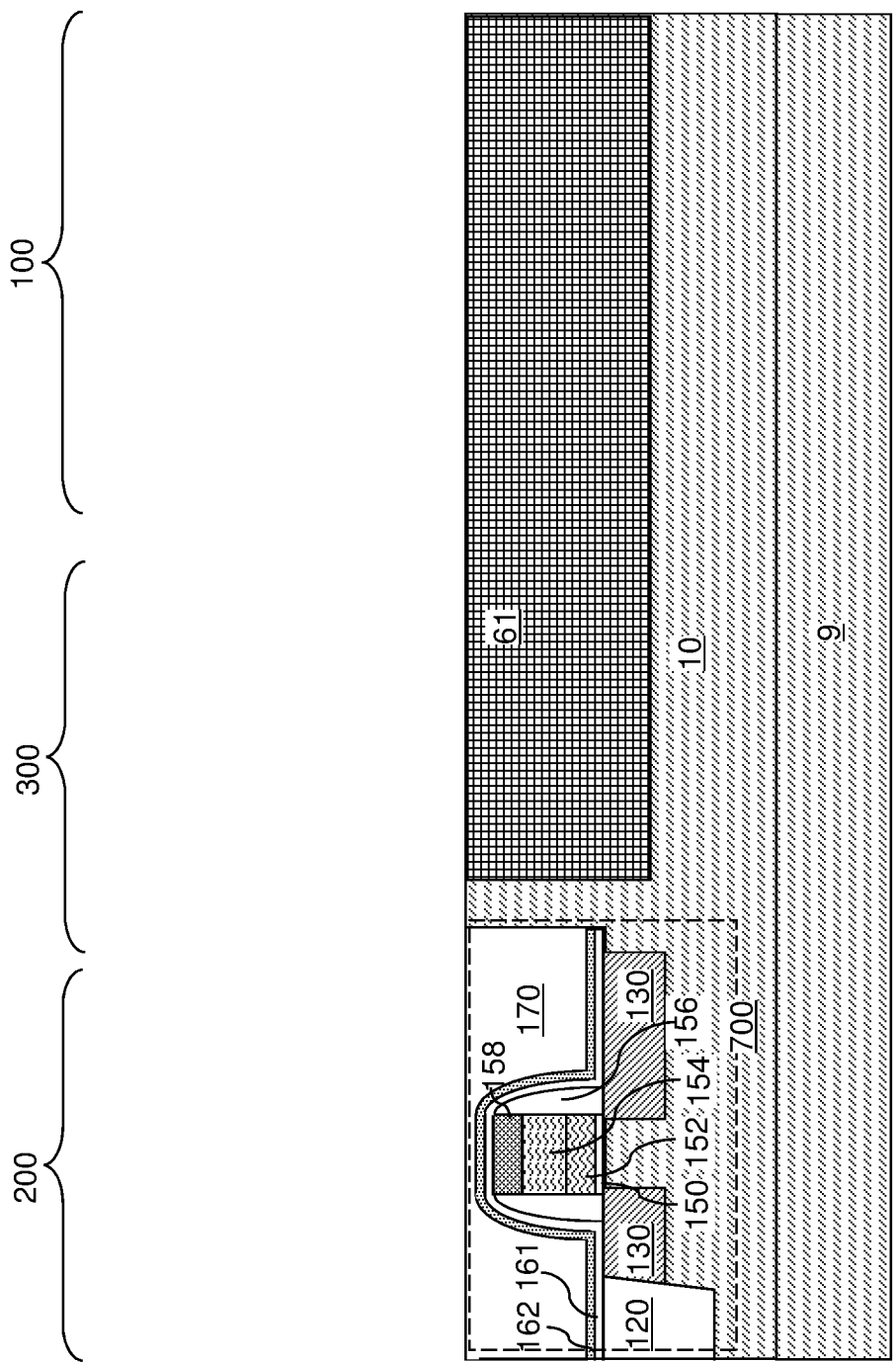
FIG. 1 is a vertical cross-sectional view of a first exemplary structure after formation of at least one peripheral device according to a first embodiment of the present disclosure.

As discussed above, the present disclosure is directed to three-dimensional memory structures, such as vertical NAND strings and other three-dimensional devices, and methods of making thereof, the various aspects of which are described below. The embodiments of the disclosure can be employed to form various structures including a multilevel memory structure, non-limiting examples of which include semiconductor devices such as three-dimensional monolithic memory array devices comprising a plurality of NAND memory strings. The drawings are not drawn to scale. Multiple instances of an element may be duplicated where a single instance of the element is illustrated, unless absence of duplication of elements is expressly described or clearly indicated otherwise. Ordinals such as "first," "second," and "third" are employed merely to identify similar elements, and different ordinals may be employed across the specification and the claims of the instant disclosure. As used herein, a first element located "on" a second element can be located on the exterior side of a surface of the second element or on the interior side of the second element. As used herein, a first element is located "directly on" a second element if there exist a physical contact between a surface of the first element and a surface of the second element.

As used herein, a "layer" refers to a material portion including a region having a thickness. A layer may extend over the entirety of an underlying or overlying structure, or may have an extent less than the extent of an underlying or overlying structure. Further, a layer may be a region of a homogeneous or inhomogeneous continuous structure that has a thickness less than the thickness of the continuous structure. For example, a layer may be located between any pair of horizontal planes between, or at, a top surface and a bottom surface of the continuous structure. A layer may extend horizontally, vertically, and/or along a tapered surface. A substrate may be a layer, may include one or more layers therein, and/or may have one or more layer thereupon, thereabove, and/or therebelow.

As used herein, a "field effect transistor" refers to any semiconductor device having a semiconductor channel through which electrical current flows with a current density modulated by an external electrical field. As used herein, an "active region" refers to a source region of a field effect transistor or a drain region of a field effect transistor. A "top active region" refers to an active region of a field effect transistor that is located above another active region of the field effect transistor. A "bottom active region" refers to an active region of a field effect transistor that is located below another active region of the field effect transistor. A monolithic three-dimensional memory array is a memory array in which multiple memory levels are formed above a single substrate, such as a semiconductor wafer, with no intervening substrates. The term "monolithic" means that layers of each level of the array are directly deposited on the layers of each underlying level of the array. In contrast, two dimensional arrays may be formed separately and then packaged together to form a non-monolithic memory device. For example, non-monolithic stacked memories have been constructed by forming memory levels on separate substrates and vertically stacking the memory levels, as described in U.S. Pat. No. 5,915,167 titled "Three-dimensional Structure Memory." The substrates may be thinned or removed from the memory levels before bonding, but as the memory levels are initially formed over separate substrates, such memories are not true monolithic three-dimensional memory arrays. The various three-dimensional memory devices of the present disclosure include a monolithic three-dimensional NAND string memory device, and can be fabricated employing the various embodiments described herein.

Referring to FIG. 1, a first exemplary structure according to a first embodiment of the present disclosure is illustrated, which can be employed, for example, to fabricate a device structure containing vertical NAND memory devices. The exemplary structure includes a substrate (9, 10), which can be a semiconductor substrate. The substrate can include a substrate semiconductor layer 10, which may be an upper portion of the substrate, such as a single crystal wafer 9, or a single crystal epitaxial layer located on the top surface of a single crystal wafer or another growth substrate 9. Alternatively, substrate portion 9 can be an electrically conductive layer, such as a metallic layer, for example a metal layer. The substrate semiconductor layer 10 can be formed by deposition on the electrically conductive layer 9 or it can be transferred from another source substrate and bonded to the electrically conductive layer 9. Alternatively, the electrically conductive layer 9 can be formed in a recess between the semiconductor material layer 10 and a semiconductor substrate (e.g., silicon wafer). The substrate (9, 10) can include at least one elemental semiconductor material, such as silicon, at least one III-V compound semiconductor material, at least one II-VI compound semiconductor material, at least one organic semiconductor material, or other semiconductor materials known in the art. The substrate can have a major surface, which can be, for example, a topmost surface of the semiconductor material layer. The major surface can be a semiconductor surface. In one embodiment, the entirety of the semiconductor material layer 10 can be single crystalline silicon. In one embodiment, the major surface can be a single crystalline semiconductor surface.

As used herein, a "semiconducting material" refers to a material having electrical conductivity in the range from $1.0 \times 10^{-6}$ S/cm (i.e., $1.0 \times 10^{-4}$ S/m) to $1.0 \times 10^5$ S/cm (i.e., $1.0 \times 10^7$ S/m). As used herein, a "semiconductor material" refers to a material having electrical conductivity in the range from $1.0 \times 10^{-6}$ S/cm to $1.0 \times 10^5$ S/cm in the absence of electrical dopants therein, and is capable of producing a doped material having electrical conductivity in a range from 1.0 S/cm to $1.0 \times 10^5$ S/cm upon suitable doping with an electrical dopant. As used herein, an "electrical dopant" refers to a p-type dopant that adds a hole to a valance band within a band structure, or an n-type dopant that adds an electron to a conduction band within a band structure. As used herein, a "conductive material" refers to a material having electrical conductivity greater than $1.0 \times 10^5$ S/cm. As used herein, an "insulator material" or a "dielectric material" refers to a material having electrical conductivity less than $1.0 \times 10^{-6}$ S/cm. As used herein, a "heavily doped semiconductor material" refers to a semiconductor material that is doped with electrical dopant at a sufficiently high atomic concentration to become a conductive material, i.e., to have electrical conductivity greater than $1.0 \times 10^5$ S/cm. A "doped semiconductor material" may be a heavily doped semiconductor material, or may be a semiconductor material that includes electrical dopants (i.e., p-type dopants and/or n-type dopants) at a concentration that provides electrical conductivity in the range from $1.0 \times 10^{-6}$ S/cm to $1.0 \times 10^5$ S/cm. An "intrinsic semiconductor material" refers to a semiconductor material that is not doped with electrical dopants. Thus, a semiconductor material may be semiconducting or conductive, and may be an intrinsic semiconductor material or a doped semiconductor material. A doped semiconductor material can be semiconducting or conductive depending on the atomic concentration of electrical dopants therein. As used herein, a "metallic material" refers to a conductive material including at least one metallic element therein. All measurements for electrical conductivities are made at the standard condition.

At least one semiconductor device 700 for a peripheral circuitry can be formed on a portion of the substrate (9, 10). The at least one semiconductor device can include, for example, field effect transistors. Optionally, a portion of the semiconductor material layer 10 may be vertically recessed in a peripheral device region 200 to form a recessed semiconductor surface, and the at least one semiconductor device 700 can be formed on the recessed surface of the semiconductor material layer 10. Alternatively, the at least one semiconductor device 700 can be formed on a non-recessed semiconductor surface of the semiconductor material layer 10. In another alternative configuration, the at least one semiconductor device 700 can be formed under the memory array region 100 (i.e., under the memory stack structures which will be described below). In this case, the at least one semiconductor device 700 can be formed in a semiconductor substrate located under layer 9 if layer 9 is an electrically conductive layer. Alternatively, the at least one semiconductor device 700 can be formed in the semiconductor material layer 10 or in layer 9 if layer 9 is a substrate semiconductor layer.

The region (i.e., area) of the at least one semiconductor device 700 is herein referred to as a peripheral device region 200. The region in which a memory array is subsequently formed is herein referred to as a memory array region 100. A contact region 300 for subsequently forming stepped terraces of electrically conductive layers can be provided between the memory array region 100 and the peripheral device region 200.

At least one shallow trench isolation structure 120 can be formed by etching portions of the substrate (9, 10) and depositing a dielectric material therein. A gate dielectric layer, at least one gate conductor layer, and a gate cap dielectric layer can be formed over the substrate, and can be subsequently patterned to form at least one gate structure (150, 152, 154, 158), each of which can include a gate dielectric 150, a gate electrode (152, 154), and a gate cap dielectric 158. The gate electrode (152, 154) may include a stack of a first gate electrode portion 152 and a second gate electrode portion 154. At least one gate spacer 156 can be formed around the at least one gate structure (150, 152, 154, 158) by depositing and anisotropic ally etching a dielectric liner. Active regions 130 can be formed in upper portions of the substrate, for example, by introducing electrical dopants employing the at least one gate structure (150, 152, 154, 158) as masking structures. Additional masks may be employed as needed. The active region 130 can include source regions and drain regions of field effect transistors.

A first dielectric liner 161 and a second dielectric liner 162 can be optionally formed. Each of the first and second dielectric liners (161, 162) can comprise a silicon oxide layer, a silicon nitride layer, and/or a dielectric metal oxide layer. As used herein, silicon oxide includes silicon dioxide as well as non-stoichiometric silicon oxides having more or less than two oxygen atoms for each silicon atoms. Silicon dioxide is preferred. In an illustrative example, the first dielectric liner 161 can be a silicon oxide layer, and the second dielectric liner 162 can be a silicon nitride layer. The least one semiconductor device for the peripheral circuitry can contain a driver circuit for memory devices to be subsequently formed, which can include at least one NAND device. A planarization dielectric layer 170 can be formed over the at least one semiconductor device 700, and can be planarized to provide a planar top surface. In case the at least one semiconductor device 700 is formed on a recessed surface of the semiconductor material layer 10, the top surface of the planarization dielectric layer 170 can be planarized employing a top surface of the semiconductor material layer 10 as a stopping layer. In case the at least one semiconductor device 700 is formed on a non-recessed top surface of the semiconductor material layer 10, the planarization dielectric layer 170 can be removed from the memory array region 100 and the contact region 300, and a selective epitaxy process can be performed to grow an additional semiconductor material from the memory array region 100 and the contact region 300. A planarization process can be employed so that the top surface of the added semiconductor material of the semiconductor material layer 10 is coplanar with the top surface of the planarization dielectric layer 170.

Referring to FIGS. 2A and 2B, a buried source semiconductor layer 61 is formed on or in the semiconductor material layer 10. In one embodiment, the buried source semiconductor layer 61 is formed by depositing an doped semiconductor layer 61 over the semiconductor material layer 10. For example, layer 61 may be a heavily n-type doped polysilicon layer. Layer 61 may be patterned by photolithograph and etching to expose the peripheral region 2000. In another embodiment, the buried source semiconductor layer 61 is formed by implanting electrical dopants into an upper portion of the semiconductor material layer 10. In one embodiment, the semiconductor material layer 10 can be p-doped, and the electrical dopants can be n-type dopants. The buried source semiconductor layer 61 can be formed, for example, by applying an implant mask (which may include a photoresist layer) over the semiconductor material layer 10, by lithographically patterning the implant mask to form an opening that extends over the memory array region 100 and optionally into the contact region 300, and by implanting n-type electrical dopants (such as phosphorus, arsenic, or antimony) through the opening in the implant mask.

The thickness of the buried source semiconductor layer 61 can be in a range from 50 nm to 500 nm, although lesser and greater thicknesses can also be employed. The average net dopant concentration of the n-type dopants in the buried source semiconductor layer 61 can be in a range from $1.0 \times 10^{19}/cm^3$ to $1.0 \times 10^{21}/cm^3$, although lesser and greater average net dopant concentrations can also be employed. The p-type dopant concentration of the portion of the semiconductor material layer 10 can be in a range from $1.0 \times 10^{14}/cm^3$ to $1.0 \times 10^{18}/cm^3$, although lesser and greater average net dopant concentrations can also be employed. A p-n junction can be formed between the remaining portion of the semiconductor material layer 10 and the buried source semiconductor layer 61.

Discrete p-doped semiconductor material portions 6 can be formed within the buried source semiconductor layer 61. An implant mask, which can be a photoresist layer, can be applied over the buried source semiconductor layer 61, and can be lithographically patterned to form discrete openings therethrough. The pattern of openings through the implant mask can be selected so that the areas of the openings through the implant mask partially overlap with each of the memory stack structures 55 to be subsequently formed over the substrate (9, 10) that includes the semiconductor material layer 10 and the buried source semiconductor layer 61. The locations of the memory stack structures 55 to be subsequently formed are marked with dotted circles in FIG. 2B.

In one embodiment, the pattern of the openings through the implant mask can include a pattern of rectangular openings that extend along a first horizontal direction hd1 and having a width along a second horizontal direction hd2 that is perpendicular to the first horizontal direction hd1. In one embodiment, the rectangular openings through the implant mask can form a two-dimensional array. Alternately, the openings may have elliptical or circular horizontal cross-sectional shapes.

P-type dopants can be implanted into surface portions of the buried source semiconductor layer 61 at a dose sufficient to change the net doping of the implanted regions. The portions of the buried source semiconductor layer 61 that are converted into p-doped regions constitute the p-doped semiconductor material portions 6. In one embodiment, the average net dopant concentration of the p-type dopants in the p-doped semiconductor material portions 6 can be in a range from $1.0 \times 10^{19}/cm^3$ to $1.0 \times 10^{21}/cm^3$, although lesser and greater average net dopant concentrations can also be employed. In one embodiment, the p-doped semiconductor material portions 6 can be laterally surrounded by the buried source semiconductor layer 61, and can form a p-n junction with the buried source semiconductor layer 61. In one embodiment, the bottom surface of each p-doped semiconductor material portion 6 can contact a surface of the buried source region 61. In this case, each p-doped semiconductor material portion 6 can be entirely embedded within the buried source region 61. In one embodiment, p-doped semiconductor material portion 6 can have a substantially rectangular cross-sectional shape, and adjacent portions 6 can be separated by portions of the buried source region 61 also having a substantially rectangular cross-sectional shape.

Thus, at the processing steps of FIGS. 1, 2A, and 2B, a combination of the buried source semiconductor layer 61 and p-doped semiconductor material portions 6 is formed over a first portion (which is the remaining semiconductor material layer 10) of a substrate (9, 10). The buried source semiconductor layer 61 comprises an n-doped semiconductor material, and the p-doped semiconductor material portions 6 are embedded within the buried source semiconductor layer 61. The p-doped semiconductor material portions are laterally spaced from one another by the buried source semiconductor layer. In this case, the buried source semiconductor layer 61 is formed by depositing a doped semiconductor layer or by implanting n-type dopants into a second portion (i.e., a surface portion of the semiconductor material layer 10 as provided prior to formation of the buried source semiconductor layer 61) of the substrate that overlies the first portion of the substrate. The p-doped semiconductor material portions 6 are formed by implanting n-type dopants into discrete regions into layer located on or in the second portion of the substrate. P-n junctions are formed between the buried source semiconductor layer 61 and each of the p-doped semiconductor material portions 6.

Figure 3:
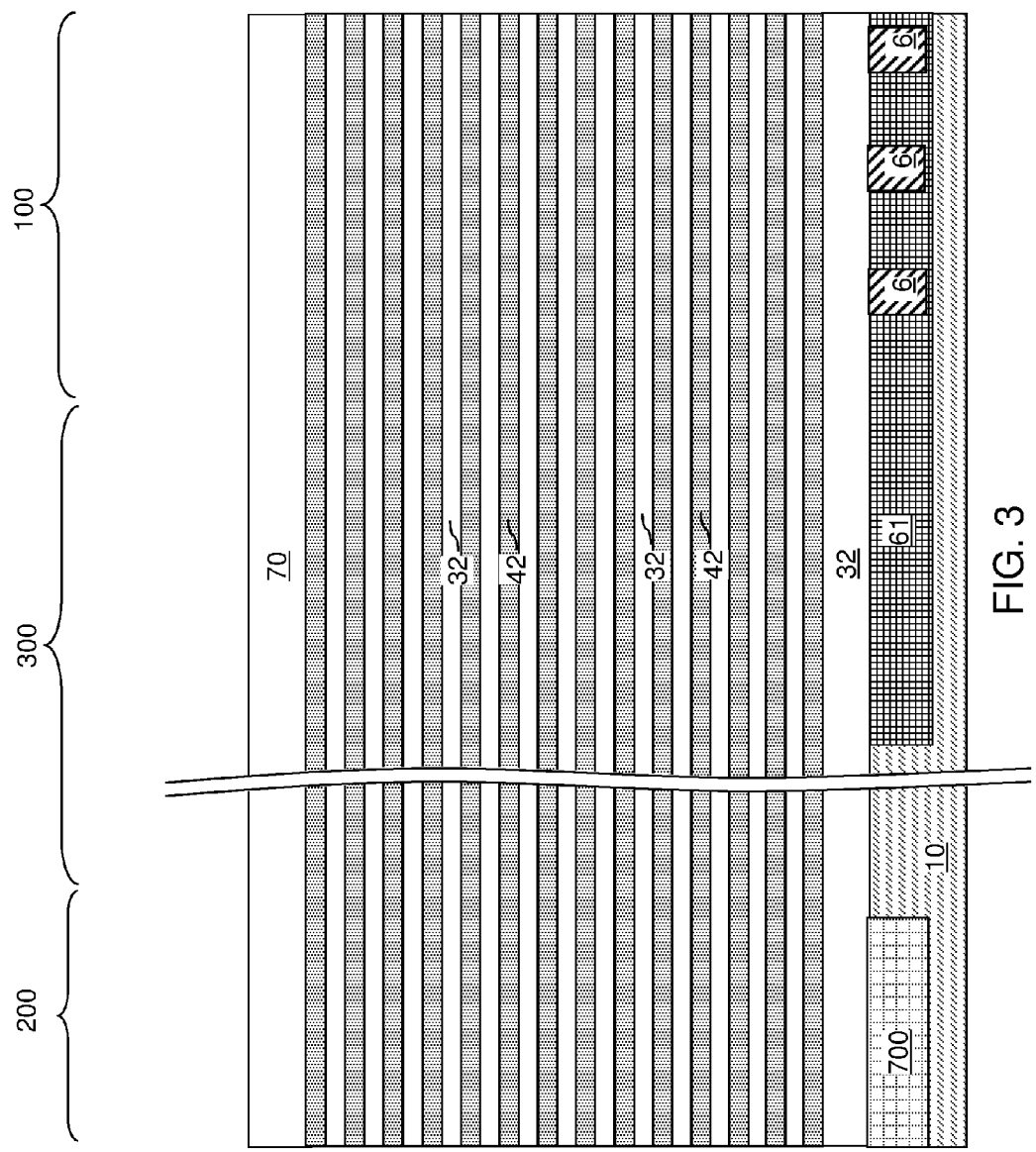
FIG. 3 is a vertical cross-sectional view of the first exemplary structure after formation of an alternating stack of insulating layers and sacrificial material layers according to the first embodiment of the present disclosure.

Referring to FIG. 3, a stack of an alternating plurality of first material layers (which can be insulating layers 32) and second material layers (which can be sacrificial material layer 42) is formed over the top surface of the substrate (9, 10). Each first material layer and each second material layer can be deposited by a conformal deposition method such as low pressure chemical vapor deposition (LPCVD) or atomic layer deposition (ALD).

As used herein, a "material layer" refers to a layer including a material throughout the entirety thereof. As used herein, an alternating plurality of first elements and second elements refers to a structure in which instances of the first elements and instances of the second elements alternate. Each instance of the first elements that is not an end element of the alternating plurality is adjoined by two instances of the second elements on both sides, and each instance of the second elements that is not an end element of the alternating plurality is adjoined by two instances of the first elements on both ends. The first elements may have the same thickness thereamongst, or may have different thicknesses. The second elements may have the same thickness thereamongst, or may have different thicknesses. The alternating plurality of first material layers and second material layers may begin with an instance of the first material layers or with an instance of the second material layers, and may end with an instance of the first material layers or with an instance of the second material layers. In one embodiment, an instance of the first elements and an instance of the second elements may form a unit that is repeated with periodicity within the alternating plurality.

Each first material layer includes a first material, and each second material layer includes a second material that is different from the first material. In one embodiment, each first material layer can be an insulating layer 32, and each second material layer can be a sacrificial material layer. In this case, the stack can include an alternating plurality of insulating layers 32 and sacrificial material layers 42, and constitutes a prototype stack of alternating layers comprising insulating layers 32 and sacrificial material layers 42. As used herein, a "prototype" structure or an "in-process" structure refers to a transient structure that is subsequently modified in the shape or composition of at least one component therein.

The stack of the alternating plurality is herein referred to as an alternating stack (32, 42). In one embodiment, the alternating stack (32, 42) can include insulating layers 32 composed of the first material, and sacrificial material layers 42 composed of a second material different from that of insulating layers 32. The first material of the insulating layers 32 can be at least one insulating material. As such, each insulating layer 32 can be an insulating material layer. Insulating materials that can be employed for the insulating layers 32 include, but are not limited to, silicon oxide (including doped or undoped silicate glass), silicon nitride, silicon oxynitride, organosilicate glass (OSG), dielectric metal oxides that are commonly known as high dielectric constant (high-k) dielectric oxides (e.g., aluminum oxide, hafnium oxide, etc.) and silicates thereof, dielectric metal oxynitrides and silicates thereof, and organic insulating materials. In one embodiment, the first material of the insulating layers 32 can be silicon oxide.

The second material of the sacrificial material layers 42 is a sacrificial material that can be removed selective to the first material of the insulating layers 32. As used herein, a removal of a first material is "selective to" a second material if the removal process removes the first material at a rate that is at least twice the rate of removal of the second material. The ratio of the rate of removal of the first material to the rate of removal of the second material is herein referred to as a "selectivity" of the removal process for the first material with respect to the second material.

The sacrificial material layers 42 may comprise an insulating material, a semiconductor material, or a conductive material. The second material of the sacrificial material layers 42 can be subsequently replaced with electrically conductive electrodes which can function, for example, as control gate electrodes of a vertical NAND device. Non-limiting examples of the second material include silicon nitride, an amorphous semiconductor material (such as amorphous silicon), and a polycrystalline semiconductor material (such as polysilicon). In one embodiment, the sacrificial material layers 42 can be spacer material layers that comprise silicon nitride or a semiconductor material including at least one of silicon and germanium. As used herein, a "spacer material layer" refers to a material layer that provides vertical separation between two layers, such as a pair of insulating layers 32. Thus, an alternating stack of insulating layers 32 and spacer material layers (as embodied as the sacrificial material layers 42) can be formed. In this case, the spacer material layers are formed as sacrificial material layers 42, and are subsequently replaced with the electrically conductive layers after formation of the memory stack structures.

In one embodiment, the insulating layers 32 can include silicon oxide, and sacrificial material layers can include silicon nitride sacrificial material layers. The first material of the insulating layers 32 can be deposited, for example, by chemical vapor deposition (CVD). For example, if silicon oxide is employed for the insulating layers 32, tetraethyl orthosilicate (TEOS) can be employed as the precursor material for the CVD process. The second material of the sacrificial material layers 42 can be formed, for example, CVD or atomic layer deposition (ALD).

The thicknesses of the insulating layers 32 and the sacrificial material layers 42 can be in a range from 20 nm to 50 nm, although lesser and greater thicknesses can be employed for each insulating layer 32 and for each sacrificial material layer 42. The number of repetitions of the pairs of an insulating layer 32 and a sacrificial material layer (e.g., a control gate electrode or a sacrificial material layer) 42 can be in a range from 2 to 1,024, and typically from 8 to 256, although a greater number of repetitions can also be employed. The top and bottom gate electrodes in the stack may function as the select gate electrodes. In one embodiment, each sacrificial material layer 42 in the alternating stack (32, 42) can have a uniform thickness that is substantially invariant within each respective sacrificial material layer 42.

A dielectric cap layer 70 can be formed over the alternating stack of the insulating layers 32 and the sacrificial material layers 42. The dielectric cap layer 70 includes a dielectric material such as silicon oxide. The thickness of the dielectric cap layer 70 can be in a range from 30 nm to 600 nm, although lesser and greater thicknesses can also be employed.

Figure 4:
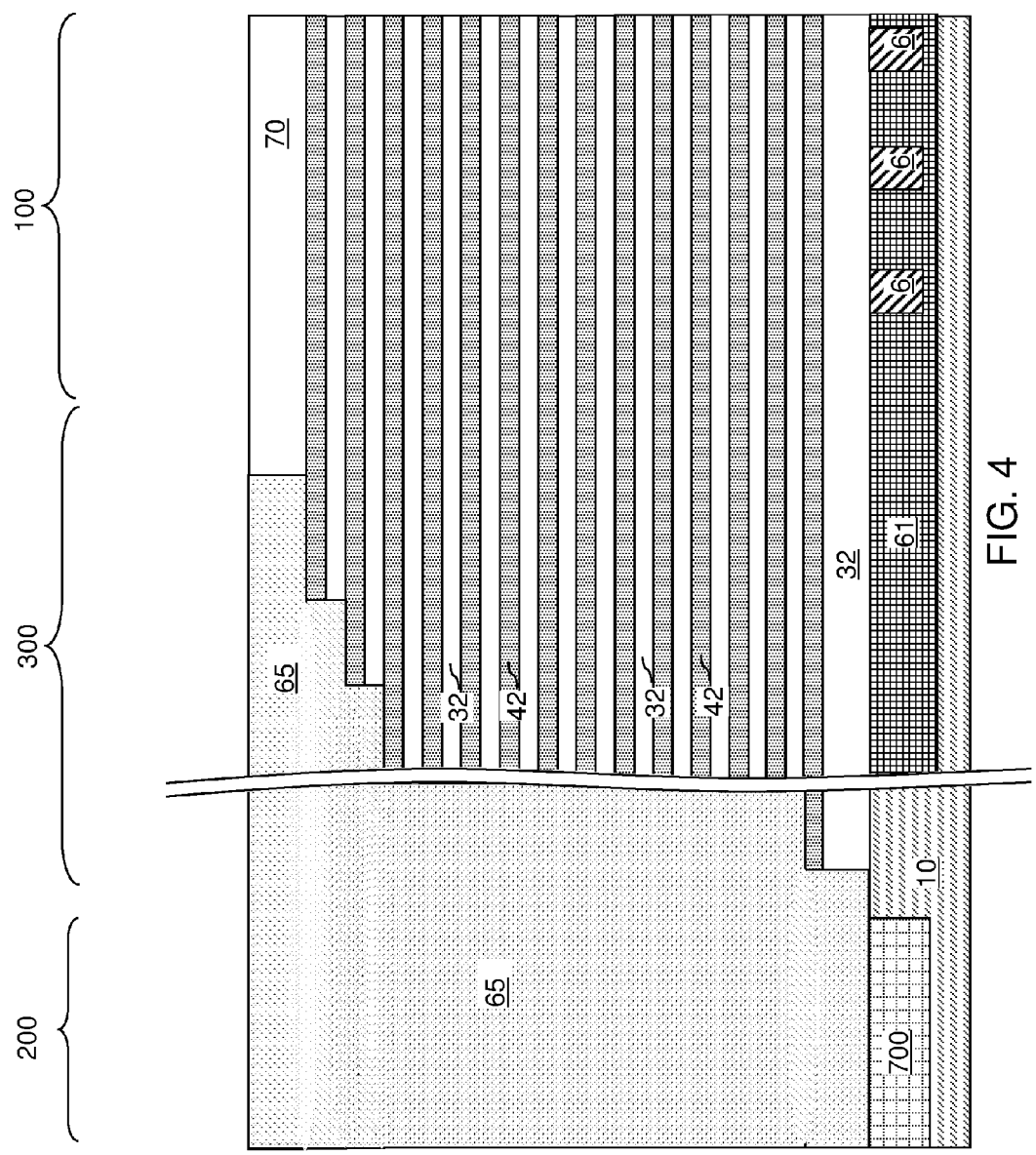
FIG. 4 is a vertical cross-sectional view of the first exemplary structure after formation of a terrace region and a retro-stepped dielectric material portion according to the first embodiment of the present disclosure.

Referring to FIG. 4, a stepped cavity can be formed within the contact region 300 which is located between the memory array region 100 and the peripheral region 200 containing the at least one semiconductor device for the peripheral circuitry. The stepped cavity can have various stepped surfaces such that the horizontal cross-sectional shape of the stepped cavity changes in steps as a function of the vertical distance from the top surface of the substrate (9, 10). In one embodiment, the stepped cavity can be formed by repetitively performing a set of processing steps. The set of processing steps can include, for example, an etch process of a first type that vertically increases the depth of a cavity by one or more levels, and an etch process of a second type that laterally expands the area to be vertically etched in a subsequent etch process of the first type. As used herein, a "level" of a structure including alternating plurality is defined as the relative position of a pair of a first material layer and a second material layer within the structure.

After formation of the stepped cavity, a peripheral portion of the alternating stack (32, 42) can have stepped surfaces after formation of the stepped cavity. As used herein, "stepped surfaces" refer to a set of surfaces that include at least two horizontal surfaces and at least two vertical surfaces such that each horizontal surface is adjoined to a first vertical surface that extends upward from a first edge of the horizontal surface, and is adjoined to a second vertical surface that extends downward from a second edge of the horizontal surface. A "stepped cavity" refers to a cavity having stepped surfaces.

A terrace region is formed by patterning the alternating stack (32, 42). Each sacrificial material layer 42 other than the topmost sacrificial material layer 42 within the alternating stack (32, 42) laterally extends farther than any overlying sacrificial material layer 42 within the alternating stack (32, 42). The terrace region includes stepped surfaces of the alternating stack (32, 42) that continuously extend from a bottommost layer within the alternating stack (32, 42) to a topmost layer within the alternating stack (32, 42). In one embodiment, a top surface of the planarization dielectric layer 170 can be physically exposed at the bottom of the stepped cavity.

A retro-stepped dielectric material portion 65 (i.e., an insulating fill material portion) can be formed in the stepped cavity by deposition of a dielectric material therein. A dielectric material such as silicon oxide can be deposited in the stepped cavity. Excess portions of the deposited dielectric material can be removed from above the top surface of the topmost insulating layer 32, for example, by chemical mechanical planarization (CMP). The remaining portion of the deposited dielectric material filling the stepped cavity constitutes the retro-stepped dielectric material portion 65. As used herein, a "retro-stepped" element refers to an element that has stepped surfaces and a horizontal cross-sectional area that increases monotonically as a function of a vertical distance from a top surface of a substrate on which the element is present. If silicon oxide is employed for the retro-stepped dielectric material portion 65, the silicon oxide of the retro-stepped dielectric material portion 65 may, or may not, be doped with dopants such as B, P, and/or F.

Figure 5:
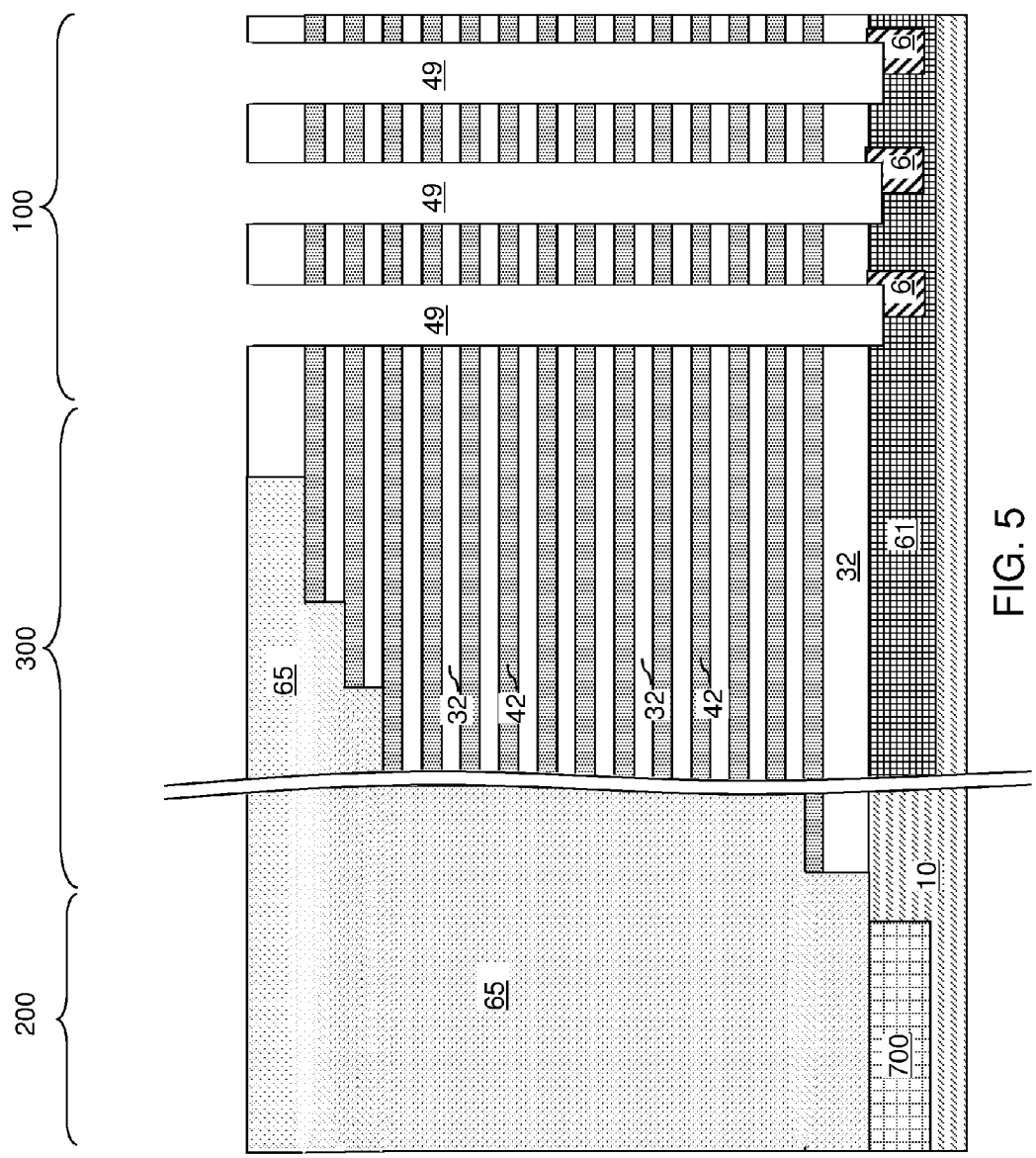
FIG. 5 is a vertical cross-sectional view of the first exemplary structure after formation of memory openings extending through the alternating stack according to the first embodiment of the present disclosure.

Referring to FIG. 5, a lithographic material stack (not shown) including at least a photoresist layer can be formed over the dielectric cap layer 70, and can be lithographically patterned to form openings within the memory array region 100. The pattern in the lithographic material stack can be transferred through the dielectric cap layer 70 and through entirety of the alternating stack (32, 42) by at least one anisotropic etch that employs the patterned lithographic material stack as an etch mask. Portions of the alternating stack (32, 42) underlying the openings in the patterned lithographic material stack are etched to form memory openings 49. In other words, the transfer of the pattern in the patterned lithographic material stack through the alternating stack (32, 42) forms the memory openings 49 that extend through the alternating stack (32, 42). The chemistry of the anisotropic etch process employed to etch through the materials of the alternating stack (32, 42) can alternate to optimize etching of the first and second materials in the alternating stack (32, 42). The anisotropic etch can be, for example, a series of reactive ion etches. The sidewalls of the memory openings 49 can be substantially vertical, or can be tapered. The patterned lithographic material stack can be subsequently removed, for example, by ashing.

The locations of the memory openings 49 can be selected such that each bottom surface of the memory openings 49 straddles one of the p-n junctions between the n-type doped buried source semiconductor layer 61 and the p-doped semiconductor material portions 6. Thus, a p-n junction is physically exposed at the bottom of each memory opening 49. The pattern of the memory openings 49 can be the same as the pattern of the dotted lines in FIG. 2B, which corresponds to the areas of memory stack structures 55 that are subsequently formed in the memory openings 49. In one embodiment, at least 10% (which can be greater than 20%, such as 25 to 55%) of the bottom area of each memory opening 49 can include an area of a p-doped semiconductor material portion 20, and at least 20% (which can be greater than 40%, such as 45 to 75%) of the bottom area of each memory opening 49 can include an area of the buried source semiconductor layer 61. In one embodiment, the p-n junctions that underlie the memory openings 49 can include substantially vertical surfaces.

Referring to FIG. 6A, a memory opening 49 in the exemplary device structure of FIG. 5 is illustrated. The memory opening 49 extends through the insulating cap layer 70, the alternating stack (32, 42), and into portions of the p-n junctions between the buried source semiconductor layer 61 and the p-doped semiconductor material portions 6. The recess depth of the bottom surface of each memory opening 49 with respect to the top surface of the buried source semiconductor layer 61 can be in a range from 0 nm to 30 nm, although greater recess depths can also be employed.

Referring to FIG. 6B, an optional blocking dielectric layer 52 and a charge storage layer 54 can be sequentially deposited in the memory openings 49. The blocking dielectric layer 52 can include a single dielectric material layer or a stack of a plurality of dielectric material layers. In one embodiment, the blocking dielectric layer can include a dielectric metal oxide layer consisting essentially of a dielectric metal oxide. As used herein, a dielectric metal oxide refers to a dielectric material that includes at least one metallic element and at least oxygen. The dielectric metal oxide may consist essentially of the at least one metallic element and oxygen, or may consist essentially of the at least one metallic element, oxygen, and at least one non-metallic element such as nitrogen. In one embodiment, the blocking dielectric layer 52 can include a dielectric metal oxide having a dielectric constant greater than 7.9, i.e., having a dielectric constant greater than the dielectric constant of silicon nitride.

Non-limiting examples of dielectric metal oxides include aluminum oxide ($Al_2O_3$), hafnium oxide ($HfO_2$), lanthanum oxide ($LaO_2$), yttrium oxide ($Y_2O_3$), tantalum oxide ($TaO_5$), silicates thereof, nitrogen-doped compounds thereof, alloys thereof, and stacks thereof. The dielectric metal oxide layer can be deposited, for example, by chemical vapor deposition (CVD), atomic layer deposition (ALD), pulsed laser deposition (PLD), liquid source misted chemical deposition, or a combination thereof. The thickness of the dielectric metal oxide layer can be in a range from 1 nm to 20 nm, although lesser and greater thicknesses can also be employed. The dielectric metal oxide layer can subsequently function as a dielectric material portion that blocks leakage of stored electrical charges to control gate electrodes. In one embodiment, the blocking dielectric layer 52 includes aluminum oxide. In one embodiment, the blocking dielectric layer 52 can include multiple dielectric metal oxide layers having different material compositions.

Alternatively or additionally, the blocking dielectric layer 52 can include a dielectric semiconductor compound such as silicon oxide, silicon oxynitride, silicon nitride, or a combination thereof. In one embodiment, the blocking dielectric layer 52 can include silicon oxide. In this case, the dielectric semiconductor compound of the blocking dielectric layer 52 can be formed by a conformal deposition method such as low pressure chemical vapor deposition, atomic layer deposition, or a combination thereof. The thickness of the dielectric semiconductor compound can be in a range from 1 nm to 20 nm, although lesser and greater thicknesses can also be employed. Alternatively, the blocking dielectric layer 52 can be omitted, and a backside blocking dielectric layer can be formed after formation of backside recesses on surfaces of memory films to be subsequently formed.

Subsequently, the charge storage layer 54 can be formed. In one embodiment, the charge storage layer 54 can be a continuous layer or patterned discrete portions of a charge trapping material including a dielectric charge trapping material, which can be, for example, silicon nitride. Alternatively, the charge storage layer 54 can include a continuous layer or patterned discrete portions of a conductive material such as doped polysilicon or a metallic material that is patterned into multiple electrically isolated portions (e.g., floating gates), for example, by being formed within lateral recesses into sacrificial material layers 42. In one embodiment, the charge storage layer 54 includes a silicon nitride layer. In one embodiment, the sacrificial material layers 42 and the insulating layers 32 can have vertically coincident sidewalls, and the charge storage layer 54 can be formed as a single continuous layer.

In another embodiment, the sacrificial material layers 42 can be laterally recessed with respect to the sidewalls of the insulating layers 32, and a combination of a deposition process and an anisotropic etch process can be employed to form the charge storage layer 54 as a plurality of memory material portions that are vertically spaced apart. While the present disclosure is described employing an embodiment in which the charge storage layer 54 is a single continuous layer, embodiments are expressly contemplated herein in which the charge storage layer 54 is replaced with a plurality of memory material portions (which can be charge trapping material portions or electrically isolated conductive material portions) that are vertically spaced apart.

The charge storage layer 54 can be formed as a single charge storage layer of homogeneous composition, or can include a stack of multiple charge storage layers. The multiple charge storage layers, if employed, can comprise a plurality of spaced-apart floating gate material layers that contain conductive materials (e.g., metal such as tungsten, molybdenum, tantalum, titanium, platinum, ruthenium, and alloys thereof, or a metal silicide such as tungsten silicide, molybdenum silicide, tantalum silicide, titanium silicide, nickel silicide, cobalt silicide, or a combination thereof) and/or semiconductor materials (e.g., polycrystalline or amorphous semiconductor material including at least one elemental semiconductor element or at least one compound semiconductor material). Alternatively or additionally, the charge storage layer 54 may comprise an insulating charge trapping material, such as one or more silicon nitride segments. Alternatively, the charge storage layer 54 may comprise conductive nanoparticles such as metal nanoparticles, which can be, for example, ruthenium nanoparticles. The charge storage layer 54 can be formed, for example, by chemical vapor deposition (CVD), atomic layer deposition (ALD), physical vapor deposition (PVD), or any suitable deposition technique for storing electrical charges therein. The thickness of the charge storage layer 54 can be in a range from 2 nm to 20 nm, although lesser and greater thicknesses can also be employed.

Referring to FIG. 6C, a tunneling dielectric layer 56 and an optional first semiconductor channel layer 601 can be sequentially deposited in the memory openings 49. The tunneling dielectric layer 56 includes a dielectric material through which charge tunneling can be performed under suitable electrical bias conditions. The charge tunneling may be performed through hot-carrier injection or by Fowler-Nordheim tunneling induced charge transfer depending on the mode of operation of the monolithic three-dimensional NAND string memory device to be formed. The tunneling dielectric layer 56 can include silicon oxide, silicon nitride, silicon oxynitride, dielectric metal oxides (such as aluminum oxide and hafnium oxide), dielectric metal oxynitride, dielectric metal silicates, alloys thereof, and/or combinations thereof. In one embodiment, the tunneling dielectric layer 56 can include a stack of a first silicon oxide layer, a silicon oxynitride layer, and a second silicon oxide layer, which is commonly known as an ONO stack. In one embodiment, the tunneling dielectric layer 56 can include a silicon oxide layer that is substantially free of carbon or a silicon oxynitride layer that is substantially free of carbon. The thickness of the tunneling dielectric layer 56 can be in a range from 2 nm to 20 nm, although lesser and greater thicknesses can also be employed.

The optional first semiconductor channel layer 601 includes a semiconductor material such as at least one elemental semiconductor material, at least one III-V compound semiconductor material, at least one II-VI compound semiconductor material, at least one organic semiconductor material, or other semiconductor materials known in the art. In one embodiment, the first semiconductor channel layer 601 includes amorphous silicon or polysilicon. The first semiconductor channel layer 601 can be formed by a conformal deposition method such as low pressure chemical vapor deposition (LPCVD). The thickness of the first semiconductor channel layer 601 can be in a range from 2 nm to 10 nm, although lesser and greater thicknesses can also be employed. A cavity 49' is formed in the volume of each memory opening 49 that is not filled with the deposited material layers (52, 54, 56, 601).

Referring to FIG. 6D, the optional first semiconductor channel layer 601, the tunneling dielectric layer 56L, the charge storage layer 54, the blocking dielectric layer 52 are sequentially anisotropically etched employing at least one anisotropic etch process. The portions of the first semiconductor channel layer 601, the tunneling dielectric layer 56, the charge storage layer 54, and the blocking dielectric layer 52 located above the top surface of the insulating cap layer 70 can be removed by the at least one anisotropic etch process. Further, the horizontal portions of the first semiconductor channel layer 601, the tunneling dielectric layer 56, the charge storage layer 54, and the blocking dielectric layer 52 at a bottom of each cavity 49' can be removed to form openings in remaining portions thereof. Each of the first semiconductor channel layer 601, the tunneling dielectric layer 56, the charge storage layer 54, and the blocking dielectric layer 52 can be etched by anisotropic etch process.

The charge storage layer 54 can comprise a charge trapping material or a floating gate material. In one embodiment, each charge storage layer 54 can include a vertical stack of charge storage regions that store electrical charges upon programming. In one embodiment, the charge storage layer 54 can be a charge storage layer in which each portion adjacent to the sacrificial material layers 42 constitutes a charge storage region.

A surface of the buried source semiconductor layer 61 and a surface of a respective p-doped semiconductor material portion 6 are physically exposed at the bottom of each cavity 49'. A set of a blocking dielectric layer 52, a charge storage layer 54, and a tunneling dielectric layer 56 in a memory opening 49 constitutes a memory film 50, which includes a plurality of charge storage regions (as embodied as portions of the charge storage layer 54 at each level of the sacrificial material layers 42) that are insulated from surrounding materials by the blocking dielectric layer 52 and the tunneling dielectric layer 56. In one embodiment, the first semiconductor channel layer 601, the tunneling dielectric layer 56, the charge storage layer 54, and the blocking dielectric layer 52 can have vertically coincident sidewalls.

Referring to FIG. 6E, a second semiconductor channel layer 602 can be deposited directly on a p-n junction between the buried source semiconductor layer 61 and a respective p-doped semiconductor material portion 6 at the bottom of each memory opening 49. The second semiconductor channel layer 602 includes a semiconductor material such as at least one elemental semiconductor material, at least one III-V compound semiconductor material, at least one II-VI compound semiconductor material, at least one organic semiconductor material, or other semiconductor materials known in the art. In one embodiment, the second semiconductor channel layer 602 includes amorphous silicon or polysilicon. The second semiconductor channel layer 602 can be formed by a conformal deposition method such as low pressure chemical vapor deposition (LPCVD). The thickness of the second semiconductor channel layer 602 can be in a range from 2 nm to 10 nm, although lesser and greater thicknesses can also be employed. The second semiconductor channel layer 602 may partially fill the cavity 49' in each memory opening, or may fully fill the cavity in each memory opening.

The materials of the first semiconductor channel layer 601 and the second semiconductor channel layer 602 are collectively referred to as a semiconductor channel material. In other words, the semiconductor channel material is a set of all semiconductor material in the first semiconductor channel layer 601 and the second semiconductor channel layer 602.

Referring to FIG. 6F, in case the cavity 49' in each memory opening is not completely filled by the second semiconductor channel layer 602, a dielectric core layer 62L can be deposited in the cavity 49' to fill any remaining portion of the cavity 49' within each memory opening. The dielectric core layer 62L includes a dielectric material such as silicon oxide or organosilicate glass. The dielectric core layer 62L can be deposited by a conformal deposition method such as low pressure chemical vapor deposition (LPCVD), or by a self-planarizing deposition process such as spin coating.

Referring to FIG. 6G, the horizontal portion of the dielectric core layer 62L can be removed, for example, by a recess etch from above the top surface of the insulating cap layer 70. Each remaining portion of the dielectric core layer 62L constitutes a dielectric core 62. Further, the horizontal portion of the second semiconductor channel layer 602 located above the top surface of the insulating cap layer 70 can be removed by a planarization process, which can employ a recess etch or chemical mechanical planarization (CMP).

Each adjoining pair of a first semiconductor channel layer 601 and a second semiconductor channel layer 602 can collectively form a vertical semiconductor channel 60 through which electrical current can flow when a vertical NAND device including the vertical semiconductor channel 60 is turned on. Each vertical semiconductor channel 60 contacts an underlying p-n junction. Thus, each semiconductor channel contacts a top surface of the buried source semiconductor layer 61 and a top surface of a respective p-doped semiconductor material portion 20.

A tunneling dielectric layer 56 is surrounded by a charge storage layer 54, and laterally surrounds a portion of the vertical semiconductor channel 60. Each adjoining set of a blocking dielectric layer 52, a charge storage layer 54, and a tunneling dielectric layer 56 collectively constitute a memory film 50, which can store electrical charges with a macroscopic retention time. In some embodiments, a blocking dielectric layer 52 may not be present in the memory film 50 at this step, and a blocking dielectric layer may be subsequently formed after formation of backside recesses. As used herein, a macroscopic retention time refers to a retention time suitable for operation of a memory device as a permanent memory device such as a retention time in excess of 24 hours.

Referring to FIG. 6H, the top surface of each dielectric core 62 can be further recessed within each memory opening, for example, by a recess etch to a depth that is located between the top surface of the insulating cap layer 70 and the bottom surface of the insulating cap layer 70. Drain regions 63 can be formed by depositing a doped semiconductor material within each recessed region above the dielectric cores 62. The doped semiconductor material can be, for example, doped polysilicon. Excess portions of the deposited semiconductor material can be removed from above the top surface of the insulating cap layer 70, for example, by chemical mechanical planarization (CMP) or a recess etch to form the drain regions 63.

Figure 7:
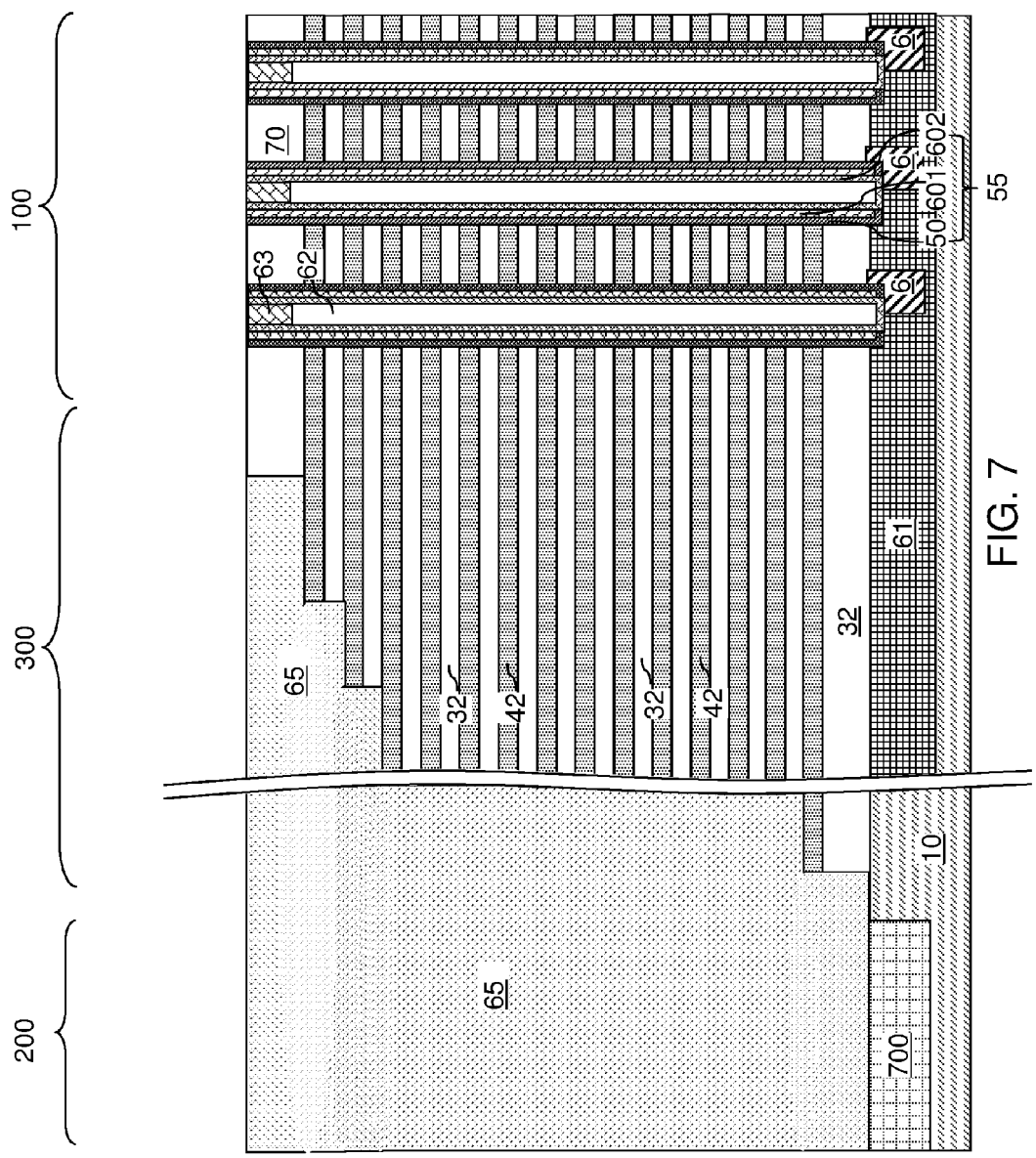
FIG. 7 is a vertical cross-sectional view of the first exemplary structure after formation of memory stack structures according to the first embodiment of the present disclosure.

The exemplary memory stack structure 55 can be embedded into the exemplary structure illustrated in FIG. 5. FIG. 7 illustrates the exemplary structure that incorporates multiple instances of the exemplary memory stack structure of FIG. 6H. Each exemplary memory stack structure 55 includes a vertical semiconductor channel 60 which may comprise layers (601, 602) and a memory film 50. The memory film 50 may comprise a tunneling dielectric layer 56 laterally surrounding the vertical semiconductor channel 60 and a vertical stack of charge storage regions laterally surrounding the tunneling dielectric layer 56 (as embodied as a memory material layer 54) and an optional blocking dielectric layer 52. The buried source semiconductor layer 61 underlies the alternating stack (32, 42) and overlies the first portion of the substrate, i.e., the semiconductor material layer 10. The buried source semiconductor layer 61 contacts bottom surfaces of the vertical semiconductor channels 60. Each p-doped semiconductor material portion 6 contacts one or more bottom surfaces of a respective subset of the vertical semiconductor channels 60. In one embodiment, a p-doped semiconductor material portion 6 can contact bottom surfaces of a plurality of vertical semiconductor channels 60.

The exemplary structure includes a semiconductor device, which comprises a stack (32, 42) including an alternating plurality of material layers (e.g., the sacrificial material layers 42) and insulating layers 32 located over a semiconductor substrate (e.g., over the semiconductor material layer 10), and a memory opening extending through the stack (32, 42). The semiconductor device further comprises an optional blocking dielectric layer 52 vertically extending from a bottommost layer (e.g., the bottommost sacrificial material layer 42) of the stack to a topmost layer (e.g., the topmost sacrificial material layer 42) of the stack, and contacting a sidewall of the memory opening and a horizontal surface of the semiconductor substrate. While the present disclosure is described employing the illustrated configuration for the memory stack structure, the methods of the present disclosure can be applied to alternative memory stack structures including a polycrystalline semiconductor channel.

Figure 8:
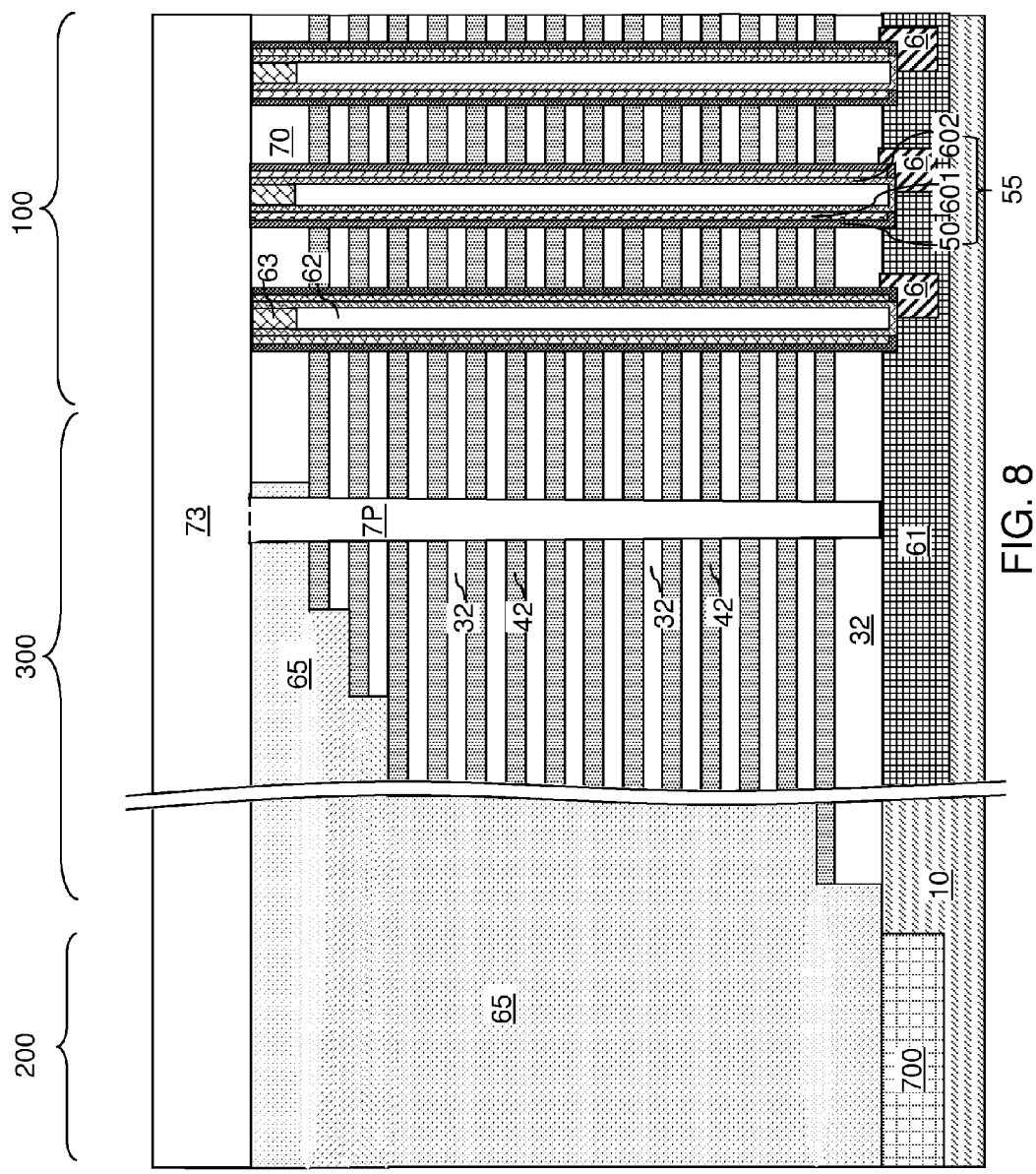
FIG. 8 is a vertical cross-sectional view of the first exemplary structure after formation of support pillar structures and a contact level dielectric layer according to the first embodiment of the present disclosure.

Referring to FIG. 8, at least one support pillar 7P may be optionally formed through the retro-stepped dielectric material portion 65 and/or through the insulating cap layer 70 and/or through the alternating stack (32, 42). In one embodiment, the at least one support pillar 7P can be formed in the contact region 300, which is located adjacent to the memory array region 100. The at least one support pillar 7P can be formed, for example, by forming an opening extending through the retro-stepped dielectric material portion 65 and/or through the alternating stack (32, 42) and at least to the top surface of the substrate (9, 10), and by filling the opening with a material that is resistant to the etch chemistry to be employed to remove the sacrificial material layers 42.

In one embodiment, the at least one support pillar 7P comprises a dummy memory stack structure which contains the memory film 50, semiconductor channel 60 and core dielectric 62 which are formed at the same time as the memory stack structures 55. However, the dummy memory stack structures 7P are not electrically connected to bit lines and are used as support pillars rather than as NAND strings.

In another embodiment, the at least one support pillar 7P can include an insulating material, such as silicon oxide and/or a dielectric metal oxide such as aluminum oxide. In this embodiment, the portion of the dielectric material that is deposited over the insulating cap layer 70 concurrently with deposition of the at least one dielectric support pillar 7P can be present over the insulating cap layer 70 as a contact level dielectric layer 73. Each of the at least one dielectric support pillar 7P and the contact level dielectric layer 73 is an optional structure. As such, the contact level dielectric layer 73 may, or may not, be present over the insulating cap layer 70 and the retro-stepped dielectric material portion 65. Alternatively, formation of the contact level dielectric layer 73 may be omitted, and at least one via level dielectric layer may be subsequently formed, i.e., after formation of a backside contact via structure. The contact level dielectric layer 73 and the at least one dielectric support pillar 7P can be formed as a single continuous structure of integral construction, i.e., without any material interface therebetween. In another embodiment, the portion of the dielectric material that is deposited over the insulating cap layer 70 concurrently with deposition of the at least one dielectric support pillar 7P can be removed, for example, by chemical mechanical planarization or a recess etch. In this case, the contact level dielectric layer 73 is not present, and the top surface of the insulating cap layer 70 can be physically exposed.

Figure 9A:
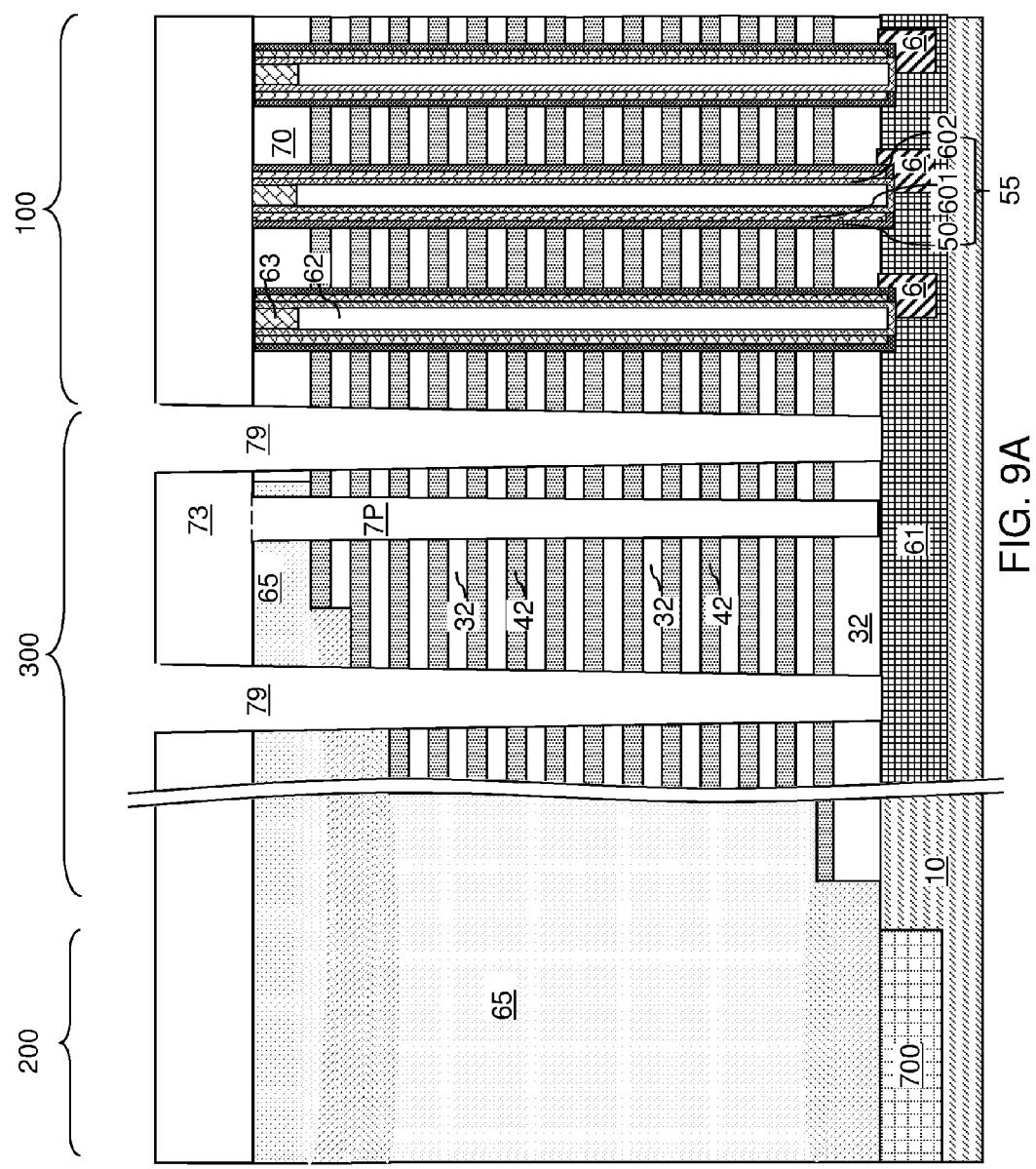
FIG. 9A is a vertical cross-sectional view of the first exemplary structure after formation of backside trenches according to the first embodiment of the present disclosure.
Figure 9B:
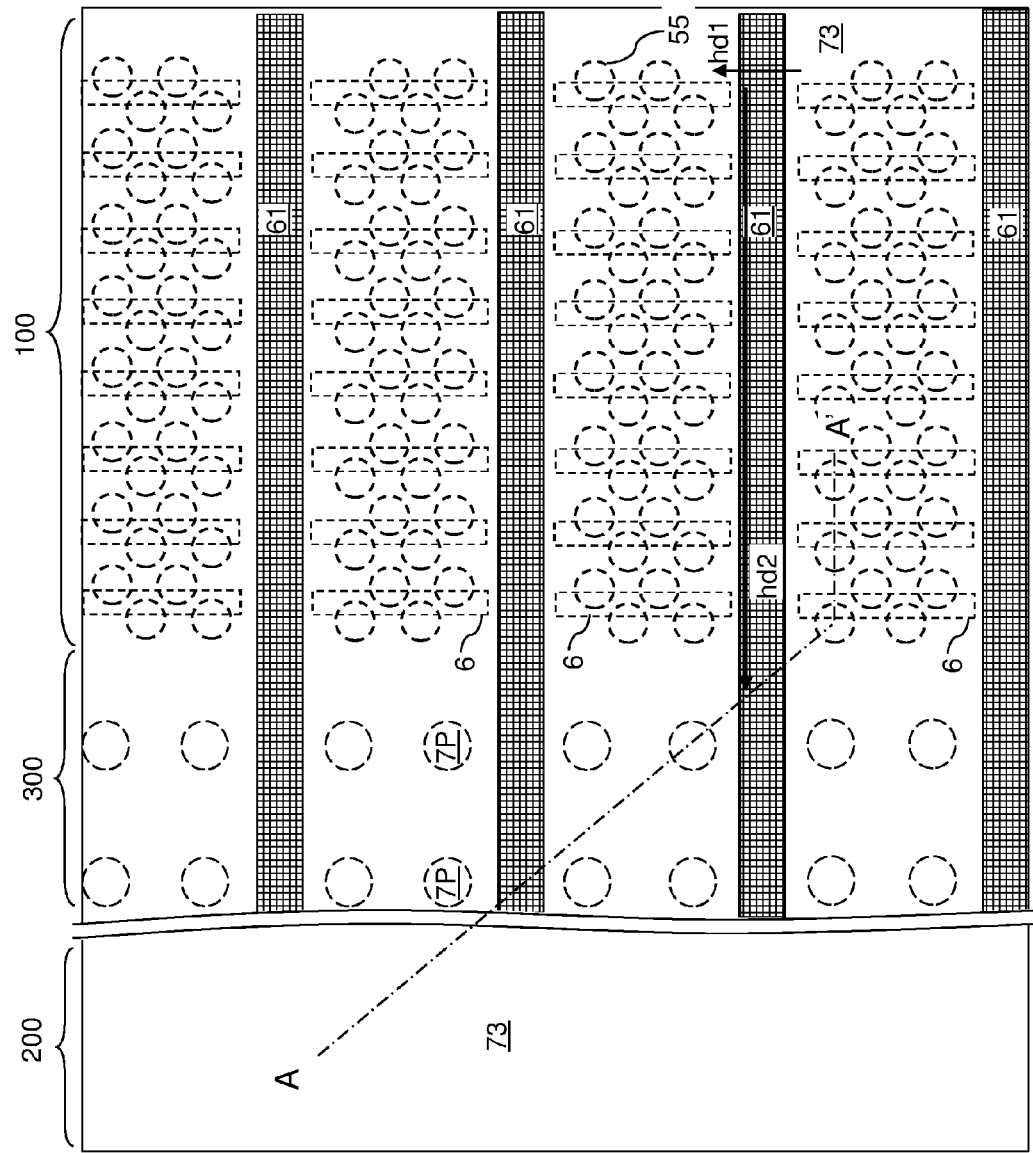
FIG. 9B is a top-down view of the first exemplary structure of FIG. 9A. The vertical plane A-A' is the plane of the vertical cross-sectional view of FIG. 9A.

Referring to FIGS. 9A and 9B, a photoresist layer (not shown) can be applied over the alternating stack (32, 42), and can be lithographically patterned to form at least one elongated opening between groups of memory openings 49. The pattern in the photoresist layer can be transferred through the alternating stack (32, 42) and/or the retro-stepped dielectric material portion 65 employing an anisotropic etch to form backside trenches 79. The backside trenches 79 can extend at least to the top surface of the substrate (9, 10), i.e., to the top surface of the buried source semiconductor layer 61. In one embodiment, the backside trenches 79 can be laterally spaced from one another along the first horizontal direction hd1, and can laterally extend along the second horizontal direction hd2. The backside trenches 79 can be laterally spaced from the p-doped semiconductor material portions 6. In this case, the p-doped semiconductor material portions 6 are not physically exposed at the bottom of the backside trenches 79. The photoresist layer can be subsequently removed, for example, by ashing.

Figure 10:
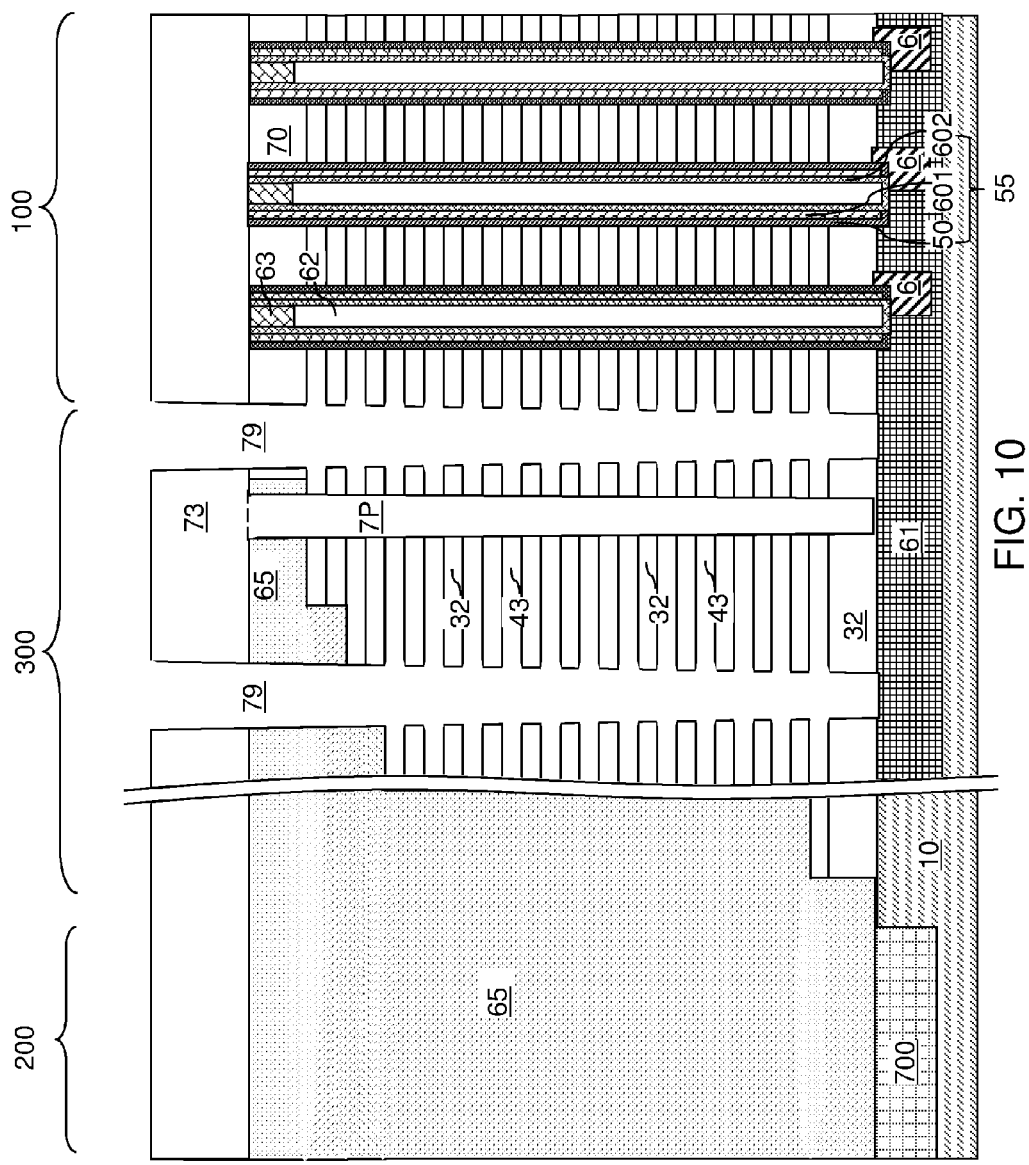
FIG. 10 is a vertical cross-sectional view of the first exemplary structure after formation of backside recesses according to the first embodiment of the present disclosure.

Referring to FIG. 10, an etchant that selectively etches the second material of the sacrificial material layers 42 with respect to the first material of the insulating layers 32 and the semiconductor material of the buried source semiconductor layer 61 can be introduced into the at least one backside trench 79, for example, employing an etch process. Backside recesses 43 are formed in volumes from which the sacrificial material layers 42 are removed. The removal of the second material of the sacrificial material layers 42 can be selective to the first material of the insulating layers 32, the material of the at least one dielectric support pillar 7P, the material of the retro-stepped dielectric material portion 65, the semiconductor material of the semiconductor material layer 10, and the material of the outermost layer of the memory films 50. In one embodiment, the sacrificial material layers 42 can include silicon nitride, and the materials of the insulating layers 32, the at least one support pillar 7P, and the retro-stepped dielectric material portion 65 can be selected from silicon oxide and dielectric metal oxides. In another embodiment, the sacrificial material layers 42 can include a semiconductor material such as polysilicon, and the materials of the insulating layers 32, the at least one dielectric support pillar 7P, and the retro-stepped dielectric material portion 65 can be selected from silicon oxide, silicon nitride, and dielectric metal oxides. In this case, the depth of the at least one backside trench 79 can be modified so that the bottommost surface of the at least one backside trench 79 is located within the gate dielectric layer 12, i.e., to avoid physical exposure of the top surface of the semiconductor material layer 10.

The etch process that removes the second material selective to the first material and the outermost layer of the memory films 50 can be a wet etch process employing a wet etch solution, or can be a gas phase (dry) etch process in which the etchant is introduced in a vapor phase into the at least one backside trench 79. For example, if the sacrificial material layers 42 include silicon nitride, the etch process can be a wet etch process in which the exemplary structure is immersed within a wet etch tank including phosphoric acid, which etches silicon nitride selective to silicon oxide, silicon, and various other materials employed in the art. The at least one support pillar 7P, the retro-stepped dielectric material portion 65, and the memory stack structures 55 provide structural support while the backside recesses 43 are present within volumes previously occupied by the sacrificial material layers 42.

Each backside recess 43 can be a laterally extending cavity having a lateral dimension that is greater than the vertical extent of the cavity. In other words, the lateral dimension of each backside recess 43 can be greater than the height of the backside recess 43. A plurality of backside recesses 43 can be formed in the volumes from which the second material of the sacrificial material layers 42 is removed. The memory openings in which the memory stack structures 55 are formed are herein referred to as front side openings or front side cavities in contrast with the backside recesses 43. In one embodiment, the memory array region 100 comprises an array of monolithic three-dimensional NAND strings having a plurality of device levels disposed above the substrate (9, 10). In this case, each backside recess 43 can define a space for receiving a respective word line of the array of monolithic three-dimensional NAND strings.

Each of the plurality of backside recesses 43 can extend substantially parallel to the top surface of the substrate (9, 10). A backside recess 43 can be vertically bounded by a top surface of an underlying insulating layer 32 and a bottom surface of an overlying insulating layer 32. In one embodiment, each backside recess 43 can have a uniform height throughout.

Figure 11:
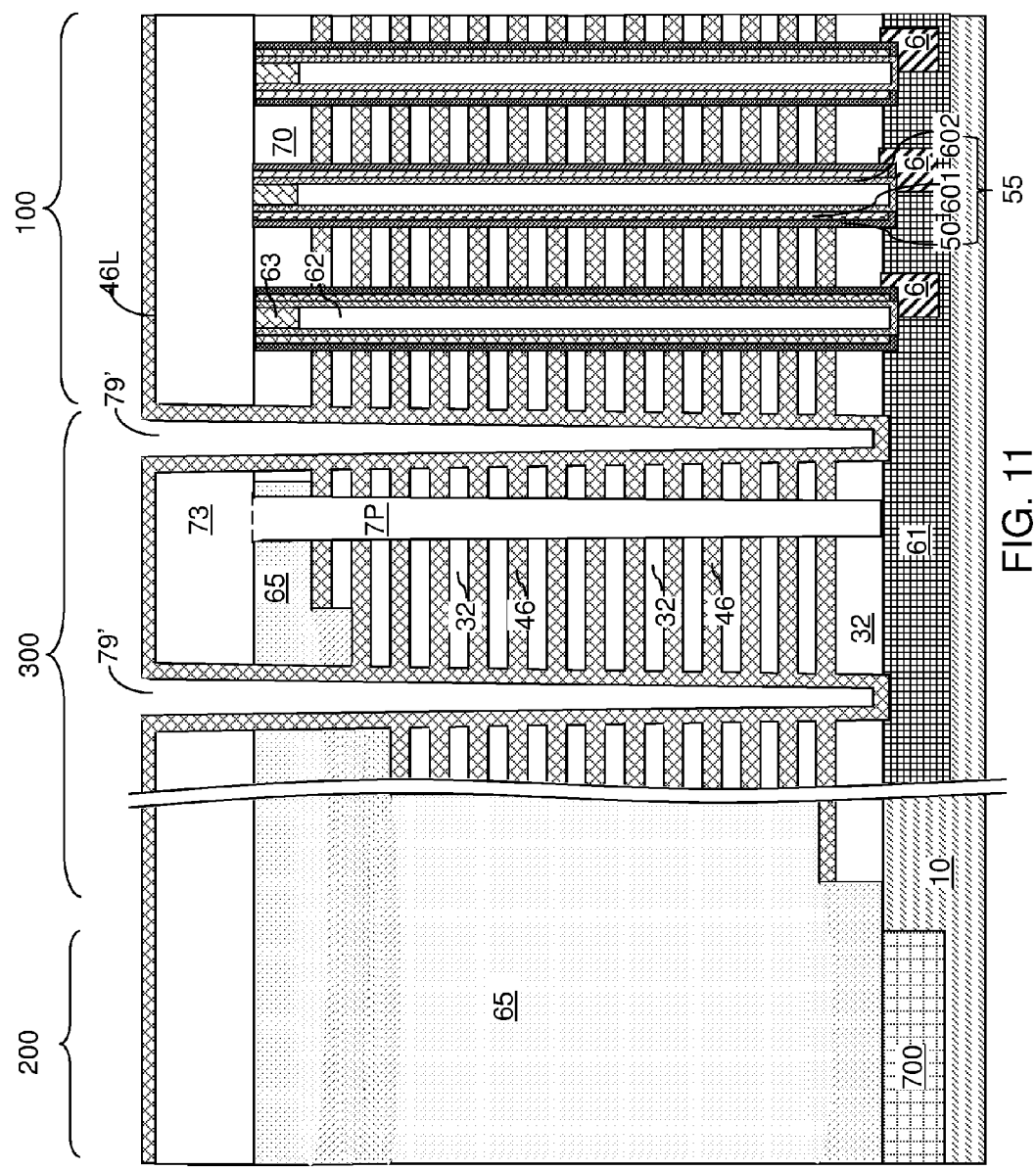
FIG. 11 is a vertical cross-sectional view of the first exemplary structure after deposition of a conductive material in the backside recesses and the backside trenches according to the first embodiment of the present disclosure.

Referring to FIG. 11, a backside blocking dielectric layer (not shown) can be optionally formed. The backside blocking dielectric layer, if present, comprises a dielectric material that functions as a control gate dielectric for the control gates to be subsequently formed in the backside recesses 43. In case the blocking dielectric layer 52 is present within each memory opening, the backside blocking dielectric layer is optional. In case the blocking dielectric layer 52 is omitted, the backside blocking dielectric layer is present.

At least one metallic material can be deposited in the unfilled volumes of the backside recesses 43, over the sidewalls of the at least one the backside trench 79, and over the top surface of the contact level dielectric layer 73. As used herein, a metallic material refers to an electrically conductive material that includes at least one metallic element. The metallic material can be deposited by a conformal deposition method, which can be, for example, chemical vapor deposition (CVD), atomic layer deposition (ALD), electroless plating, electroplating, or a combination thereof. The metallic material can be an elemental metal, an intermetallic alloy of at least two elemental metals, a conductive nitride of at least one elemental metal, a conductive metal oxide, a conductive doped semiconductor material, a conductive metal-semiconductor alloy such as a metal silicide, alloys thereof, and combinations or stacks thereof. Non-limiting exemplary metallic materials that can be deposited in the plurality of backside recesses 43 include tungsten, tungsten nitride, titanium, titanium nitride, tantalum, tantalum nitride, cobalt, and ruthenium.

In one embodiment, the at least one metallic material can include a metallic liner material including a conductive metal nitride (such as TiN, TaN, or WN) and a metallic fill material including an elemental metal (such as W, Co, Cu, or Al) or an intermetallic alloy of at least two elemental metals. In this case, a metallic liner consisting essentially of the metallic liner material and a metal fill material layer consisting essentially of at least one metal can be sequentially deposited in the backside recesses 43, and over the sidewalls of the backside trenches 79 and the topmost insulating layer 32. In one embodiment, the metallic liner can include titanium nitride, and the metal fill material layer can include tungsten. In one embodiment, the metallic materials can be deposited by chemical vapor deposition or atomic layer deposition.

A plurality of electrically conductive layers 46 can be formed in the plurality of backside recesses 43, and a continuous metallic material layer 46L can be formed on the sidewalls of each backside trench 79 and over the contact level dielectric layer 73. Each of the electrically conductive layers 46 and the continuous metallic material layer 46L can include respective portions of the metallic liner and the metallic fill material layer. Thus, each sacrificial material layer 42 can be replaced with an electrically conductive layer 46. A backside cavity 79' is present in the portion of each backside trench 79 that is not filled with the continuous metallic material layer 46L.

Figure 12:
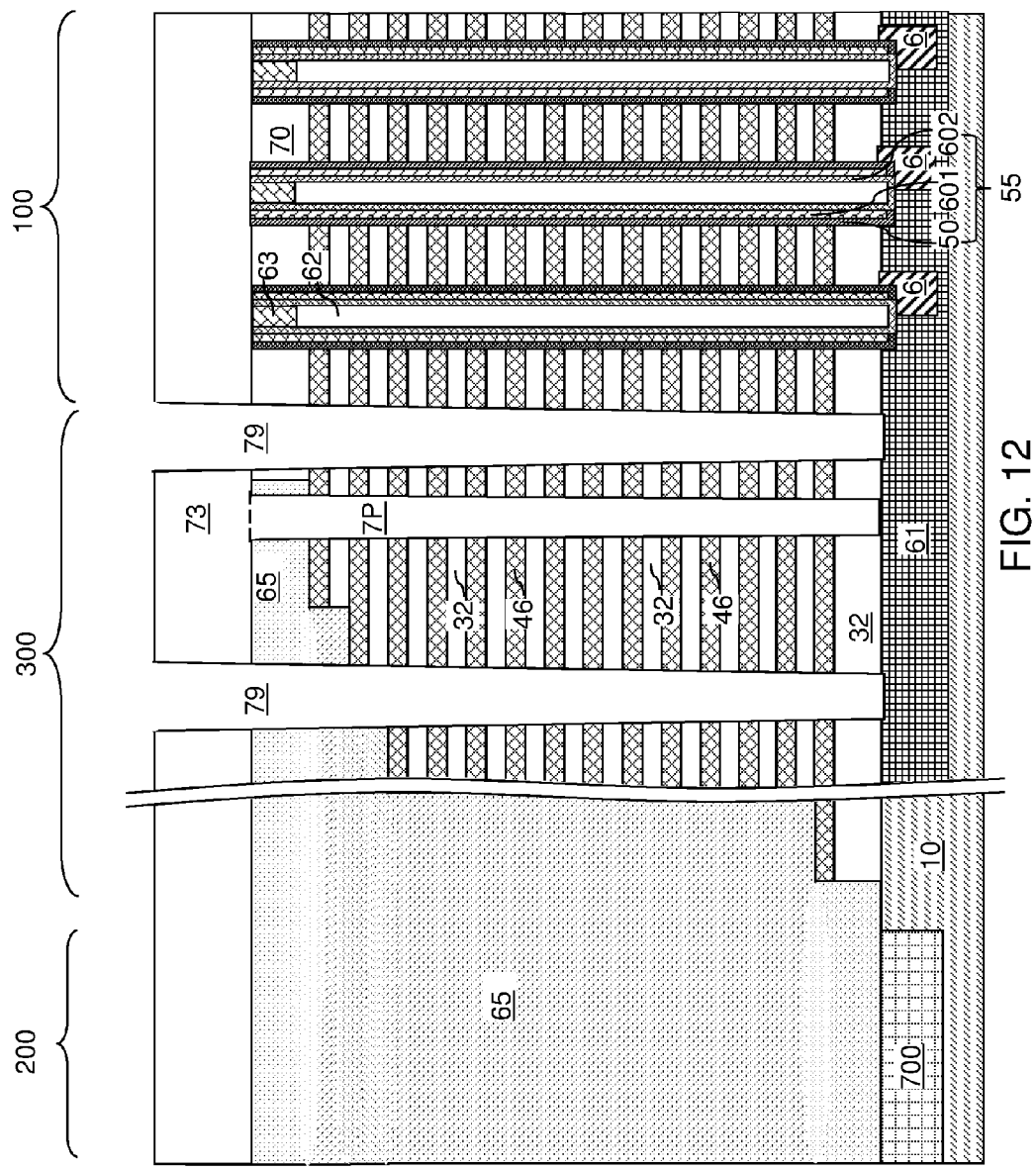
FIG. 12 is a vertical cross-sectional view of the first exemplary structure after removal of the conductive material from the backside trenches according to the first embodiment of the present disclosure.

Referring to FIG. 12, the deposited metallic materials of the continuous electrically conductive material layer 46L is etched back from the sidewalls of each backside trench 79 and from above the contact level dielectric layer 73, for example, by an anisotropic or isotropic etch. Each remaining portion of the deposited metallic material in the backside recesses 43 constitutes an electrically conductive layer 46. Each electrically conductive layer 46 can be a conductive line structure. Thus, the sacrificial material layers 42 are replaced with the electrically conductive layers 46.

Each electrically conductive layer 46 can function as a combination of a plurality of control gate electrodes located at a same level and a word line electrically interconnecting, i.e., electrically shorting, the plurality of control gate electrodes located at the same level. The plurality of control gate electrodes within each electrically conductive layer 46 are the control gate electrodes for the vertical memory devices including the memory stack structures 55. In other words, each electrically conductive layer 46 can be a word line that functions as a common control gate electrode for the plurality of vertical memory devices.

Figure 13:
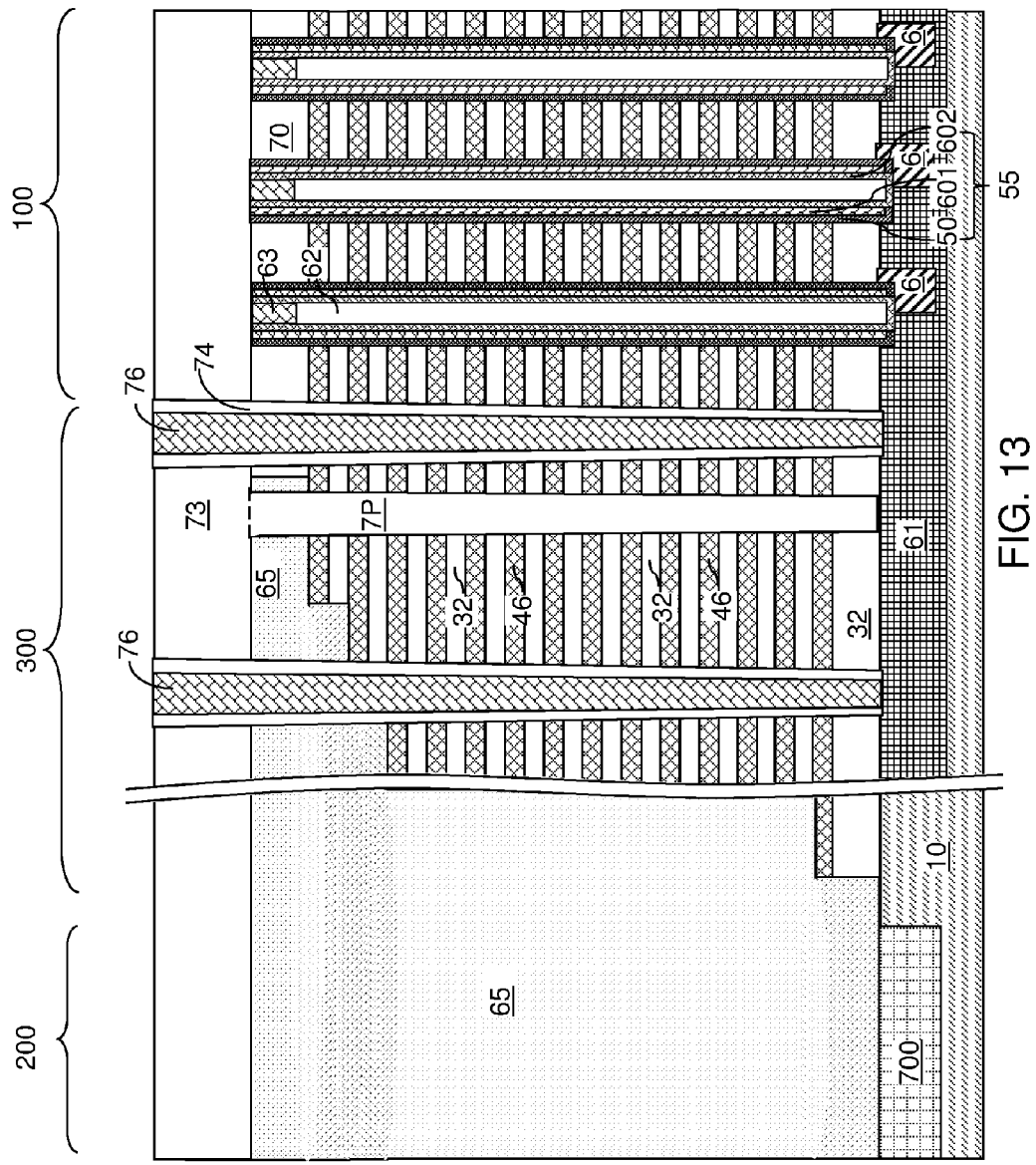
FIG. 13 is a vertical cross-sectional view of the first exemplary structure after formation of insulating spacers and backside contact via structures according to the first embodiment of the present disclosure.

Referring to FIG. 13, an insulating spacer 74 can be formed by deposition of a conformal insulating material layer and an anisotropic etch that removes horizontal portions of the conformal insulating material layer. The insulating spacer 74 includes a dielectric material such as silicon oxide, silicon nitride, and/or a dielectric metal oxide.

A backside contact via structure 76 can be formed within each cavity 79'. Each backside contact via structure 76 can fill a respective cavity 79'. Each backside contact via structure 76 can be formed inside an insulating spacer 74 located within a respective backside trench 79. The backside contact via structures 76 can be formed by depositing at least one conductive material in each remaining unfilled volume (i.e., the cavities 79') of the backside trenches 79. For example, a conductive liner and a conductive fill material can be sequentially deposited as the at least one conductive material. The conductive liner can include a conductive metallic liner such as TiN, TaN, WN, TiC, TaC, WC, an alloy thereof, or a stack thereof. The thickness of the conductive liner can be in a range from 3 nm to 30 nm, although lesser and greater thicknesses can also be employed. The conductive fill material can include a metal or a metallic alloy. For example, the conductive fill material can include W, Cu, Al, Co, Ru, Ni, an alloy thereof, or a stack thereof. Alternatively, the backside contact via structures 76 may comprise a doped semiconductor material (such as doped polysilicon) and a metal, such as W. In an alternative embodiment, some or all of the backside trenches 79 can be completely filled with an insulating material. In that case, the contact via structures 76 to the source 61 can be located in only some of the backside trenches 79 or the contact via structures 76 can be located in a peripheral region rather than in the backside trenches 76.

The at least one conductive material can be planarized, for example, by chemical mechanical planarization (CMP). Each remaining continuous portion of the at least one conductive material in the backside trenches 79 constitutes a backside contact via structure 76. Each backside contact via structure 76 can be formed directly on a top surface of the buried source semiconductor layer 61 and a respective insulating spacer 74.

Figure 14A:
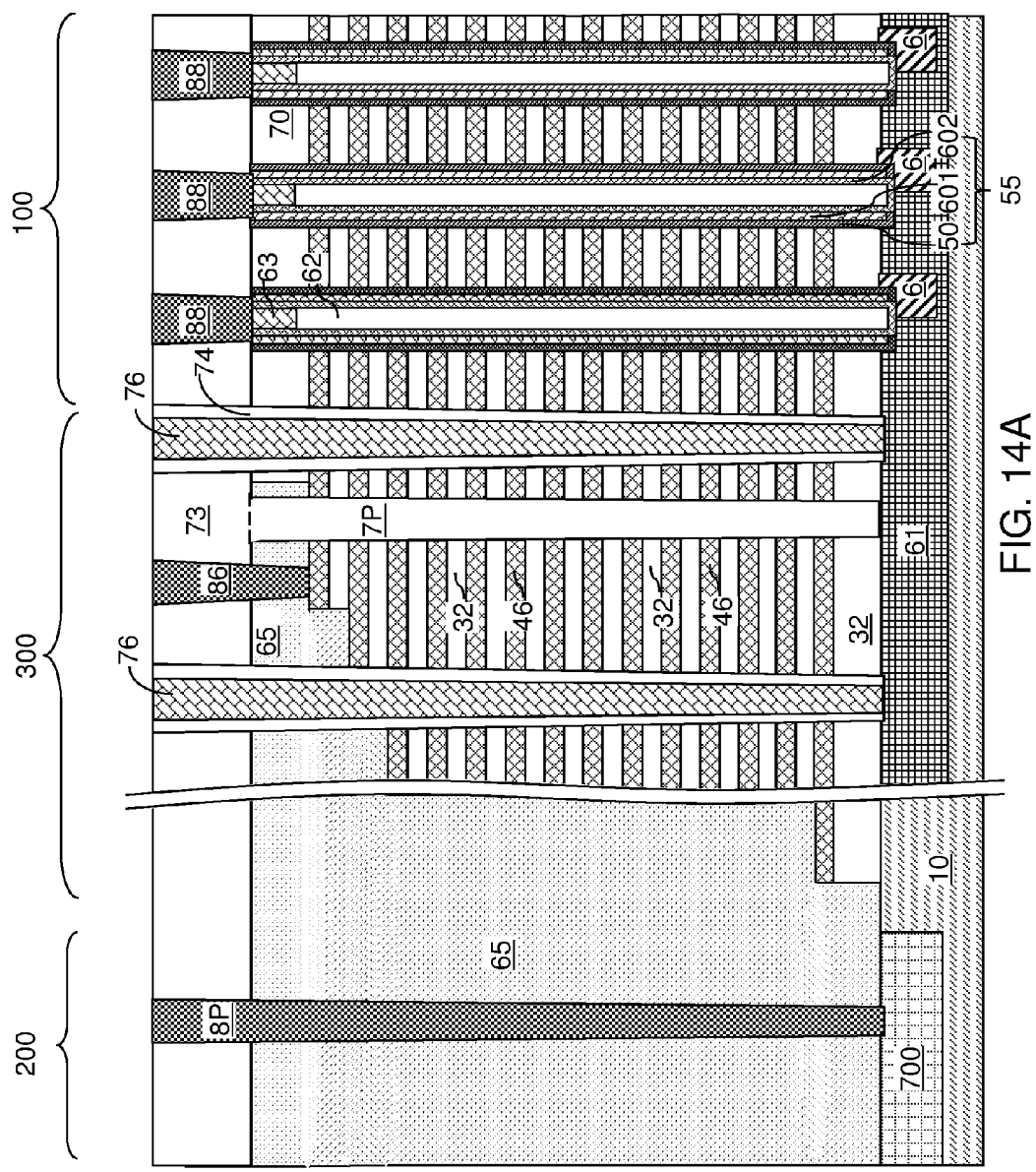
FIG. 14A is a vertical cross-sectional view of the first exemplary structure after formation of various additional contact via structures according to the first embodiment of the present disclosure.
Figure 14B:
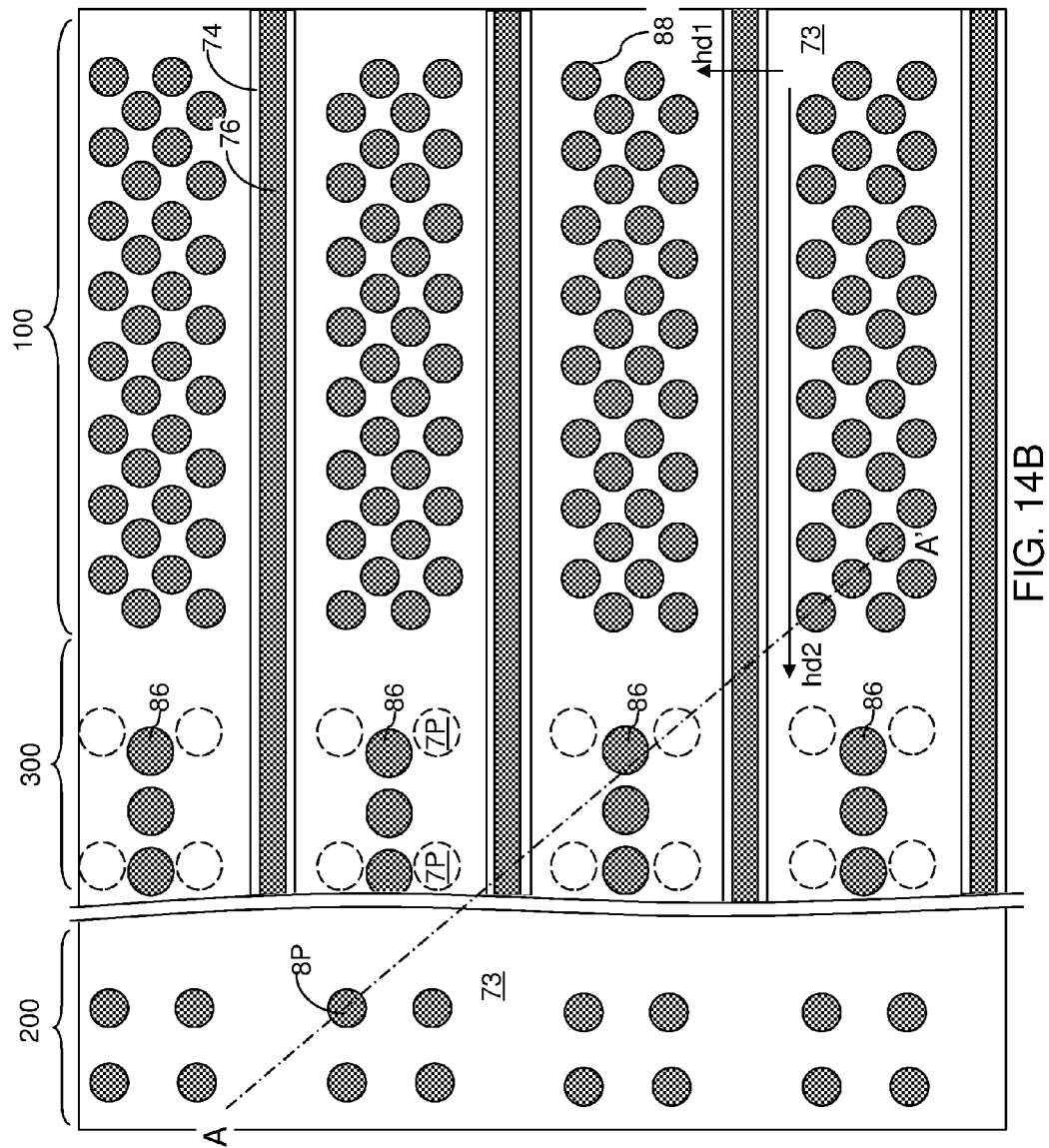
FIG. 14B is a top-down view of the first exemplary structure of FIG. 14A. The vertical plane A-A' is the plane of the vertical cross-sectional view of FIG. 14A.

Referring to FIGS. 14A and 14B, additional contact via structures (88, 86, 8P) can be formed through the contact level dielectric layer 73, and optionally through the retro-stepped dielectric material portion 65. For example, drain contact via structures 88 can be formed through the contact level dielectric layer 73 on each drain region 63. Word line contact via structures 86 can be formed on the electrically conductive layers 46 through the contact level dielectric layer 73 and through the retro-stepped dielectric material portion 65. Device contact via structures 8P can be formed through the retro-stepped dielectric material portion 65 directly on respective nodes of the semiconductor devices 700, which can be peripheral devices for the memory array within the memory array region 100. A line level dielectric layer (not shown) can be formed over the contact level dielectric layer 73. Bit lines (not shown) in electrical contact with the drain contact via structures 88 can be formed in the line level dielectric layer. Additional line level interconnect structures can be formed in the line level dielectric layer to electrically connect the word line contact via structures 86 with the device contact via structures 8P. As used herein, two elements are electrically connected to each other if there exists an electrically conductive path between the two elements.

The buried source semiconductor layer 61 is a "buried" structure, which is located underneath the alternating stack (32, 42) of insulating layers 32 and electrically conductive layers 46, and within an upper portion of a substrate (9, 10). In one embodiment of the first exemplary structure, the buried source semiconductor layer 61 and the p-doped semiconductor material portions 6 can comprise a polycrystalline semiconductor material, such as polysilicon. In another embodiment of the first exemplary structure, the buried source semiconductor layer 61 can include a single crystalline semiconductor material, and the p-doped semiconductor material portions 6 can be single crystalline and epitaxially aligned to the single crystalline semiconductor material of the buried source semiconductor layer 61. P-n junctions are located between the buried source semiconductor layer 61 and each of the p-doped semiconductor material portions 6. In one embodiment, the substrate (9, 10) includes a first portion that comprises the semiconductor material layer 10, and the buried source semiconductor layer 61 can be a second portion of the substrate (9, 10) that overlies the first portion of the substrate (9, 10). In one embodiment, the first portion of the substrate (9, 10) can have a p-type doping.

Figure 2:
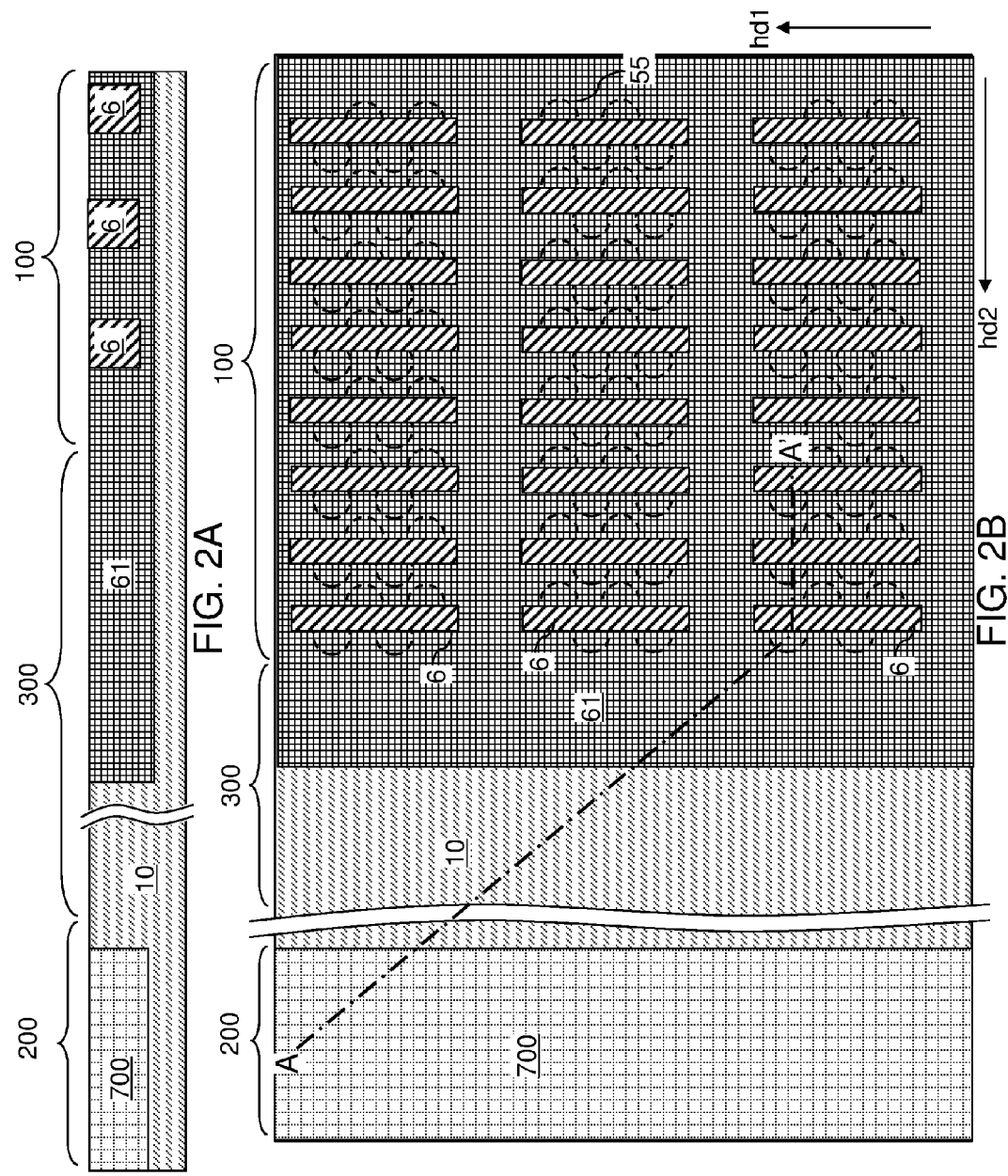
FIG. 2A is a vertical cross-sectional view of the first exemplary structure after formation of a combination of a buried source semiconductor layer and p-doped semiconductor material portions according to the first embodiment of the present disclosure.
FIG. 2B is a top-down view of the first exemplary structure of FIG. 2A. The plane A-A' is the plane of the cross-sectional view of FIG. 2A.
Figure 15:
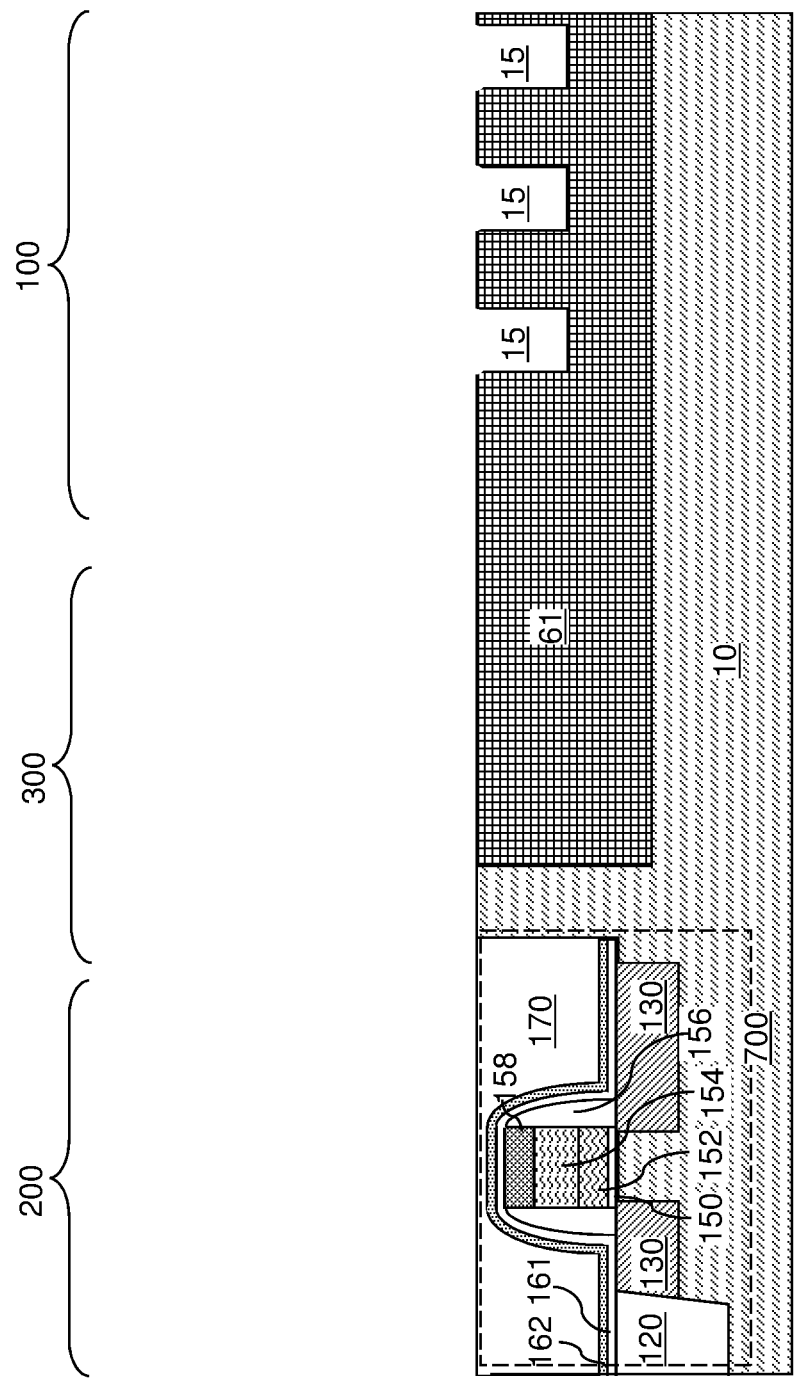
FIG. 15 is a vertical cross-sectional view of a second exemplary structure after formation of a plurality of recesses within the buried source semiconductor layer according to a second embodiment of the present disclosure.

Referring to FIG. 15, a second exemplary structure according to a second embodiment of the present disclosure can be derived from the first exemplary structure of FIG. 1 by forming a buried source semiconductor layer 61 employing the processing steps of FIG. 2. Isolated recesses 15 can be formed within the buried source semiconductor layer 61, for example, by applying and patterning a photoresist layer over the substrate (9, 10) (which includes the semiconductor material layer 10 and the buried source semiconductor layer 61) to form openings in the portion of the photoresist layer in the memory array region 100, and by transferring the pattern of the openings into an upper portion of the buried source semiconductor layer 61. The pattern of the openings in the photoresist layer can be the same as the pattern of the p-doped semiconductor material portions 6 as illustrated in FIG. 2B.

An isotropic etch and/or an anisotropic etch can be employed to etch physically exposed portions of the buried source semiconductor layer 61. In one embodiment, an anisotropic etch can be performed to form the recesses 15 in the upper portion of the buried source semiconductor layer 61. In this case, the sidewalls of the recesses 15 may be substantially vertical. In one embodiment, the recesses 15 may have rectangular horizontal cross-sectional shapes. Alternately, the recesses 15 may have elliptical or circular horizontal cross-sectional shapes. A plurality of recesses 15 can be formed within the buried source semiconductor layer 61. Each recess 15 is a cavity, and can have a recessed top surface that is vertically recessed with respect to the top surface of the buried source semiconductor layer 61. The photoresist layer can be subsequently removed, for example, by ashing.

Referring to FIGS. 16A and 16B, a dielectric liner 16 can be formed within each recess 15. The dielectric liner 16 includes a diffusion barrier material such as silicon nitride and/or a dielectric metal oxide. A conformal dielectric material layer including the diffusion barrier material can be deposited in the recesses 15 employing a conformal deposition method such as chemical vapor deposition (CVD) or atomic layer deposition (ALD). The thickness of the conformal dielectric material layer can be in a range from 2 nm to 6 nm, although lesser and greater thicknesses can also be employed.

A p-doped semiconductor material can be deposited in the unfilled volumes of the recesses 15 and over the top surface of the horizontal portion of the conformal dielectric material layer overlying the topmost surface of the buried source semiconductor layer 61. In one embodiment, the average dopant concentration of the p-type dopants in the p-doped semiconductor material can be in a range from $1.0 \times 10^{19}/cm^3$ to $1.0 \times 10^{21}/cm^3$, although lesser and greater average dopant concentrations can also be employed. The p-doped semiconductor material can be amorphous or polycrystalline as deposited. In case the p-doped semiconductor material is amorphous, a crystallization anneal process can be subsequently performed to convert the p-doped amorphous semiconductor material into a p-doped polycrystalline semiconductor material. In one embodiment, the p-doped semiconductor material can include silicon, a silicon-germanium alloy, a silicon-carbon alloy, a silicon-germanium-carbon alloy, a compound semiconductor material, or a combination thereof. The thickness of the deposited p-doped semiconductor material can be selected such that the entire volume of each recess 15 is filled with the deposited p-doped semiconductor material.

Subsequently, at least one planarization process can be performed to remove horizontal portions of the deposited p-doped semiconductor material and the conformal dielectric material layer from above the horizontal plane including the topmost surface of the buried source semiconductor layer 61. A recess etch and/or a chemical mechanical planarization process may be employed to remove the portions of the deposited p-doped semiconductor material and the conformal dielectric material layer from outside the volumes of the recesses 15 in the memory array region 100. Each remaining portion of the conformal dielectric material layer within the recesses 15 constitutes a dielectric liner 16. Each remaining portion of the deposited p-doped semiconductor material within the recesses 15 constitutes a p-doped semiconductor material portion 6'. The top surfaces of the dielectric liners 16 and the p-doped semiconductor material portions 6' can be coplanar with the topmost surface of the buried source semiconductor layer 61. Each p-doped semiconductor material portions 6' can be laterally and vertically spaced from the buried source semiconductor layer 61 by a respective dielectric liner 16.

A combination of a buried source semiconductor layer 61 and p-doped semiconductor material portions 6' is formed over a first portion of a substrate (i.e., over the remaining portion of the semiconductor material layer 10). The buried source semiconductor layer 61 includes an n-doped semiconductor material, and the p-doped semiconductor material portions 6' are embedded within the buried source semiconductor layer 61. The p-doped semiconductor material portions 6' are laterally spaced from one another by the buried source semiconductor layer 61 and the dielectric liners 16.

Figure 17:
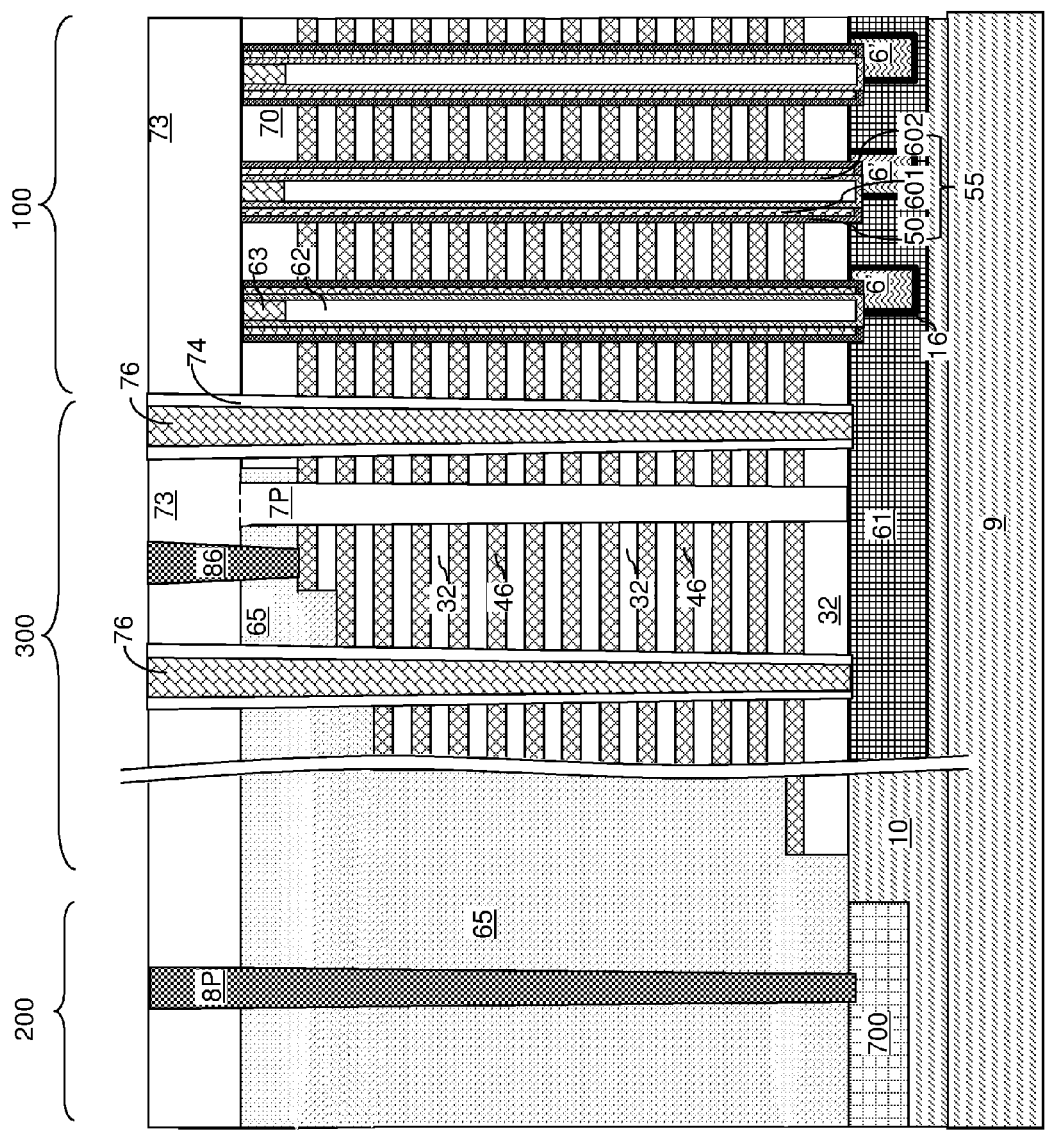
FIG. 17 is a vertical cross-sectional view of the second exemplary structure after formation of various additional contact via structures according to the second embodiment of the present disclosure.

Referring to FIG. 17, the processing steps of FIGS. 3-5, 6A-6H, 7, 8, 9A-9B, 10-13, 14A, and 14B can be performed. The second exemplary structure of FIG. 17 can differ from the first exemplary structure of FIGS. 14A and 14B, among others, in that the p-doped semiconductor material portions 6' of the second embodiment are polycrystalline, while the p-doped semiconductor material portions 6 of the first embodiment can be single crystalline. Further, the p-doped semiconductor material portions 6' is laterally spaced from the buried source semiconductor layer 61 by the dielectric liners 16 in the second exemplary structure, while a p-n junction is present between each p-doped semiconductor material portion 6 and the buried source semiconductor layer 61 in the first embodiment. Each vertical semiconductor channel 60 contacts a top surface of the buried source semiconductor layer 61, a top surface of a respective p-doped semiconductor material portion 6', and a top surface of a dielectric liner 16.

Figure 18:
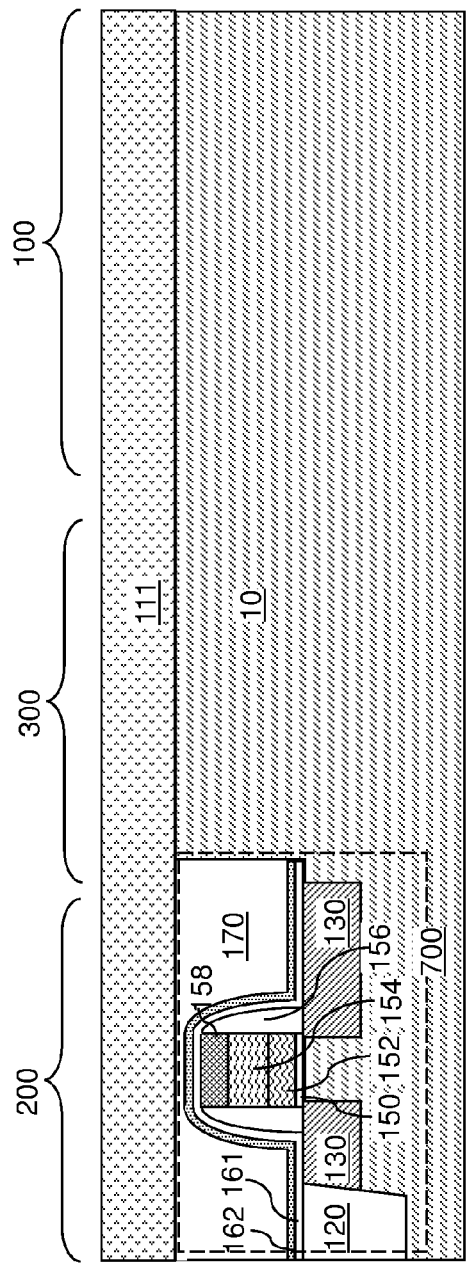
FIG. 18 is a vertical cross-sectional view of a third exemplary structure after formation of at least one peripheral device and a sacrificial film according to a third embodiment of the present disclosure.

Referring to FIG. 18, a third exemplary structure according to a third embodiment of the present disclosure is illustrated. In this third embodiment, the buried source semiconductor layer can contact the side and the bottom of the semiconductor channel 60, rather than just the bottom of the semiconductor channel 60. The third exemplary structure can be derived from the first exemplary structure by forming a sacrificial film 111 over the top surface of the semiconductor material layer 10. The sacrificial film 111 includes a sacrificial material that is removed in a subsequent processing step. The sacrificial material can be any material that can be removed selective to the materials of the semiconductor material layer 10, the planarization dielectric layer 170, and an alternating stack of insulating layers and sacrificial material layers to be subsequently formed. The sacrificial material of the sacrificial film 114 can be, for example, a semiconductor material such as undoped (i.e., intrinsic) polysilicon undoped amorphous silicon, germanium, a silicon-germanium alloy, a compound semiconductor material, or an organic semiconductor material that is different in composition from the semiconductor material layer 10. Alternatively, the sacrificial material of the sacrificial film 111 can include a dielectric material such as organosilicate glass, amorphous carbon, diamond-like carbon (DLC), a silicon-based polymer, or porous derivatives thereof. The thickness of the sacrificial film 111 can be in a range from 30 nm to 600 nm, although lesser and greater thicknesses can also be employed.

Figure 19:
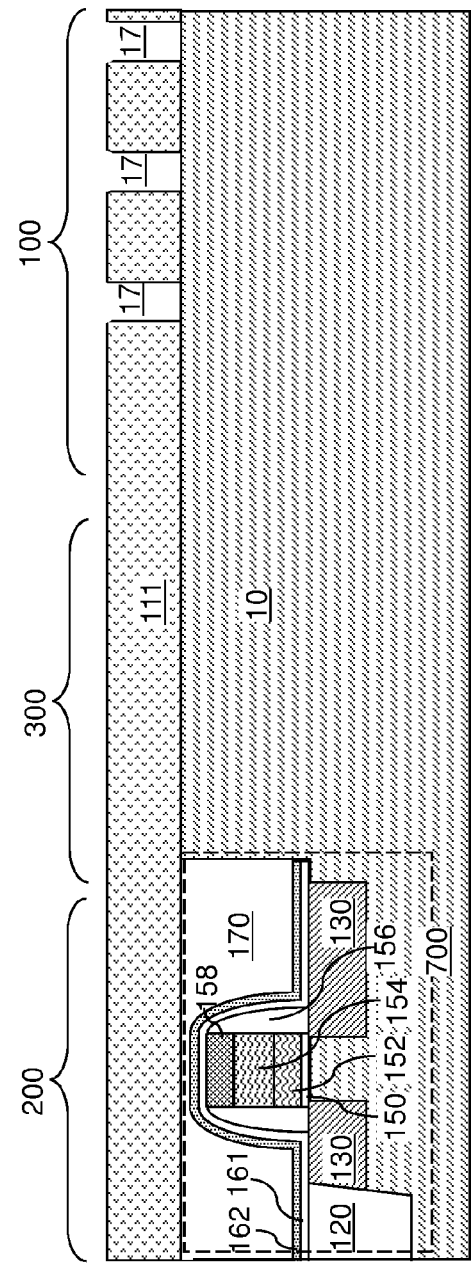
FIG. 19 is a vertical cross-sectional view of a third exemplary structure after formation of a plurality of recesses in the sacrificial film according to the third embodiment of the present disclosure.

Referring to FIG. 19, isolated recesses 17 can be formed within the sacrificial film 111, for example, by applying and patterning a photoresist layer over the sacrificial film 111 to form openings in the portion of the photoresist layer in the memory array region 100, and by transferring the pattern of the openings into the sacrificial material layer 111. The pattern of the openings in the photoresist layer can be the same as the pattern of the p-doped semiconductor material portions 6 as illustrated in FIG. 2B.

An isotropic etch and/or an anisotropic etch can be employed to etch physically exposed portions of the sacrificial film 111. In one embodiment, an anisotropic etch can be performed to form the recesses 17 in the upper portion of the sacrificial film 111. In this case, the sidewalls of the recesses 17 may be substantially vertical. In one embodiment, the recesses 17 may have rectangular horizontal cross-sectional shapes. Alternately, the recesses 17 may have elliptical or circular horizontal cross-sectional shapes. A plurality of recesses 17 can be formed within the sacrificial film 111. Each recess 17 is a cavity, and can have a recessed top surface that is vertically recessed with respect to the top surface of the sacrificial film 111. The photoresist layer can be subsequently removed, for example, by ashing.

Figure 20:
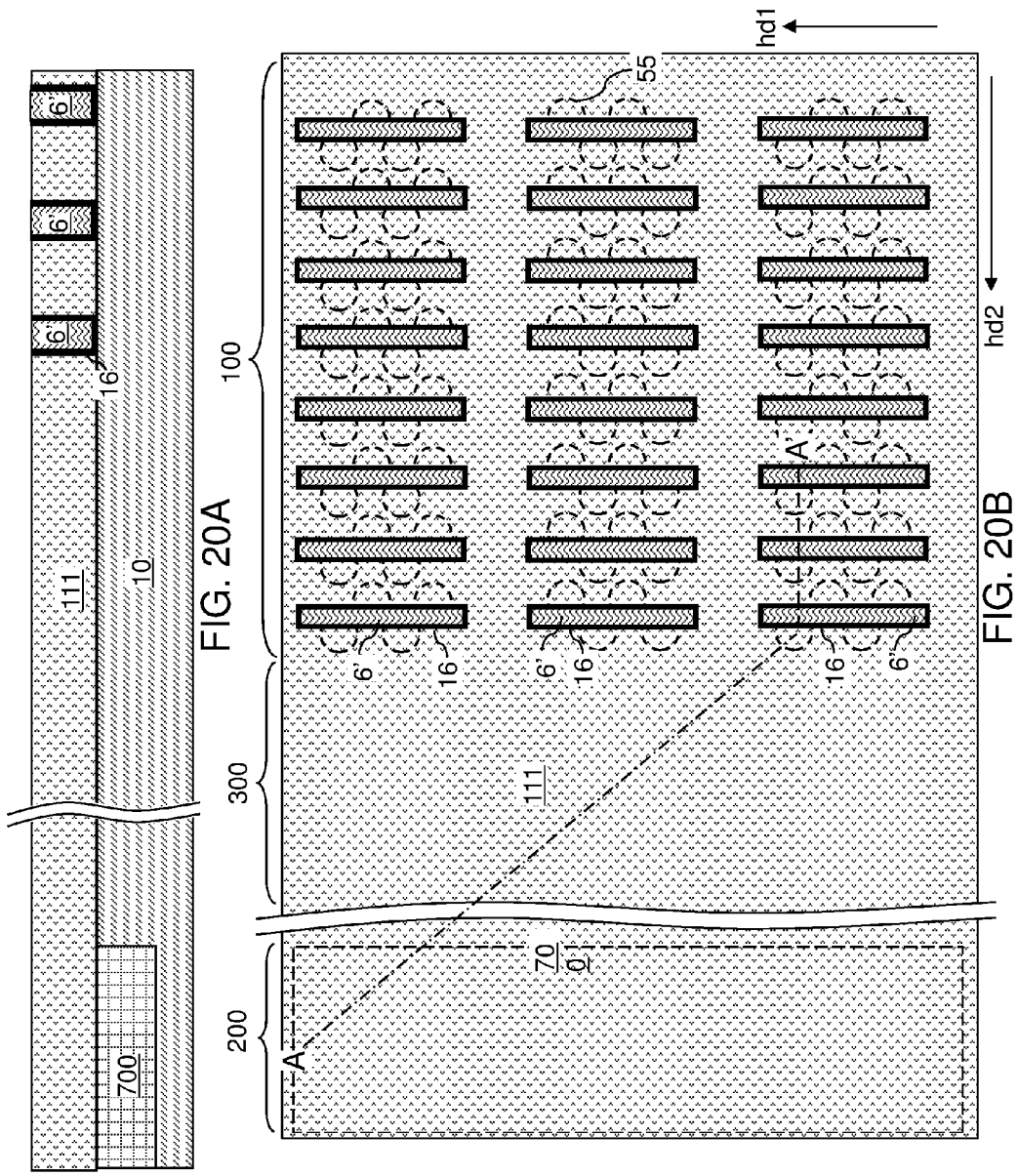
FIG. 20A is a vertical cross-sectional view of the third exemplary structure after formation of dielectric liners and p-doped semiconductor material portions according to the third embodiment of the present disclosure.
FIG. 20B is a top-down view of the third exemplary structure of FIG. 20A. The plane A-A' is the plane of the cross-sectional view of FIG. 20A.

Referring to FIGS. 20A and 20B, a dielectric liner 16 can be formed within each recess 17. The dielectric liner 16 includes a diffusion barrier material such as silicon nitride and/or a dielectric metal oxide. A conformal dielectric material layer including the diffusion barrier material can be deposited in the recesses 17 employing a conformal deposition method such as chemical vapor deposition (CVD) or atomic layer deposition (ALD). The thickness of the conformal dielectric material layer can be in a range from 2 nm to 6 nm, although lesser and greater thicknesses can also be employed.

A p-doped semiconductor material can be deposited in the unfilled volumes of the recesses 17 and over the top surface of the horizontal portion of the conformal dielectric material layer overlying the topmost surface of the sacrificial film 111. In one embodiment, the average dopant concentration of the p-type dopants in the p-doped semiconductor material can be in a range from $1.0\times10^{19}/cm^3$ to $1.0\times10^{21}/cm^3$, although lesser and greater average dopant concentrations can also be employed. The p-doped semiconductor material can be amorphous or polycrystalline as deposited. In case the p-doped semiconductor material is amorphous, a crystallization anneal process can be subsequently performed to convert the p-doped amorphous semiconductor material into a p-doped polycrystalline semiconductor material. In one embodiment, the p-doped semiconductor material can include silicon, a silicon-germanium alloy, a silicon-carbon alloy, a silicon-germanium-carbon alloy, a compound semiconductor material, or a combination thereof. The thickness of the deposited p-doped semiconductor material can be selected such that the entire volume of each recess 17 is filled with the deposited p-doped semiconductor material.

Subsequently, at least one planarization process can be performed to remove horizontal portions of the deposited p-doped semiconductor material and the conformal dielectric material layer from above the horizontal plane including the topmost surface of the sacrificial film 111. A recess etch and/or a chemical mechanical planarization process may be employed to remove the portions of the deposited p-doped semiconductor material and the conformal dielectric material layer from outside the volumes of the recesses 17 in the memory array region 100. Each remaining portion of the conformal dielectric material layer within the recesses 17 constitutes a dielectric liner 16. Each remaining portion of the deposited p-doped semiconductor material within the recesses 17 constitutes a p-doped semiconductor material portion 6'. The top surfaces of the dielectric liners 16 and the p-doped semiconductor material portions 6' can be coplanar with the topmost surface of the sacrificial film 111. Each p-doped semiconductor material portions 6' can be laterally and vertically spaced from the sacrificial film 111 by a respective dielectric liner 16.

A combination of a sacrificial film 111 and p-doped semiconductor material portions 6' is formed over a first portion of a substrate (i.e., over the remaining portion of the semiconductor material layer 10). The p-doped semiconductor material portions 6' are laterally spaced from one another by the sacrificial film 111 and the dielectric liners 16.

Figure 21:
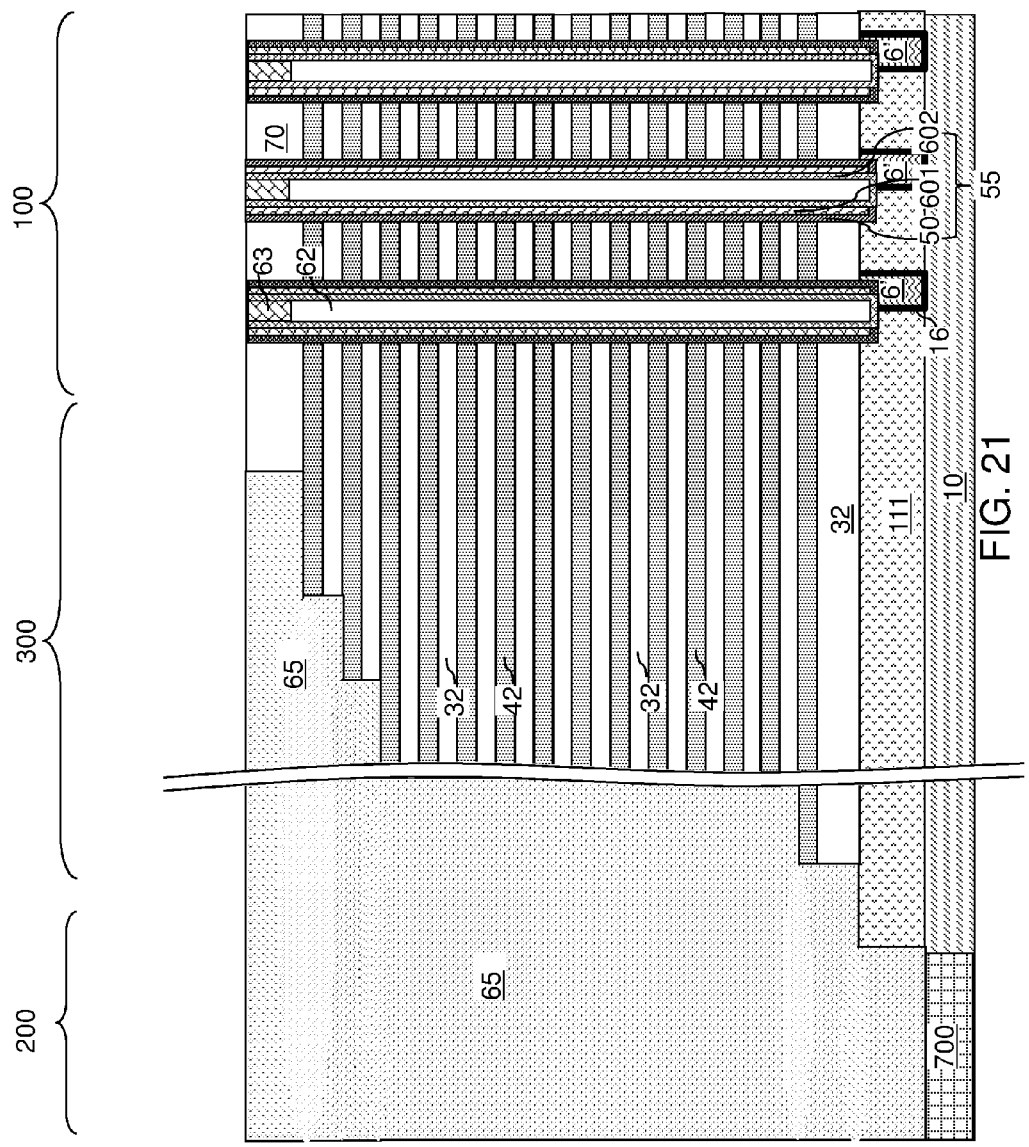
FIG. 21 is a vertical cross-sectional view of the third exemplary structure after formation of an alternating stack of insulating layers and sacrificial material layers, a terrace region, and a retro-stepped dielectric material portion according to the third embodiment of the present disclosure.

Referring to FIG. 21, the processing steps of FIGS. 3-5 and 6A-6H can be performed to form memory stack structures 55, optional dielectric cores 62, and drain regions 63 contacting a top end of a respective vertical semiconductor channel 60. Each vertical semiconductor channel 60 contacts a top surface of the sacrificial film 111, a top surface of a respective p-doped semiconductor material portion 6', and a top surface of a respective dielectric liner 16.

Figure 22:
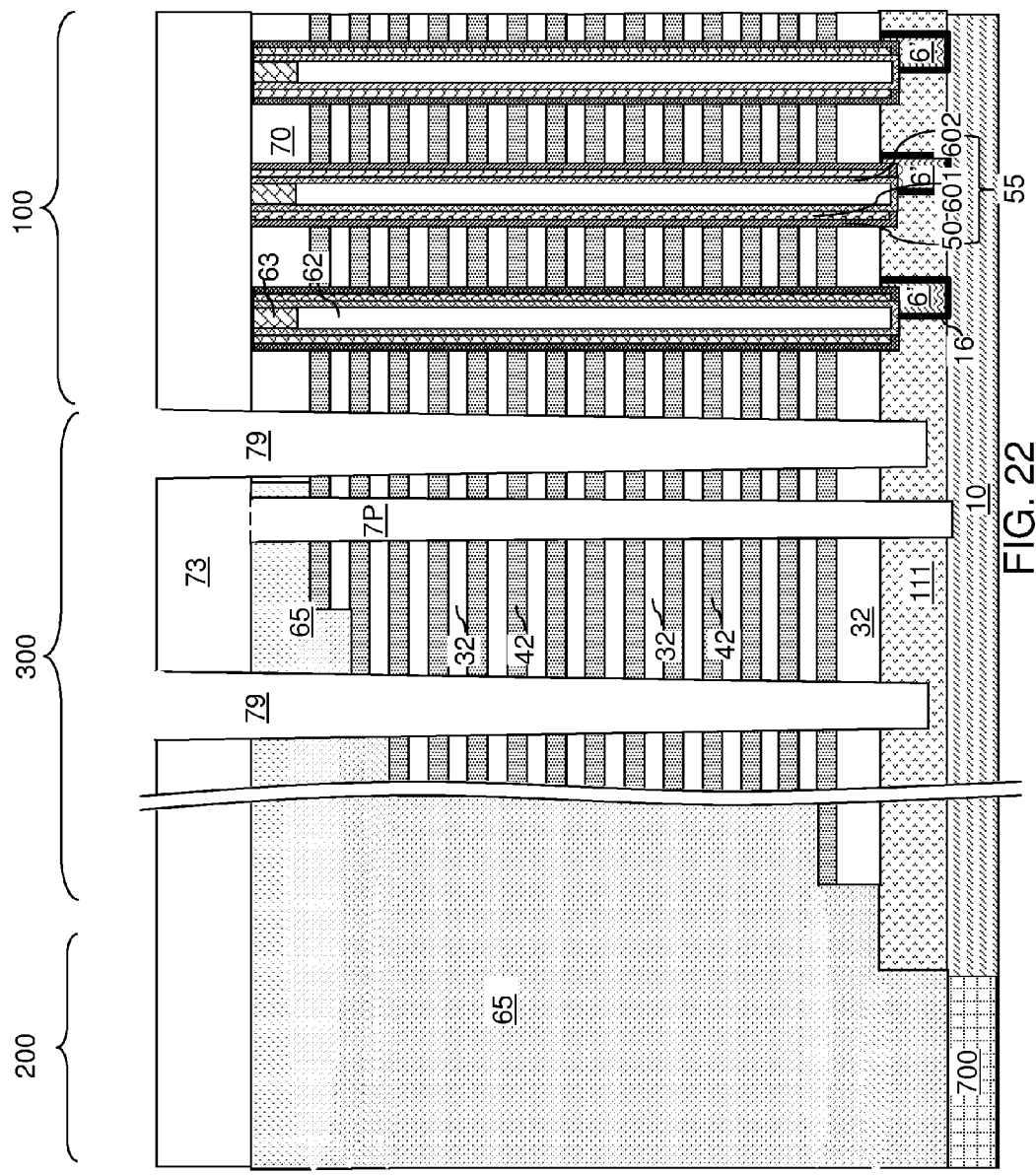
FIG. 22 is a vertical cross-sectional view of the third exemplary structure after formation of memory stack structures, support pillar structures, a contact level dielectric layer, and backside trenches according to the third embodiment of the present disclosure.

Referring to FIG. 22, the processing steps of FIGS. 8, 9A and 9B can be performed to form optional support pillars 7P, an optional contact level dielectric layer, and backside trenches 79 that extend through the contact level dielectric layer 73, the retro-stepped dielectric material portion 65, and the alternating stack (32, 42) of the insulating layers 32 and the sacrificial material layers 42. The support pillar 7P, if present, can extend through the alternating stack (32, 42) and the sacrificial film 111, and to the semiconductor material layer 10. Each backside trench 79 can extend at least to the top surface of the sacrificial film 111, and may extend into the sacrificial film 111. In one embodiment, the sacrificial film 111 can be employed as an etch stop structure during an anisotropic etch that forms the backside trenches 79.

Figure 23:
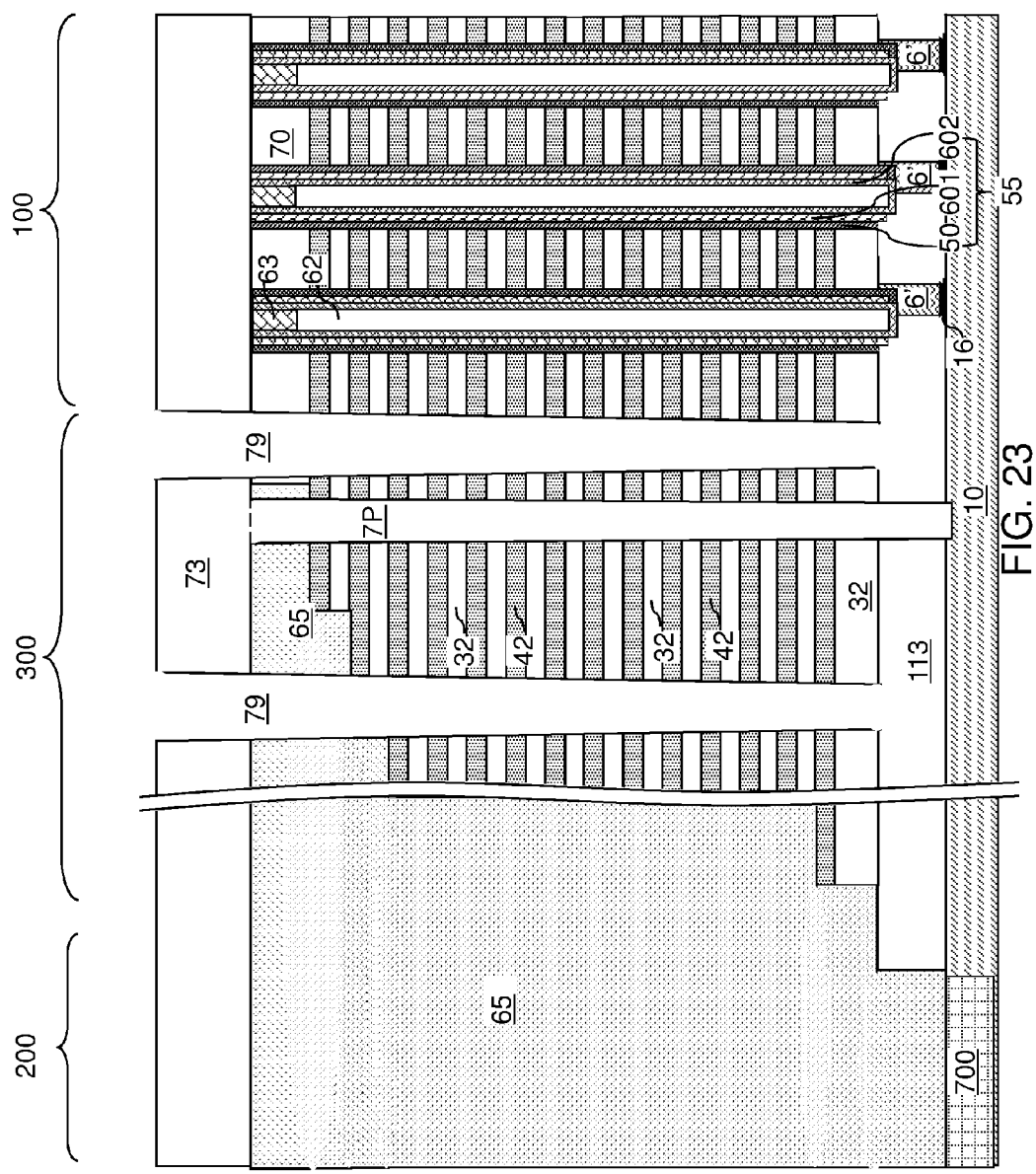
FIG. 23 is a vertical cross-sectional view of the third exemplary structure after formation of a source level cavity according to the third embodiment of the present disclosure.

Referring to FIG. 23, a source level cavity 113 can be formed by removing the sacrificial film 111 selective to the alternating stack (32, 42) and the semiconductor material layer 10. In some embodiment, the source level cavity 113 can be formed by introducing an etchant or a reactant through the backside trench to remove the sacrificial film 111 selective to the alternating stack (32, 42) and to the substrate, i.e., the semiconductor material layer 10.

For example, if the sacrificial material of the sacrificial film 111 includes germanium or a silicon-germanium alloy, the insulating layers 32 include silicon oxide, and the sacrificial material layers 42 include silicon nitride, a wet etch process employing ammonium hydroxide and hydrogen peroxide can be employed to remove the sacrificial film 111 selective to the semiconductor material layer 20 and the alternating stack (32, 42). The etchant can be provided to the semiconductor film 111 through the backside trenches 79. In another example, if the sacrificial material of the sacrificial film 111 includes an intrinsic semiconductor material (such as intrinsic amorphous silicon), an etch process that etches undoped semiconductor material selective the doped semiconductor material of the semiconductor material layer 10 and the materials of the alternating stack (32, 42) may be employed. In another example, if the sacrificial material of the sacrificial film 111 includes amorphous carbon or diamond-like carbon, an ashing process can be employed to remove the sacrificial film 111, while not removing the semiconductor material layer 10 or the alternating stack (32, 42). The reactant (which can be an oxidant such as oxygen or ozone) can be provided to the semiconductor film 111 through the backside trenches 79. In yet another example, the sacrificial material of the sacrificial film 111 includes organosilicate glass or porous organosilicate glass, the sacrificial film 111 can be removed selective to the semiconductor material layer 10 and the alternating stack (32, 42) employing a dilute hydrofluoric acid. The etchant can be provided to the semiconductor film 111 through the backside trenches 79. The memory films 50 can function as etch stop structures during removal of the sacrificial film 111. The source level cavity 113 includes the volume from which the sacrificial film 111 is removed.

Subsequently, the memory film 50 containing the optional blocking dielectric layer 52, the charge storage layer 54 and the tunneling dielectric layer 56 are removed by selective etching to expose a sidewall and bottom of the semiconductor channel 60 in the source level cavity 113. In one embodiment, sidewalls of the dielectric liners 16 may be optionally removed, for example, employing an isotropic etch such as a wet etch. For example, if the dielectric liners 16 include silicon nitride, the sidewalls of the dielectric liners 16 may be removed by a wet etch process employing hot phosphoric acid. Horizontal portions of the dielectric liners 16 between the p-doped semiconductor material portions 6' and the semiconductor material layer 10 can remain after removal of the sidewalls of the dielectric liners 16. A first portion of the bottom and side surfaces of each vertical semiconductor channel 60 are physically exposed to the source level cavity 113, and a second portion of the bottom surface of each vertical semiconductor channel 60 can physically contact a top surface of a respective p-doped semiconductor material portion 6'. The remaining part of the memory film 50 contacts the second portion of the side surface of each vertical semiconductor channel 60 and surfaces of the respective p-doped semiconductor material portion 6'.

Figure 24:
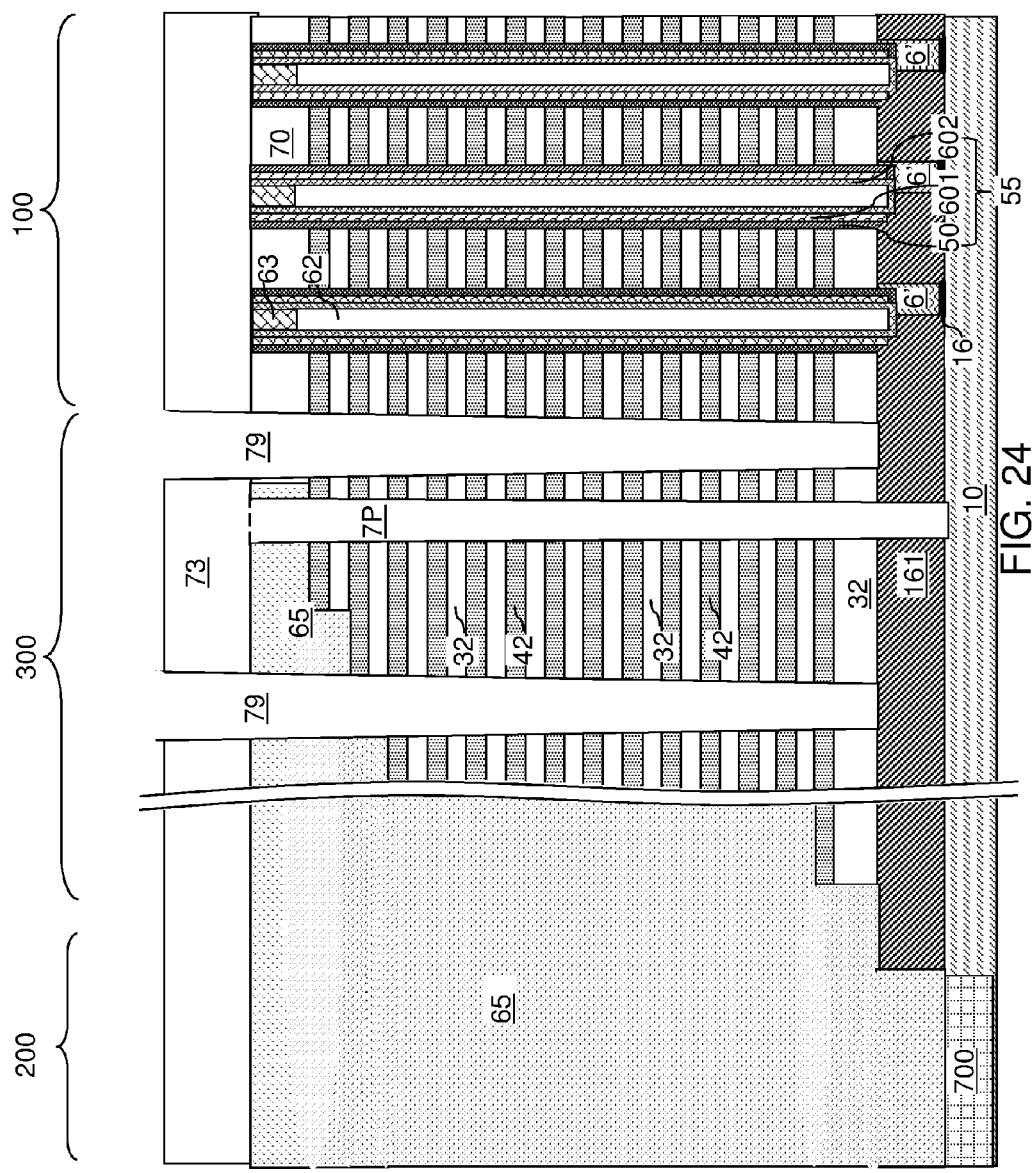
FIG. 24 is a vertical cross-sectional view of the third exemplary structure after formation of a buried source semiconductor layer according to the third embodiment of the present disclosure.

Referring to FIG. 24, a buried source semiconductor layer 161 can be formed by selective deposition of an n-doped semiconductor material in the source level cavity 143 and lower portions of the backside trenches 79. The buried source semiconductor layer 161 includes an n-doped semiconductor material, and functions as a common source region for vertical field effect transistors that include the vertical semiconductor channels 60 as the channel regions. For example, the buried source semiconductor layer 161 can include n-doped silicon (e.g., n-type polysilicon), an n-doped silicon-germanium alloy, or an n-doped compound semiconductor material. In one embodiment, the buried source semiconductor layer 161 is formed as a single continuous material layer extending underneath the entirety of the alternating stack (32 42) and among all backside trenches 79. The average dopant concentration of the n-type dopants in the buried source semiconductor layer 161 can be in a range from $1.0 \times 10^{19}/cm^3$ to $1.0 \times 10^{21}/cm^3$, although lesser and greater average net dopant concentrations can also be employed.

In one embodiment, the sacrificial material layers 42 can include a dielectric material (such as silicon nitride), and the buried source semiconductor layer 161 can be formed by a selective semiconductor deposition process which grows a semiconductor material only from physically exposed semiconductor surfaces, and does not grow the semiconductor material from dielectric surfaces (such as the surfaces of the insulating layers 32 and the sacrificial material layers 42).

In a selective semiconductor deposition process (such as a selective epitaxy process), a reactant including a precursor for a semiconductor material and an etchant can be simultaneously or alternately flowed into a process chamber. Non-limiting examples of the precursor for the selective semiconductor deposition process include silane ($SiH_4$), dichlorosilane ($SiH_2Cl_2$), trichlorosilane ($SiHCl_3$), silicon tetrachloride ($SiCl_4$), disilane ($Si_2H_6$), germane ($GeH_4$), digermane ($Ge_2H_6$), and other organic or inorganic precursors including at least one semiconductor element. An exemplary etchant is hydrogen chloride (HCl) gas. Deposition and/or nucleation of the semiconductor material proceeds at a higher rate on semiconductor surfaces than on dielectric surfaces. The flow rate of the etchant can be controlled during the selective semiconductor deposition process such that the etch rate provided by the etchant can be between the deposition rates on the semiconductor surfaces and the deposition rate on the dielectric surfaces to enable the selective deposition of the n-doped semiconductor material.

In one embodiment, the buried source semiconductor layer 161 can include an n-doped epitaxial semiconductor material that is epitaxially aligned to the single crystalline material of the doped semiconductor well 10D, which is a portion of the semiconductor material layer 10. In this case, the buried source semiconductor layer 161 can be formed by a selective epitaxy process that deposits a doped single crystalline semiconductor material in the source level cavity 143 such that the deposited doped single crystalline semiconductor material is in epitaxial alignment with the single crystalline material in the substrate, i.e., the semiconductor material layer 10.

Alternatively, the buried source semiconductor layer 161 can include an n-doped polycrystalline semiconductor material. The entirety of the source level cavity 143 can be filled with the buried source semiconductor layer 161. The duration of the selective or non-selective semiconductor material deposition process can be selected such that the top surfaces of the buried source semiconductor layer 161 include peripheries that are adjoined to sidewalls of the bottommost insulating layer 32. A backside cavity 79' can be present within each backside trench 79 if it is not filled with the polysilicon of layer 161.

Thus, the sacrificial film 111 can be replaced with the buried source semiconductor layer 161 to form a combination of the buried source semiconductor layer 161 and p-doped semiconductor material portions 6' over a first portion of a substrate (i.e., the semiconductor material layer 10). The buried source semiconductor layer 161 comprises an n-doped semiconductor material, and the p-doped semiconductor material portions 6' are embedded within the buried source semiconductor layer 161. The p-doped semiconductor material portions 6' are laterally spaced from one another by the buried source semiconductor layer 161. The buried source semiconductor layer 161 underlies the alternating stack (32, 42) and overlies the first portion of the substrate, and contacts both side and bottom surfaces of the vertical semiconductor channels 60 exposed in the source level cavity 113 to achieve an increased contact area. The p-doped semiconductor material portions 6' contact one or more bottom surfaces of a respective subset of the vertical semiconductor channels 60.

Figure 25:
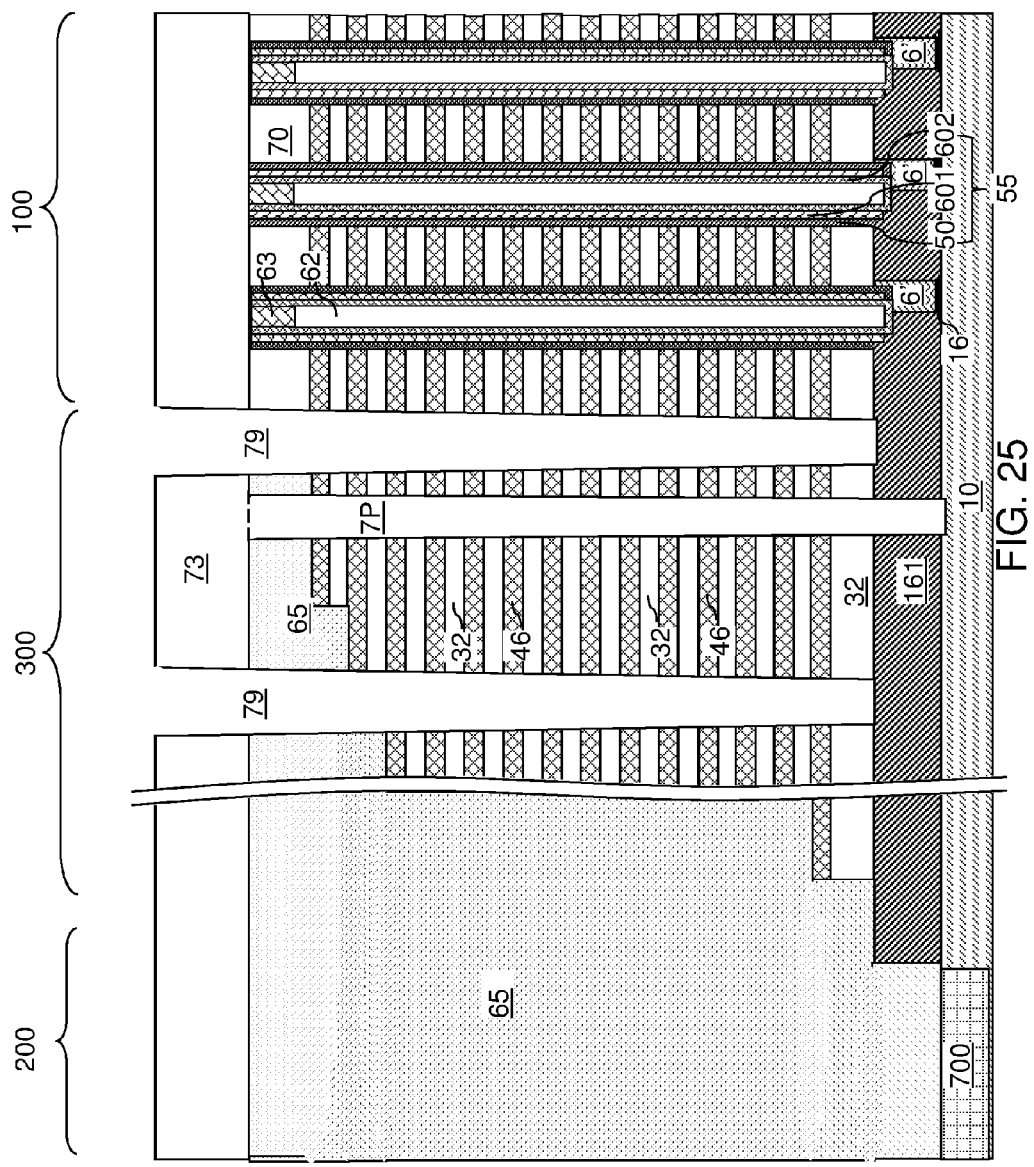
FIG. 25 is a vertical cross-sectional view of the third exemplary structure after replacement of sacrificial material layers with electrically conductive layers according to the third embodiment of the present disclosure.

Referring to FIG. 25, the processing steps of FIGS. 10, 11, and 12 can be performed to replace the sacrificial material layers 42 with electrically conductive layers 46. The etchant employed to remove the sacrificial material layers 42 can be selective to the material of the buried source semiconductor layer 161, i.e., does not remove the material of the buried source semiconductor layer 161 at a significant etch rate.

Figure 26:
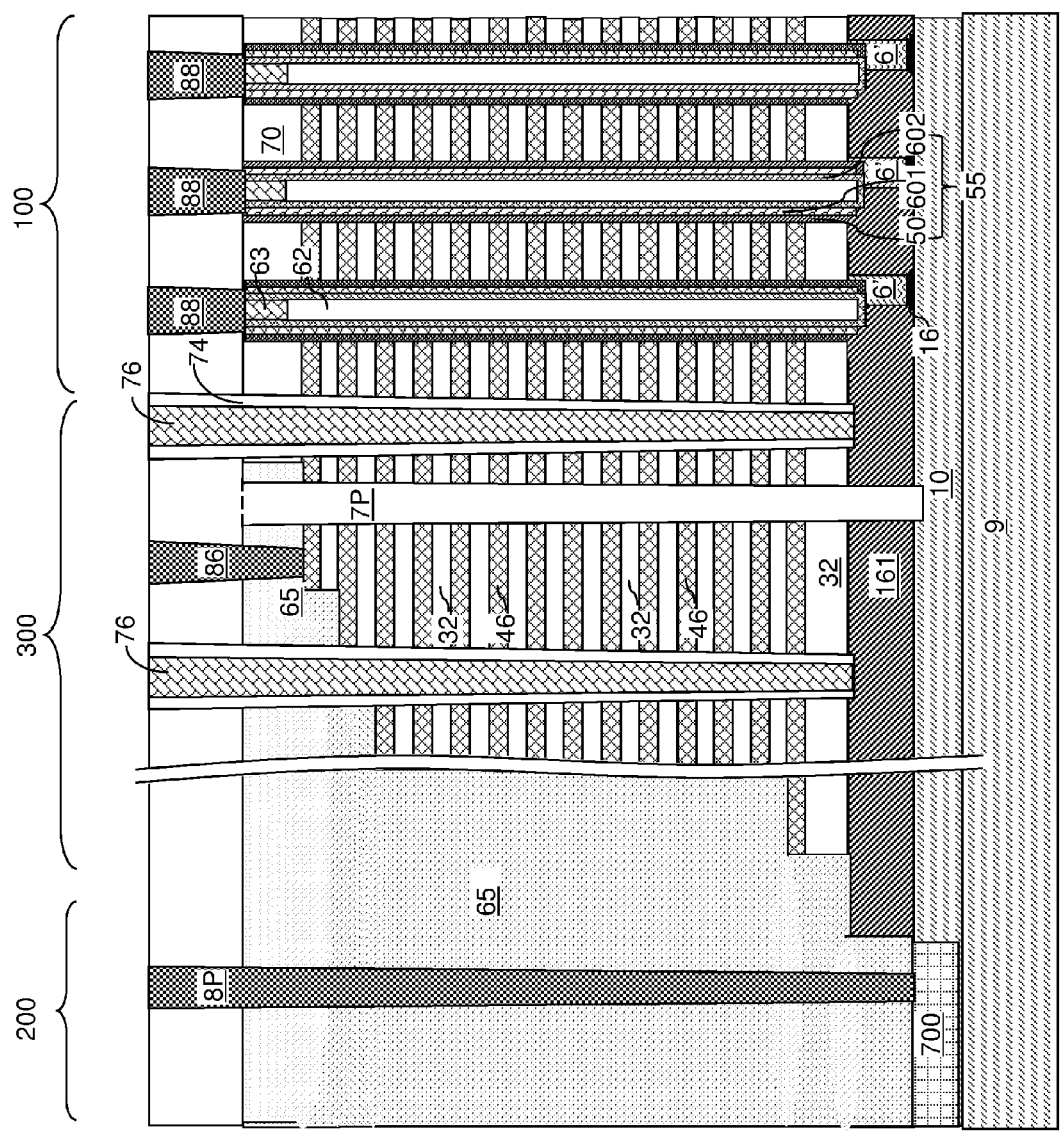
FIG. 26 is a vertical cross-sectional view of the third exemplary structure after formation of insulating spacers, backside contact via structures, and additional contact via structures according to the third embodiment of the present disclosure.

Referring to FIG. 26, the processing steps of FIGS. 13, 14A, and 14B can be performed to form insulating spacers 74, backside contact via structures 76, and additional contact via structures (88, 86, 8P). Additional metal interconnect structures (such as bit lines) can be formed to provide electrical connection to, and/or among, the various contact via structures (76, 88, 86, 8P).

In the third exemplary structure illustrated in FIG. 26, p-n junctions can be located between the buried source semiconductor layer 161 and each of the p-doped semiconductor material portions 6'. Dielectric liners 16 can be located between the substrate (9, 10) and each of the p-doped semiconductor material portions 6'. Alternatively, the p-n junctions may be omitted and the vertical portions of the dielectric liners 16 may be retained between the buried source semiconductor layer 161 and each of the p-doped semiconductor material portions 6'.

Figure 27:
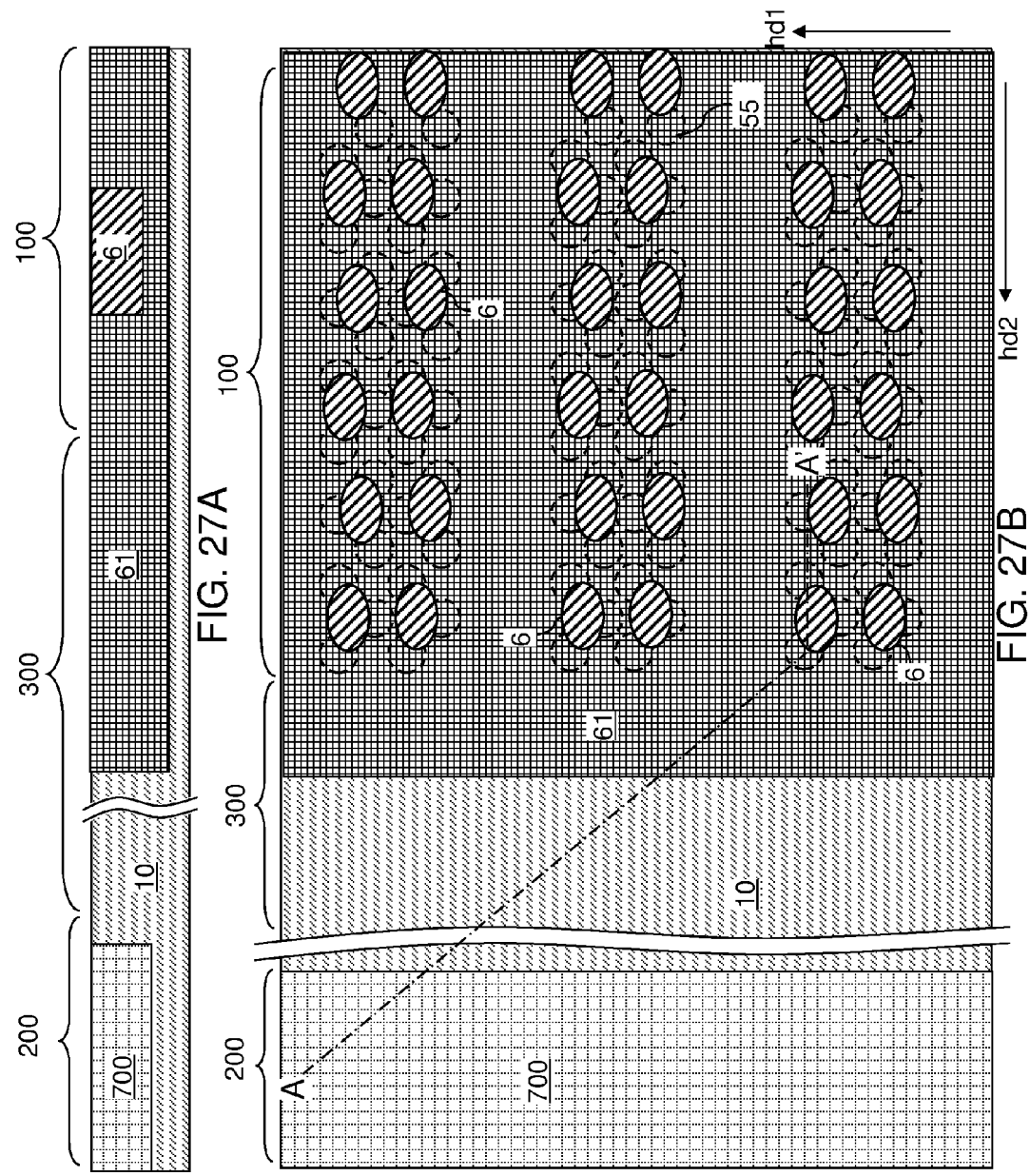
FIG. 27A is a vertical cross-sectional view of an alternate embodiment of the first, second, or third exemplary structure after formation of p-doped semiconductor material portions according to an embodiment of the present disclosure.
FIG. 27B is top-down view of the exemplary structure of FIG. 27A. The vertical plane A-A' is the plane of the vertical cross-sectional view of FIG. 27A.
Figure 28:
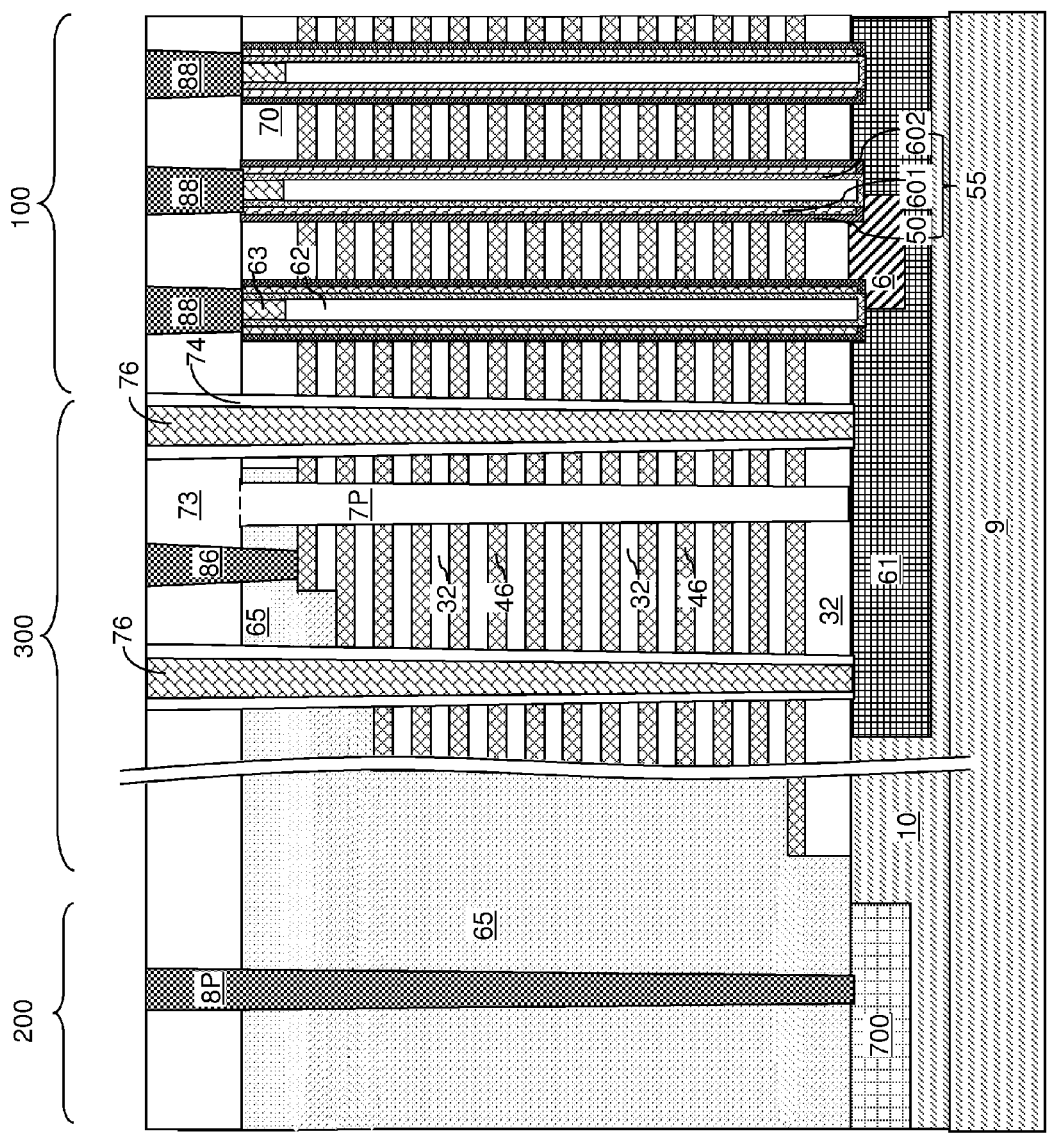
FIG. 28 is a vertical cross-sectional view of the alternate embodiment of FIGS. 27A and 27B after formation of contact via structures according to an embodiment of the present disclosure.

FIGS. 27A, 27B and 28 illustrate an alternate configuration for the shapes of p-doped semiconductor material portions (6 or 6') that can be employed in the first, second, or third exemplary structure of the present disclosure. In this configuration, the p-doped semiconductor material portions (6 or 6') can be formed with non-rectangular horizontal cross-sectional shapes such as elliptical horizontal cross-sectional shapes or circular horizontal cross-sectional shapes. The p-doped semiconductor material portions (6 or 6') are arranged such that each vertical semiconductor channel 60 that is subsequently formed contacts a portion of a buried source semiconductor layer (61 or 161) and a top surface of a respective p-doped semiconductor material portion (6 or 6'). FIG. 28 illustrates a vertical cross-sectional view of an exemplary structure employing the alternate configuration for the shapes of p-doped semiconductor material portions (6 or 6') illustrated in FIGS. 27A and 27B.

Each of the exemplary structures of the present disclosure can include a three-dimensional memory device, which can include: an alternating stack (32, 46) of insulating layers 32 and electrically conductive layers 46 and located over a substrate (9, 10) if the substrate is present, memory stack structures 55 extending through the alternating stack (32, 46), each of the memory stack structures 55 comprising a memory film 50 and a vertical semiconductor channel 60, a buried source semiconductor layer (61 or 161) comprising an n-doped semiconductor material, located between the alternating stack (32, 46) and a first portion of the substrate (e.g., a semiconductor material layer 10), and contacting bottom surfaces of the vertical semiconductor channels 60, and p-doped semiconductor material portions (6 or 6') embedded within the buried source semiconductor layer (61 or 161) and contacting one or more bottom surfaces of a respective subset of the vertical semiconductor channels 60. The p-doped semiconductor material portions (6 or 6') are laterally spaced from one another by the buried source semiconductor layer (61 or 161).

In one embodiment, each of the p-doped semiconductor material portions (6 or 6') contacts multiple vertical semiconductor channels 60. In one embodiment, the three-dimensional memory device can further include: a backside trench 79 extending through the alternating stack (32, 46) to a top surface of the buried source semiconductor layer (61 or 161); an insulating spacer 74 located at a periphery of the backside trench 79; and a backside contact via structure 76 located within the insulating spacer 74 and contacting the buried source semiconductor layer (61 or 161).

Drain regions 63 can contact a top portion of a respective vertical semiconductor channel 60. In one embodiment, the memory film 50 can include: a tunneling dielectric layer 56 laterally surrounding, and contacting, the vertical semiconductor channel 60; and charge storage regions (as embodied as portions of the charge storage layer 54 located at the levels of the electrically conductive layers 46) laterally surrounding the tunneling dielectric layer 56 at each level of the electrically conductive layers 46.

In one embodiment, the alternating stack (32, 46) can include a terrace region in which each electrically conductive layer 46 other than a topmost electrically conductive layer 46 within the alternating stack (32, 46) laterally extends farther than any overlying electrically conductive layer 46 within the alternating stack (32, 46). The terrace region can include stepped surfaces of the alternating stack (32, 46) that continuously extend from a bottommost layer within the alternating stack (32, 46) to a topmost layer within the alternating stack (32, 46).

In the first embodiment, the buried source semiconductor layer 61 comprises a polycrystalline single crystalline semiconductor material, and the p-doped semiconductor material portions 6 are polycrystalline or single crystalline and are epitaxially aligned to the single crystalline semiconductor material of the buried source semiconductor layer 61. P-n junctions are located between the buried source semiconductor layer 61 and each of the p-doped semiconductor material portions 6. In one embodiment, the buried source semiconductor layer 61 can be a second portion of the substrate (9, 10) that overlies the first portion of the substrate, i.e., the semiconductor material layer 10. The first portion of the substrate (the semiconductor material layer 10) can have a p-type doping.

In the second or third embodiment, the buried source semiconductor layer (61 or 161) can include a polycrystalline or single crystalline semiconductor material, and the p-doped semiconductor material portions 6' can be polycrystalline. Dielectric liners 16 can be located between the buried source semiconductor layer 61 and a respective p-doped semiconductor material portion 6' as in the second embodiment. In the second embodiment, the buried source semiconductor layer 61 can be a second portion of the substrate that overlies the first portion of the substrate (i.e., the semiconductor material layer 10). The first portion of the substrate (i.e., the semiconductor material layer 10) can have a p-type doping. Each dielectric liner 16 can contact one or more bottom surfaces of the vertical semiconductor channels 60 as in the second and third embodiments.

In the third embodiment, the buried source semiconductor layer 161 can include a first polycrystalline semiconductor material or an epitaxial semiconductor material, and the p-doped semiconductor material portions 6' can include a second polycrystalline semiconductor material. P-n junctions can be located between the buried source semiconductor layer 161 and each of the p-doped semiconductor material portions 6'. Dielectric liners 16 can be located between the substrate (i.e., the semiconductor material layer 10) and each of the p-doped semiconductor material portions 6'.

Each of the exemplary structures of the present disclosure can include a three-dimensional memory device. In one embodiment, the three-dimensional memory device comprises a vertical NAND memory device. The electrically conductive layers 46 can comprise, or can be electrically connected to, a respective word line of the monolithic three-dimensional NAND memory device. The substrate (9, 10) can comprise a silicon substrate. The vertical NAND memory device can comprise an array of monolithic three-dimensional NAND strings over the silicon substrate. At least one memory cell (as embodied as a portion of the charge storage layer 54 at a level of an electrically conductive layer 46) in a first device level of the array of monolithic three-dimensional NAND strings can be located over another memory cell (as embodied as another portion of the charge storage layer 54 at a level of another electrically conductive layer 46) in a second device level of the array of monolithic three-dimensional NAND strings. The silicon substrate can contain an integrated circuit comprising a driver circuit for the memory device located thereon. The electrically conductive layers 46 can comprise a plurality of control gate electrodes having a strip shape extending substantially parallel to the top surface of the substrate (9, 10), e.g., between a pair of backside trenches 79. The plurality of control gate electrodes comprises at least a first control gate electrode located in a first device level and a second control gate electrode located in a second device level. The array of monolithic three-dimensional NAND strings can comprise: a plurality of semiconductor channels 60, wherein at least one end portion of each of the plurality of semiconductor channels 60 extends substantially perpendicular to a top surface of the substrate (9, 10), and a plurality of charge storage elements (as embodied as portions of the charge storage layer 54 at the levels of the electrically conductive layers 46). Each charge storage element can be located adjacent to a respective one of the plurality of semiconductor channels 60.

In one embodiment, each NAND string containing the vertical semiconductor channel 60 can be erased by a process referred to herein as a "gate-induced drain leakage" ("GIDL") erase. A positive voltage is applied to the buried source semiconductor layer (61, 161), and a different, less positive voltage (e.g., negative or smaller positive voltage) is applied to the drain contact via structures 88. In some embodiments, the drain contact via structures 88 are grounded instead. Electrons and holes are separated at the n-p junction between the n-type buried source semiconductor layer (61, 161) and the p-doped semiconductor material portions (6 or 6') The holes can migrate away from the positive voltage at the buried source semiconductor layer and be injected from the p-doped semiconductor material portions (6 or 6') which function as hole reservoir p-wells into the vertical semiconductor channel 60. The holes then recombine with the trapped electrons in the charge storage layer 54 of the memory film 50 and erase the NAND string (or selected cells in the string).

In another embodiment, the NAND strings can be programmed by injecting electrons from the semiconductor channel 60 into the charge storage layer 54 using Fowler-Nordheim (FN) tunneling. Thus, the NAND strings can be programmed by electron injection and erased by hole injection.

The various exemplary structures of the present disclosure include the p-doped semiconductor material portions (6 or 6') and the n-type buried source semiconductor layer (61, 161) that both contact each vertical semiconductor channel 60. The p-doped semiconductor material portions (6 or 6') can function as the source of holes that are injected into the vertical semiconductor channels 60 during the GIDL erase operation. Thus, the hole current during the erase operation increases, and the erase speed of the memory cells can be improved in the three-dimensional memory device of the present disclosure. In contrast, the n-type buried source semiconductor layer (61, 161) can function as the source of electrons during the FN programming operation.

In one embodiment, the device in the first or second exemplary structure can include a vertical NAND device located in the device region 100, and at least one of the electrically conductive layers 46 in the stack (32, 46) can comprise, or can be electrically connected to, a word line and a source side select gate electrode, respectively, of the NAND device. A drain side select gate electrode may be located at the top of the stack. The device region 100 can include a plurality of semiconductor channels 60 (e.g., comprising portions 601 and 602). At least one end portion of each of the plurality of semiconductor channels 60 extends substantially perpendicular to a top surface of the semiconductor substrate. The device region 100 further includes a plurality of charge storage regions located within each memory layer 50. Each charge storage region is located adjacent to a respective one of the plurality of semiconductor channels 60. The device region 100 further includes a plurality of control gate electrodes having a strip shape extending substantially parallel to the top surface of the substrate (e.g., of the substrate semiconductor layer 10). The plurality of control gate electrodes comprise at least a first control gate electrode located in the first device level and a second control gate electrode located in the second device level. The plurality of electrically conductive layers 46 in the stack (32, 46) can be in electrical contact with, or can comprise, the plurality of control gate electrodes, and extends from the device region 100 to a contact region 300 including a plurality of electrically conductive contact via structures.

A stack (32, 46) of an alternating plurality of word lines 46 and insulating layers 32 can be located over a semiconductor substrate. Each of the word lines 46 and insulating layers 32 is located at different levels that are vertically spaced from a top surface of the semiconductor substrate by different distances. An array of memory stack structures 55 is embedded within the stack (32, 46). Each memory stack structure 55 comprises a semiconductor channel 60 and at least one charge storage region located adjacent to the semiconductor channel 60. At least one end portion of the semiconductor channel 60 extends substantially perpendicular to the top surface of the semiconductor substrate through the stack (32, 46).

Although the foregoing refers to particular preferred embodiments, it will be understood that the disclosure is not so limited. It will occur to those of ordinary skill in the art that various modifications may be made to the disclosed embodiments and that such modifications are intended to be within the scope of the disclosure. Where an embodiment employing a particular structure and/or configuration is illustrated in the present disclosure, it is understood that the present disclosure may be practiced with any other compatible structures and/or configurations that are functionally equivalent provided that such substitutions are not explicitly forbidden or otherwise known to be impossible to one of ordinary skill in the art. All of the publications, patent applications and patents cited herein are incorporated herein by reference in their entirety.

What is claimed is:

1. A three-dimensional memory device comprising:
   an alternating stack of insulating layers and electrically conductive layers and located over a substrate;
   memory stack structures extending through the alternating stack, each of the memory stack structures comprising a memory film and a vertical semiconductor channel;
   a buried source semiconductor layer comprising an n-doped semiconductor material, located between the alternating stack and a first portion of the substrate, and contacting at least one surface of the vertical semiconductor channels;
   p-doped semiconductor material portions embedded within the buried source semiconductor layer and contacting at least one surface of a respective subset of the vertical semiconductor channels, wherein the p-doped semiconductor material portions are laterally spaced from one another by the buried source semiconductor layer; and
   dielectric liners located between the buried source semiconductor layer and a respective p-doped semiconductor material portion, wherein each dielectric liner contacts one or more bottom surfaces of the vertical semiconductor channels.

2. The three-dimensional memory device of claim 1, wherein:
   the buried source semiconductor layer contacts either a bottom surface or a side and bottom surfaces of the vertical semiconductor channels; and
   the p-doped semiconductor material portions contact a bottom surface the vertical semiconductor channels.

3. A three-dimensional memory device comprising:
   an alternating stack of insulating layers and electrically conductive layers and located over a substrate;
   memory stack structures extending through the alternating stack, each of the memory stack structures comprising a memory film and a vertical semiconductor channel;
   a buried source semiconductor layer comprising an n-doped semiconductor material, located between the alternating stack and a first portion of the substrate, and contacting at least one surface of the vertical semiconductor channels;
   p-doped semiconductor material portions embedded within the buried source semiconductor layer and contacting at least one surface of a respective subset of the vertical semiconductor channels, wherein the p-doped semiconductor material portions are laterally spaced from one another by the buried source semiconductor layer; and
   a backside trench extending through the alternating stack to a top surface of the buried source semiconductor layer;
   an insulating spacer located at a periphery of the backside trench;
   a backside contact via structure located within the insulating spacer and contacting the buried source semiconductor layer; and
   drain regions contacting a top portion of a respective vertical semiconductor channel.

4. The three-dimensional memory device of claim 1, wherein:
   the memory film comprises a tunneling dielectric layer laterally surrounding, and contacting, the vertical semiconductor channel, and charge storage regions laterally surrounding the tunneling dielectric layer at each level of the electrically conductive layers;
   the alternating stack comprises a terrace region in which each electrically conductive layer other than a topmost electrically conductive layer within the alternating stack laterally extends farther than any overlying electrically conductive layer within the alternating stack; and
   the terrace region includes stepped surfaces of the alternating stack that continuously extend from a bottommost layer within the alternating stack to a topmost layer within the alternating stack.

5. The three-dimensional memory device of claim 1, wherein:
   the first portion of the substrate has a p-type doping;
   the buried source semiconductor layer is located in or on the first portion of the substrate;
   the buried source semiconductor layer comprises a polycrystalline or single crystalline semiconductor material; and
   the p-doped semiconductor material portions comprise a polycrystalline or single crystalline semiconductor material.

6. The three-dimensional memory device of claim 1, further comprising p-n junctions located between the buried source semiconductor layer and each of the p-doped semiconductor material portions.

7. The three-dimensional memory device of claim 1, wherein the dielectric liners are also located between the substrate and each of the p-doped semiconductor material portions.

8. The three-dimensional memory device of claim 1, wherein each of the p-doped semiconductor material portions contacts multiple vertical semiconductor channels.

9. The three-dimensional memory device of claim 1, wherein:
   the three-dimensional memory device comprises a monolithic three-dimensional NAND memory device containing a plurality of NAND strings;
   the plurality of NAND strings are programmed by a Fowler-Nordheim (FN) tunneling process by injecting electrons from the buried source semiconductor layer into the vertical semiconductor channels; and
   the plurality of NAND strings are erased by gate-induced drain leakage (GIDL) process by injecting holes from the p-doped semiconductor material portions into the vertical semiconductor channels.

10. A three-dimensional memory device comprising:
an alternating stack of insulating layers and electrically conductive layers and located over a substrate;
memory stack structures extending through the alternating stack, each of the memory stack structures comprising a memory film and a vertical semiconductor channel;
a buried source semiconductor layer comprising an n-doped semiconductor material, located between the alternating stack and a first portion of the substrate, and contacting at least one surface of the vertical semiconductor channels;
up-doped semiconductor material portions embedded within the buried source semiconductor layer and contacting at least one surface of a respective subset of the vertical semiconductor channels, wherein the p-doped semiconductor material portions are laterally spaced from one another by the buried source semiconductor layer; wherein:
the three-dimensional memory device comprises a monolithic three-dimensional NAND memory device;
the electrically conductive layers comprise, or are electrically connected to, a respective word line of the monolithic three-dimensional NAND memory device;
the substrate comprises a silicon substrate;
the monolithic three-dimensional NAND memory device comprises an array of monolithic three-dimensional NAND strings over the silicon substrate;
at least one memory cell in a first device level of the array of monolithic three-dimensional NAND strings is located over another memory cell in a second device level of the array of monolithic three-dimensional NAND strings;
the silicon substrate contains an integrated circuit comprising a driver circuit for the memory device located thereon;
the electrically conductive layers comprise a plurality of control gate electrodes having a strip shape extending substantially parallel to the top surface of the substrate, the plurality of control gate electrodes comprise at least a first control gate electrode located in the first device level and a second control gate electrode located in the second device level; and
the array of monolithic three-dimensional NAND strings comprises:
a plurality of semiconductor channels, wherein at least one end portion of each of the plurality of semiconductor channels extends substantially perpendicular to a top surface of the substrate, and
a plurality of charge storage elements, each charge storage element located adjacent to a respective one of the plurality of semiconductor channels.

11. A three-dimensional memory device comprising:
an alternating stack of insulating layers and electrically conductive layers and located over a substrate;
memory stack structures extending through the alternating stack, each of the memory stack structures comprising a memory film and a vertical semiconductor channel;
a buried source semiconductor layer comprising an n-doped semiconductor material, located between the alternating stack and a first portion of the substrate, and contacting at least one surface of the vertical semiconductor channels; and
p-doped semiconductor material portions embedded within the buried source semiconductor layer and contacting at least one surface of a respective subset of the vertical semiconductor channels, wherein the p-doped semiconductor material portions are laterally spaced from one another by the buried source semiconductor layer,
wherein each of the p-doped semiconductor material portions contacts multiple vertical semiconductor channels.

12. The three-dimensional memory device of claim 11, wherein:
the buried source semiconductor layer contacts either a bottom surface or a side and bottom surfaces of the vertical semiconductor channels; and
the p-doped semiconductor material portions contact a bottom surface the vertical semiconductor channels.

13. The three-dimensional memory device of claim 11, further comprising:
a backside trench extending through the alternating stack to a top surface of the buried source semiconductor layer;
an insulating spacer located at a periphery of the backside trench;
a backside contact via structure located within the insulating spacer and contacting the buried source semiconductor layer; and
drain regions contacting a top portion of a respective vertical semiconductor channel.

14. The three-dimensional memory device of claim 11, wherein:
the memory film comprises a tunneling dielectric layer laterally surrounding, and contacting, the vertical semiconductor channel, and charge storage regions laterally surrounding the tunneling dielectric layer at each level of the electrically conductive layers;
the alternating stack comprises a terrace region in which each electrically conductive layer other than a topmost electrically conductive layer within the alternating stack laterally extends farther than any overlying electrically conductive layer within the alternating stack; and
the terrace region includes stepped surfaces of the alternating stack that continuously extend from a bottommost layer within the alternating stack to a topmost layer within the alternating stack.

15. The three-dimensional memory device of claim 11, wherein:
the first portion of the substrate has a p-type doping;
the buried source semiconductor layer is located in or on the first portion of the substrate;
the buried source semiconductor layer comprises a polycrystalline or single crystalline semiconductor material; and
the p-doped semiconductor material portions comprise a polycrystalline or single crystalline semiconductor material.

16. The three-dimensional memory device of claim 11, further comprising p-n junctions located between the buried source semiconductor layer and each of the p-doped semiconductor material portions.

17. The three-dimensional memory device of claim 11, further comprising dielectric liners located between the buried source semiconductor layer and a respective p-doped semiconductor material portion, wherein each dielectric liner contacts one or more bottom surfaces of the vertical semiconductor channels, wherein the dielectric liners are also located between the substrate and each of the p-doped semiconductor material portions.

18. The three-dimensional memory device of claim 11, wherein:

the three-dimensional memory device comprises a monolithic three-dimensional NAND memory device containing a plurality of NAND strings;

the plurality of NAND strings are programmed by a Fowler-Nordheim (FN) tunneling process by injecting electrons from the buried source semiconductor layer into the vertical semiconductor channels; and the plurality of NAND strings are erased by gate-induced drain leakage (GIDL) process by injecting holes from the p-doped semiconductor material portions into the vertical semiconductor channels.

19. The three-dimensional memory device of claim 11, wherein:

the three-dimensional memory device comprises a monolithic three-dimensional NAND memory device;

the electrically conductive layers comprise, or are electrically connected to, a respective word line of the monolithic three-dimensional NAND memory device;

the substrate comprises a silicon substrate;

the monolithic three-dimensional NAND memory device comprises an array of monolithic three-dimensional NAND strings over the silicon substrate;

at least one memory cell in a first device level of the array of monolithic three-dimensional NAND strings is located over another memory cell in a second device level of the array of monolithic three-dimensional NAND strings;

the silicon substrate contains an integrated circuit comprising a driver circuit for the memory device located thereon;

the electrically conductive layers comprise a plurality of control gate electrodes having a strip shape extending substantially parallel to the top surface of the substrate, the plurality of control gate electrodes comprise at least a first control gate electrode located in the first device level and a second control gate electrode located in the second device level; and the array of monolithic three-dimensional NAND strings comprises:

a plurality of semiconductor channels, wherein at least one end portion of each of the plurality of semiconductor channels extends substantially perpendicular to a top surface of the substrate, and a plurality of charge storage elements, each charge storage element located adjacent to a respective one of the plurality of semiconductor channels.

* * * * *